(12) United States Patent
Kusayanagi et al.

(10) Patent No.: US 10,818,770 B2
(45) Date of Patent: Oct. 27, 2020

(54) METAL OXIDE, FIELD-EFFECT TRANSISTOR, AND METHOD FOR PRODUCING THE SAME

(71) Applicants: Minehide Kusayanagi, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Sadanori Arae, Kanagawa (JP)

(72) Inventors: Minehide Kusayanagi, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Sadanori Arae, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/518,265

(22) Filed: Jul. 22, 2019

(65) Prior Publication Data

US 2020/0027961 A1 Jan. 23, 2020

(30) Foreign Application Priority Data

Jul. 23, 2018 (JP) .................................. 2018-137401
Jul. 18, 2019 (JP) .................................. 2019-132421

(51) Int. Cl.
*H01L 27/12* (2006.01)
*H01L 29/51* (2006.01)
(Continued)

(52) U.S. Cl.
CPC ...... *H01L 29/517* (2013.01); *H01L 21/47573* (2013.01); *H01L 21/47635* (2013.01);
(Continued)

(58) Field of Classification Search
None
See application file for complete search history.

(56) References Cited

U.S. PATENT DOCUMENTS

| | | | |
|---|---|---|---|
| 8,809,154 B2 * | 8/2014 | Koezuka | ............... H01L 21/022 438/299 |
| 10,008,181 B2 | 6/2018 | Saotome et al. | |

(Continued)

FOREIGN PATENT DOCUMENTS

| | | |
|---|---|---|
| JP | 2015-111653 | 6/2015 |
| JP | 2017-98536 A | 6/2017 |

(Continued)

OTHER PUBLICATIONS

Taiwanese Office Action dated Mar. 6, 2020, in Patent Application No. 108125872, citing document AO therein, 13 pages.
(Continued)

*Primary Examiner* — Benjamin P Sandvik
(74) *Attorney, Agent, or Firm* — Oblon, McClelland, Maier & Neustadt, L.L.P.

(57) ABSTRACT

Method for producing field-effect transistor including source electrode and drain electrode, gate electrode, active layer, and gate insulating layer, the method including etching the gate insulating layer, wherein the gate insulating layer is metal oxide including A-element and at least one selected from B-element and C-element, the A-element is at least one selected from Sc, Y, Ln (lanthanoid), Sb, Bi, and Te, the B-element is at least one selected from Ga, Ti, Zr, and Hf, the C-element is at least one selected from Group 2 elements in periodic table, etching solution A is used when at least one selected from the source electrode and the drain electrode, the gate electrode, and the active layer is formed, and
(Continued)

etching solution B that is etching solution having same type as the etching solution A is used when the gate insulating layer is etched.

17 Claims, 39 Drawing Sheets

(51) Int. Cl.
    *H01L 21/4757*     (2006.01)
    *H01L 21/4763*     (2006.01)
    *H01L 29/66*     (2006.01)
    *H01L 29/786*     (2006.01)

(52) U.S. Cl.
    CPC .... *H01L 27/1237* (2013.01); *H01L 29/66969* (2013.01); *H01L 29/7869* (2013.01)

(56) References Cited

U.S. PATENT DOCUMENTS

| | | |
|---|---|---|
| 10,115,828 B2 | 10/2018 | Abe et al. |
| 10,141,185 B2 | 11/2018 | Ueda et al. |
| 10,170,635 B2 | 1/2019 | Matsumoto et al. |
| 10,204,799 B2 | 2/2019 | Kusayanagi et al. |
| 10,235,930 B2 | 3/2019 | Saotome et al. |
| 10,269,293 B2 | 4/2019 | Saotome et al. |
| 2006/0244107 A1 | 11/2006 | Sugihara et al. |
| 2016/0267873 A1 | 9/2016 | Saotome et al. |
| 2017/0018650 A1 | 1/2017 | Saotome et al. |
| 2017/0141237 A1 | 5/2017 | Arae et al. |
| 2017/0162601 A1 | 6/2017 | Arae et al. |
| 2017/0162704 A1 | 6/2017 | Abe et al. |
| 2017/0186626 A1 | 6/2017 | Kusayanagi et al. |
| 2017/0271381 A1* | 9/2017 | Sone ................. H01L 21/47573 |
| 2018/0277060 A1 | 9/2018 | Saotome et al. |
| 2019/0280098 A1* | 9/2019 | Ueda ..................... H01L 29/786 |

FOREIGN PATENT DOCUMENTS

| | | |
|---|---|---|
| JP | 2017-112361 | 6/2017 |
| JP | 2017-175125 | 9/2017 |
| TW | 201810390 A | 3/2018 |
| WO | WO 2018/101278 A1 | 6/2018 |

OTHER PUBLICATIONS

Partial European Search Report dated Nov. 7, 2019, in Patent Application No. 19187576.4, citing documents AA and AO-AP therein, 14 pages.

* cited by examiner

METAL OXIDE, FIELD-EFFECT TRANSISTOR, AND METHOD FOR PRODUCING THE SAME

CROSS-REFERENCE TO RELATED APPLICATIONS

The present application claims priority under 35 U.S.C. § 119 to Japanese Patent Application No. 2018-137401, filed Jul. 23, 2018 and Japanese Patent Application No. 2019-132421, filed Jul. 18, 2019. The contents of which are incorporated herein by reference in their entirety.

BACKGROUND OF THE INVENTION

Field of the Invention

The present disclosure relates to a metal oxide, a field-effect transistor, and a method for producing the field-effect transistor.

Description of the Related Art

Field-effect transistors (FET) exhibit low gate electric current and have a planar structure. Therefore, production and integration thereof are easier compared to bipolar transistors. Thus, the FETs are essential elements in integrated circuits used in current electronic devices.

Conventionally, silicon-based insulating films have been widely used for gate insulating layers of the field-effect transistors. However, in recent years, there is highly a demand for electronic devices having a highly integrated structure and low power consumption. Therefore, there has been proposed a technique using, as the gate insulating layer, a material having a higher dielectric constant than the silicon-based insulating films. As the insulating materials having a higher dielectric constant, metal oxides of alkaline earth metals or rare earth metals have been disclosed (for example, Japanese Unexamined Patent Application Publication No. 2015-111653).

When the field-effect transistor using the metal oxide is produced, processing is performed through wet etching or dry etching. However, it is necessary to use a plurality of etching solutions and process gasses by combining them, depending on combination of a metal material used as wired lines and an oxide semiconductor as the active layer, which leads to an increase in production cost.

SUMMARY OF THE INVENTION

According to one aspect of the present disclosure, a method for producing a field-effect transistor includes a source electrode and a drain electrode, a gate electrode, an active layer, and a gate insulating layer, the method includes etching the gate insulating layer. The gate insulating layer is a metal oxide including A element and at least one selected from the group consisting of B element and C element. The A element is at least one selected from the group consisting of Sc, Y, Ln (lanthanoid), Sb, Bi, and Te. The B element is at least one selected from the group consisting of Ga, Ti, Zr, and Hf. The C element is at least one selected from the group consisting of Group 2 elements in a periodic table. Etching solution A is used when at least one selected from the group consisting of the source electrode and the drain electrode, the gate electrode, and the active layer is formed. Etching solution B that is an etching solution having same type as the etching solution A is used when the gate insulating layer is etched.

DESCRIPTION OF THE EMBODIMENTS

Figure 1:
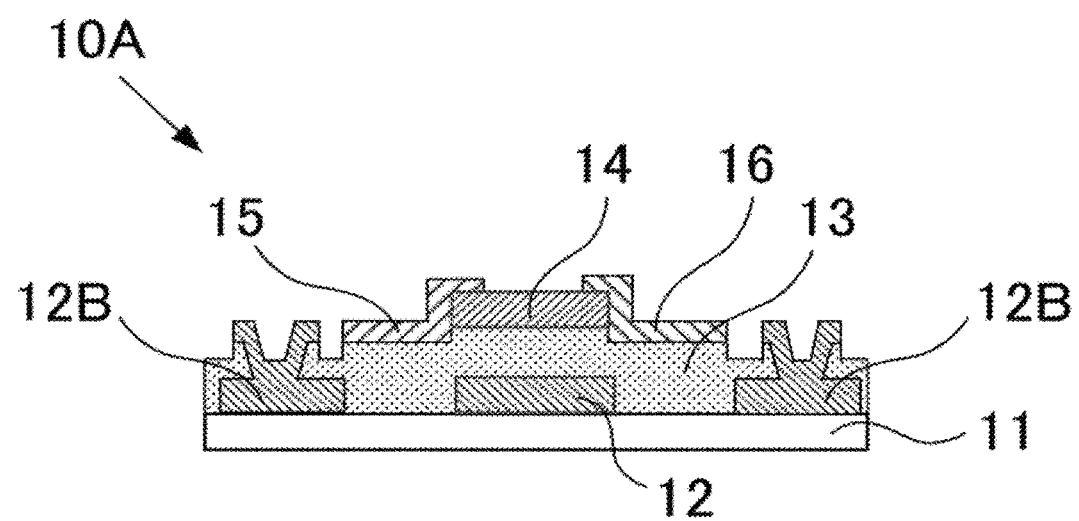
FIG. 1 is a schematic cross-sectional view of a field-effect transistor 10A according to an embodiment.

An object of the present disclosure is to provide a method for producing a field-effect transistor including a gate insulating layer formed of a metal oxide at low cost.

According to the disclosed technique, it is possible to produce a field-effect transistor including a gate insulating layer formed of a metal oxide at low cost.

(Method for Producing Field-Effect Transistor and Field-Effect Transistor)

A method of the present disclosure for producing a field-effect transistor is a method for producing a field-effect transistor including a source electrode and a drain electrode, a gate electrode, an active layer (referred to as a semiconductor layer), and a gate insulating layer.

The method for producing a field-effect transistor includes a step of etching the gate insulating layer.

In the field-effect transistor, the gate insulating layer is a metal oxide including A element and at least one selected from the group consisting of B element and C element.

The A element is at least one selected from the group consisting of Sc, Y, Ln (lanthanoid), Sb, Bi, and Te. Examples of the Ln (lanthanoid) include La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), and Lu (lutetium).

The B element is at least one selected from the group consisting of Ga, Ti, Zr, and Hf.

The C element is at least one selected from the group consisting of Group 2 elements in the periodic table.

In the method for producing a field-effect transistor, etching solution A is used when at least one selected from the group consisting of the source electrode and the drain electrode, the gate electrode, and the active layer is formed.

In the method for producing a field-effect transistor, etching solution B that is an etching solution having same type as the etching solution A is used when the gate insulating layer is etched.

A field-effect transistor of one embodiment of the present disclosure includes a source electrode and a drain electrode, a gate electrode, an active layer, and a gate insulating layer.

In the field-effect transistor, the gate insulating layer is etched.

In the field-effect transistor, the gate insulating layer is a metal oxide including A element and at least one selected from the group consisting of B element and C element.

The A element is at least one selected from the group consisting of Sc, Y, Ln (lanthanoid), Sb, Bi, and Te.

The B element is at least one selected from the group consisting of Ga, Ti, Zr, and Hf.

The C element is at least one selected from the group consisting of Group 2 elements in a periodic table.

At least one selected from the group consisting of the source electrode and the drain electrode, the gate electrode, and the active layer is formed using etching solution A.

The gate insulating layer is etched using etching solution B that is an etching solution having the same type as the etching solution A.

In production of the field-effect transistor, when the gate insulating layer is formed through etching, use of the etching solution B, which is an etching solution having the same type as the etching solution A used for forming at least one selected from the group consisting of the source electrode and the drain electrode, the gate electrode, and the active layer, makes it possible to dispose the waste liquids of both etching solutions in the same waste liquid disposal method. As a result, an apparatus for disposing waste liquids in the production of the field-effect transistor can be simplified, and steps of disposing the waste liquids can be simplified, resulting in reduction of production cost.

Examples of the etching solution A include etching solutions including nitric acid, etching solutions including hydrogen peroxide, and etching solutions including oxalic acid.

Examples of the etching solution B that is an etching solution having the same type as the etching solution A are as follows, for example. Specifically, when the etching solution A is an etching solution including nitric acid, the etching solution B is an etching solution including nitric acid. When the etching solution A is an etching solution including hydrogen peroxide, the etching solution B is an etching solution including hydrogen peroxide. When the etching solution A is an etching solution including oxalic acid, the etching solution B is an etching solution including oxalic acid.

Here, as described above, concentrations of the etching solution A and the etching solution B may be the same or different, so long as the etching solution A and the etching solution B have the same main component contributing to etching. In addition, as described above, other constituent components in the etching solution A and the etching solution B may be the same or different, so long as the etching solution A and the etching solution B have the same main component contributing to etching.

When the etching solution A is the etching solution including nitric acid, the etching solution A preferably further includes phosphoric acid and acetic acid.

When the etching solution B is the etching solution including nitric acid, the etching solution B preferably further includes phosphoric acid and acetic acid.

A concentration of nitric acid in the etching solution including nitric acid is, for example, 5% by mass or more but 30% by mass or less.

A concentration of acetic acid in the etching solution including nitric acid is, for example, 20% by mass or more but 40% by mass or less.

A concentration of phosphoric acid in the etching solution including nitric acid is, for example, 3% by mass or more but 60% by mass or less. More specifically, the concentration thereof is, for example, 50% by mass.

One example of the etching solution including nitric acid includes 6% by mass of nitric acid, 25% by mass of acetic acid, and 50% by mass of phosphoric acid.

One example of the etching solution including nitric acid includes 25% by mass of nitric acid, 30% by mass of acetic acid, and 5% by mass of phosphoric acid.

The etching solution A is used for, for example, forming at least the gate electrode. In this case, the gate electrode is preferably formed of a conductive film including at least one selected from the group consisting of at least one metal selected from the group consisting of Al, Mo, Cu, and Ag; alloys of two or more elements thereof, indium oxide; and zinc oxide.

The etching solution A is used, for example, for forming at least the source electrode and the drain electrode. In this case, the source electrode and the drain electrode are preferably formed of a conductive film including at least one selected from the group consisting of at least one metal selected from the group consisting of Al, Mo, Cu, and Ag; alloys of two or more elements thereof indium oxide; and zinc oxide.

The etching solution A is used for, for example, forming at least the active layer.

An etching rate of the gate electrode in the etching solution A is not particularly limited and may be appropriately selected depending on the intended purpose. However, the etching rate thereof is preferably 0.1 nm/s (second) or more but 20 nm/s or less, more preferably 0.1 nm/s or more but 10 nm/s or less, particularly preferably 0.5 nm/s or more but 5 nm/s or less, in terms of pattern processability.

An etching rate of the source electrode and the drain electrode in the etching solution A is not particularly limited and may be appropriately selected depending on the intended purpose. However, the etching rate thereof is preferably 0.1 nm/s or more but 20 nm/s or less, more preferably 0.1 nm/s or more but 10 nm/s or less, particularly preferably 0.5 nm/s or more but 5 nm/s or less, in terms of pattern processability.

An etching rate of the active layer in the etching solution A is not particularly limited and may be appropriately selected depending on the intended purpose. However, the etching rate thereof is preferably 0.1 nm/s or more but 20 nm/s or less, more preferably 0.1 nm/s or more but 10 nm/s or less, particularly preferably 0.5 nm/s or more but 5 nm/s or less, in terms of pattern processability.

An etching rate of the metal oxide to be the gate insulating layer in the etching solution B is not particularly limited and may be appropriately selected depending on the intended purpose. However, the etching rate thereof is preferably 0.1 nm/s or more but 20 nm/s or less, more preferably 0.1 nm/s or more but 10 nm/s or less, particularly preferably 0.5 nm/s or more but 5 nm/s or less, in terms of pattern processability.

Preferably, the metal oxide includes a paraelectric amorphous oxide or is a paraelectric amorphous oxide itself.

Hereinafter, the description of the embodiments will be described with reference to the drawings. In each drawing, the same reference numeral is given to the same constituent part, and redundant explanation may be omitted in some cases.

FIG. 1 is a cross-sectional view exemplifying a field-effect transistor produced in the present disclosure.

Referring to FIG. 1, a field-effect transistor 10A is a bottom gate/bottom contact field-effect transistor including a substrate 11, a gate electrode 12, a gate insulating layer 13, an active layer 14, a source electrode 15, a drain electrode 16, and gate electrode pads 12B. Note that, the field-effect transistor 10A is one representative example of a semiconductor device according to the present disclosure.

In the field-effect transistor 10A, the gate electrode 12 and two gate electrode pads 12B are formed on the insulating substrate 11. Furthermore, the gate insulating layer 13 is formed so as to cover the gate electrode 12 and the two gate electrode pads 12B. The active layer 14 is formed on the gate insulating layer 13, and the source electrode 15 and the drain electrode 16 are formed on the active layer 14 so that channel is formed in the active layer 14. Hereinafter, each constitution element of the field-effect transistor 10A will be described in detail.

Note that, in the embodiments of the present disclosure, a side of the active layer 14 is considered as the upper side or one side, and a side of the substrate 11 is considered as the bottom side or the other side for the sake of convenience. In each part between the active layer 14 and the substrate 11, a surface at a side of the active layer 14 is considered as the upper surface or one surface, and a surface at a side of the substrate 11 is considered as the bottom surface or the other surface. Note that, the field-effect transistor 10A can be used in a state of being turned upside down, or can be disposed at any angle. The planar view means seeing an object from a normal direction to the upper surface of the substrate 11. The planar shape means a shape of the object seen from the normal direction to the upper surface of the substrate 11.

<Substrate>

A shape, a structure, and a size of the substrate 11 are not particularly limited and may be appropriately selected depending on the intended purpose. A material of the substrate 11 is not particularly limited and may be appropriately selected depending on the intended purpose. As the material, glass substrates, ceramic substrates, plastic substrates, and film substrates can be used.

The glass substrates are not particularly limited and may be appropriately selected depending on the intended purpose. Examples thereof include non-alkali glass and silica glass. The plastic substrates and film substrates are not particularly limited and may be appropriately selected depending on the intended purpose. Examples thereof include polycarbonate (PC), polyimide (PI), polyethylene terephthalate (PET), and polyethylene naphthalate (PEN).

<Gate Electrode>

The gate electrode 12 is formed, for example, in a predetermined area on the substrate 11. The gate electrode 12 is an electrode to which gate voltage is to be applied.

A material of the gate electrode 12 is not particularly limited and may be appropriately selected depending on the intended purpose. For example, metals (e.g., aluminum (Al), platinum (Pt), palladium (Pd), gold (Au), silver (Ag), copper (Cu), zinc (Zn), nickel (Ni), chromium (Cr), tantalum (Ta), molybdenum (Mo), and titanium (Ti)), alloys thereof, and mixtures of these metals can be used. In addition, conductive oxides (e.g., indium oxide, zinc oxide, tin oxide, gallium oxide, and niobium oxide), composite compounds thereof, and mixtures thereof may be used.

An average film thickness of the gate electrode 12 is not particularly limited and may be appropriately selected depending on the intended purpose. The average film thickness thereof is preferably from 10 nm through 1 μm, more preferably from 50 nm through 300 nm.

<Gate Electrode Pads>

The gate electrode pads have the same layer as that of the gate electrode and are provided in order to contact, with the gate electrode, a probe for measurement when electrical characteristics are evaluated.

<Gate Insulating Layer>

The gate insulating layer 13 is a metal oxide.

In one example, the gate insulating layer is provided between the gate electrode 12 and the active layer 14 in order to insulate the gate electrode 12 and the active layer 14.

The metal oxide includes A element and at least one selected from the group consisting of B element and C element, and further includes other components if necessary.

The A element is at least one selected from the group consisting of Sc, Y, Ln (lanthanoid), Sb, Bi, and Te.

The B element is at least one selected from the group consisting of, Ga, Ti, Zr, and Hf.

The C element is at least one selected from the group consisting of Group 2 elements in the periodic table.

Preferably, the metal oxide includes a paraelectric amorphous oxide or is formed with a paraelectric amorphous oxide itself. The paraelectric amorphous oxide is stable in the air and can stably form an amorphous structure in a broad formulation range. Here, the metal oxide may partially include a crystal.

Alkaline earth oxides easily react with moisture and carbon dioxide in the air, and are easily turned into hydroxides and carbonates. Therefore, the alkaline earth oxides alone are not suitable for applications to electronic devices. Furthermore, simple oxides of, for example, Ga, Sc, Y, and lanthanoid excluding Ce are easily turned into crystals, which is problematic in terms of generation of leakage current. However, metal oxides of the alkaline earth metals and Ga, Sc, Y, and lanthanoid excluding Ce are stable in the air, and can form an amorphous film in a broad formulation region. Ce becomes tetravalent specifically in the lanthanoid and forms a crystal having a perovskite structure together with the is alkaline earth metal. Therefore, in order to obtain an amorphous phase, lanthanoid excluding Ce is preferable.

Although crystalline phases such as a spinel structure exist between the alkaline earth metal and the Ga oxide, these crystals are not precipitated unless they are heated at a significantly high temperature (generally, at 1,000° C. or more) compared to crystals having the perovskite structure. In addition, no report has been presented on existence of a stable crystalline phase between oxides of the alkaline earth metal and oxides of Sc, Y, and lanthanoid excluding Ce. Even after the post-process performed at a high temperature, the crystal is seldom precipitated from the amorphous phase. Moreover, an amorphous phase becomes more stable when the metal oxides of the alkaline earth metal and Ga, Sc, Y, and lanthanoid excluding Ce are formed of three or more metal elements.

An amount of each element contained in the metal oxide is not particularly limited. However, a metal element selected from each element group is preferably included so that the metal oxide has such formulation that can achieve a stable amorphous state.

In order to prepare a film having high dielectric constant, it is preferable that compositional ratios of elements such as Ba, Sr, Lu, and La be increased.

The metal oxide according to the present embodiment can form an amorphous film in a broad formulation range, and thus its physical property can be broadly controlled. For example, a dielectric constant thereof is sufficiently higher (i.e., from about 6 through about 20) than that of $SiO_2$, but can be appropriately adjusted to a suitable value by selecting formulation depending on the intended purpose.

Furthermore, a thermal expansion coefficient of the metal oxide is similar to those of the general materials of wired lines and general materials of semiconductors (i.e., from $10^{-6}$ through $10^{-5}$). Moreover, even when a heating step is repeated, the metal oxide causes less trouble such as exfoliation of the film compared to $SiO_2$ having a thermal expansion coefficient of $10^{-7}$ or more but less than $10^{-6}$. Particularly, a favorable boundary between the metal oxide and the oxide semiconductor such as a-IGZO is formed.

Therefore, it is possible to obtain a semiconductor device having a high performance by using the metal oxide according the present embodiment in the gate insulating layer 13.

A method for forming the gate insulating layer is not particularly limited and may be appropriately selected depending on the intended purpose. Examples thereof include the following formation method using a coating liquid for forming insulating layer.

«Coating Liquid for Forming Insulating Layer»

The coating liquid for forming insulating layer includes, for example, at least A element-including compound, at least one selected from the group consisting of B element-including compound and C element-including compound, and a solvent, and further includes other components if necessary.

—A Element-Including Compound—

The A element-including compound is not particularly limited and may be appropriately selected depending on the intended purpose, so long as the A element-including compound is a compound including at least one selected from the group consisting of Sc, Y, Ln (lanthanoid), Sb, Bi, and Te. Examples thereof include inorganic A element compounds and organic A element compounds.

Examples of the inorganic A element compounds include nitrates of the A element, sulfates of the A element, fluorides of the A element, chlorides of the A element, bromides of the A element, and iodides of the A element.

Examples of the nitrates of the A element include scandium nitrate, yttrium nitrate, lanthanum nitrate, cerium nitrate, praseodymium nitrate, neodymium nitrate, samarium nitrate, europium nitrate, gadolinium nitrate, terbium nitrate, dysprosium nitrate, holmium nitrate, erbium nitrate, thulium nitrate, ytterbium nitrate, lutetium nitrate, antimony nitrate, bismuth nitrate, and tellurium nitrate.

Examples of the sulfates of the A element include gallium sulfate, scandium sulfate, yttrium sulfate, lanthanum sulfate, cerium sulfate, praseodymium sulfate, neodymium sulfate, samarium sulfate, europium sulfate, gadolinium sulfate, terbium sulfate, dysprosium sulfate, holmium sulfate, erbium sulfate, thulium sulfate, ytterbium sulfate, lutetium sulfate, antimony sulfate, bismuth sulfate, and tellurium sulfate.

Examples of the fluorides of the A element include scandium fluoride, yttrium fluoride, lanthanum fluoride, cerium fluoride, praseodymium fluoride, neodymium fluoride, samarium fluoride, europium fluoride, gadolinium fluoride, terbium fluoride, dysprosium fluoride, holmium fluoride, erbium fluoride, thulium fluoride, ytterbium fluoride, lutetium fluoride, antimony fluoride, bismuth fluoride, and tellurium fluoride.

Examples of the chlorides of the A element include scandium chloride, yttrium chloride, lanthanum chloride, cerium chloride, praseodymium chloride, neodymium chloride, samarium chloride, europium chloride, gadolinium chloride, terbium chloride, dysprosium chloride, holmium chloride, erbium chloride, thulium chloride, ytterbium chloride, lutetium chloride, antimony chloride, bismuth chloride, tellurium chloride.

Examples of the bromides of the A element include scandium bromide, yttrium bromide, lanthanum bromide, praseodymium bromide, neodymium bromide, samarium bromide, europium bromide, gadolinium bromide, terbium bromide, dysprosium bromide, holmium bromide, erbium bromide, thulium bromide, ytterbium bromide, lutetium bromide, antimony bromide, bismuth bromide, and tellurium bromide.

Examples of the iodides of the A element include scandium iodide, yttrium iodide, lanthanum iodide, cerium iodide, praseodymium iodide, neodymium iodide, samarium iodide, europium iodide, gadolinium iodide, terbium iodide, dysprosium iodide, holmium iodide, erbium iodide, thulium iodide, ytterbium iodide, lutetium iodide, antimony iodide, bismuth iodide, and tellurium iodide.

The organic A element compound is not particularly limited and may be appropriately selected depending on the intended purpose, so long as the organic A element compound is a compound including the A element and an organic group. The A element and the organic group are bonded, for example, via an ionic bond, a covalent bond, or a coordinate bond.

The organic group is not particularly limited and may be appropriately selected depending on the intended purpose. Examples of the organic group include alkyl groups which may have a substituent, alkoxy groups which may have a substituent, acyloxy groups which may have a substituent, acetyl acetonate groups which may have a substituent, and cyclopentadienyl groups which may have a substituent. Examples of the alkyl groups include alkyl groups including from 1 through 6 carbon atoms. Examples of the alkoxy groups include alkoxy groups including from 1 through 6 carbon atoms. Examples of the acyloxy groups include acyloxy groups including from 1 through 10 carbon atoms.

Examples of the organic A element compound include scandium acetate, tris(cyclopentadienyl)scandium, yttrium isopropoxide, yttrium 2-ethylhexanoate, tris(acetylacetonato)yttrium, tris(cyclopentadienyl)yttrium, lanthanum isopropoxide, lanthanum 2-ethylhexanoate, tris(acetylacetonato)lanthanum, tris(cyclopentadienyl)lanthanum, cerium 2-ethylhexanoate, tris(acetylacetonato)cerium, tris(cyclopentadienyl)cerium, praseodymium isopropoxide, praseodymium oxalate, tris(acetylacetonato)praseodymium, tris(cyclopentadienyl)praseodymium, neodymium isopropoxide, neodymium 2-ethylhexanoate, neodymium trifluoroacetylacetonate, tris(isopropylcyclopentadienyl)neodymium, tris(ethylcyclopentadienyl)promethium, samarium isopropoxide, samarium 2-ethylhexanoate, tris(acetylacetonato)samarium, tris(cyclopentadienyl)samarium, europium 2-ethylhexanoate, tris(acetylacetonato)europium, tris(ethylcyclopentadienyl)europium, gadolinium isopropoxide, gadolinium 2-ethylhexanoate, tris(acetylacetonato)gadolinium, tris(cyclopentadienyl)gadolinium, terbium acetate, tris(acetylacetonato)terbium, tris(cyclopentadienyl)terbium, dysprosium isopropoxide, dysprosium acetate, tris(acetylacetonato)dysprosium, tris(ethylcyclopentadienyl)dysprosium, holmium isopropoxide, holmium acetate, tris(cyclopentadienyl)holmium, erbium isopropoxide, erbium acetate, tris(acetylacetonato)erbium, tris(cyclopentadienyl)erbium, thulium acetate, tris(acetylacetonato)thulium, tris(cyclopentadienyl)thulium, ytterbium isopropoxide, ytterbium acetate, tris(acetylacetonato)ytterbium, tris(cyclopentadienyl)ytterbium, lutetium oxalate, and tris(ethylcyclopentadienyl)lutetium.

An amount of the A element-including compound in the coating liquid for forming insulating layer is not particularly limited and may be appropriately selected depending on the intended purpose.

—B Element-Including Compound—

The B element-including compound is not particularly limited and may be appropriately selected depending on the intended purpose, so long as the B element-including compound is a compound including at least one selected from the group consisting of Ga, Ti, Zr, and Hf. Examples thereof include inorganic B element compounds and organic B element compounds.

Examples of the inorganic B element compounds include gallium nitrate, gallium sulfate, gallium fluoride, gallium chloride, gallium bromide, gallium iodide, gallium hydroxide, titanium sulfide, titanium fluoride, titanium chloride, titanium bromide, titanium iodide, zirconium sulfate, zirconium carbonate, zirconium fluoride, zirconium chloride, zirconium bromide, zirconium iodide, hafnium sulfate, hafnium fluoride, hafnium chloride, hafnium bromide, and hafnium iodide.

The organic B element compound is not particularly limited and may be appropriately selected depending on the intended purpose, so long as the organic B element compound is a compound including the B element and an organic group. The B element and the organic group are bonded, for example, via an ionic bond, a covalent bond, or a coordinate bond.

The organic group is not particularly limited and may be appropriately selected depending on the intended purpose. Examples of the organic group include alkyl groups which may have a substituent, alkoxy groups which may have a substituent, acyloxy groups which may have a substituent, acetylacetonate groups which may have a substituent, and cyclopentadienyl groups which may have a substituent. Examples of the alkyl groups include alkyl groups including from 1 through 6 carbon atoms. Examples of the alkoxy groups include alkoxy groups including from 1 through 6 carbon atoms. Examples of the acyloxy groups include acyloxy groups including from 1 through 10 carbon atoms.

Examples of the organic B element compounds include tris(cyclopentadienyl)gallium, scandium isopropoxide, titanium isopropoxide, bis(cyclopentadienyl)titanium chloride, zirconium butoxide, zirconium isopropoxide, bis(2-ethylhexanoate)zirconium oxide, zirconium di(n-butoxide)bisacetylacetonato, tetrakis(acetylacetonate)zirconium, tetrakis(cyclopentadienyl)zirconium, hafnium butoxide, hafnium isopropoxide, tetrakis(2-ethylhexanoate)hafnium, hafnium di(n-butoxide)bisacetylacetonato, tetrakis(acetylacetonate)hafnium, and bis(cyclopentadienyl)dimethylhafnium.

An amount of the B element-including compound in the coating liquid for forming insulating layer is not particularly limited and may be appropriately selected depending on the intended purpose.

—C Element-Including Compound—

The C element-including compound is not particularly limited and may be appropriately selected depending on the intended purpose, so long as the C element-including compound is a compound including at least one selected from the group consisting of Group 2 elements in the periodic table. Examples thereof include inorganic alkaline earth metal compounds and organic alkaline earth metal compounds. Examples of alkaline earth metals in the alkaline-earth-metal-including compounds include Be (beryllium), Mg (magnesium), Ca (calcium), Sr (strontium), and Ba (barium).

Examples of the inorganic alkaline earth metal compounds include alkaline earth metal nitrates, alkaline earth metal sulfates, alkaline earth metal chlorides, alkaline earth metal fluorides, alkaline earth metal bromides, and alkaline earth metal iodides.

Examples of the alkaline earth metal nitrates include magnesium nitrate, calcium nitrate, strontium nitrate, and barium nitrate.

Examples of the alkaline earth metal sulfates include magnesium sulfate, calcium sulfate, strontium sulfate, and barium sulfate.

Examples of the alkaline earth metal chlorides include magnesium chloride, calcium chloride, strontium chloride, and barium chloride.

Examples of the alkaline earth metal fluorides include magnesium fluoride, calcium fluoride, strontium fluoride, and barium fluoride.

Examples of the alkaline earth metal bromides include magnesium bromide, calcium bromide, strontium bromide, and barium bromide.

Examples of the alkaline earth metal iodides include magnesium iodide, calcium iodide, strontium iodide, and barium iodide.

The organic alkaline earth metal compound is not particularly limited and may be appropriately selected depending on the intended purpose, so long as the organic alkaline earth metal compound is a compound including an alkaline earth metal and an organic group. The alkaline earth metal and the organic group are bonded, for example, via an ionic bond, a covalent bond, or a coordinate bond.

The organic group is not particularly limited and may be appropriately selected depending on the intended purpose. Examples of the organic group include alkyl groups which may have a substituent, alkoxy groups which may have a substituent, acyloxy groups which may have a substituent, phenyl groups which may have a substituent, acetyl acetonate groups which may have a substituent, and sulfonic acid groups which may have a substituent. Examples of the alkyl groups include alkyl groups including from 1 through 6 carbon atoms. Examples of the alkoxy groups include alkoxy groups including from 1 through 6 carbon atoms. Examples of the acyloxy groups include: acyloxy groups including from 1 through 10 carbon atoms; acyloxy groups part of which is substituted with a benzene ring, such as benzoic acid; acyloxy groups part of which is substituted with a hydroxyl group, such as lactic acid; and acyloxy groups including two or more carbonyl groups, such as oxalic acid and citric acid.

Examples of the organic alkaline earth metal compounds include magnesium methoxide, magnesium ethoxide, diethyl magnesium, magnesium acetate, magnesium formate, acetylacetone magnesium, magnesium 2-ethylhexanoate, magnesium lactate, magnesium naphthenate, magnesium citrate, magnesium salicylate, magnesium benzoate, magnesium oxalate, magnesium trifluromethanesulfonate, calcium methoxide, calcium ethoxide, calcium acetate, calcium formate, acetylacetone calcium, calcium dipivaloyl methanate, calcium 2-ethylhexanoate, calcium lactate, calcium naphthenate, calcium citrate, calcium salicylate, calcium neodecanoate, calcium benzoate, calcium oxalate, strontium isopropoxide, strontium acetate, strontium formate, acetylacetone strontium, strontium 2-ethylhexanoate, strontium lactate, strontium naphthenate, strontium salicylate, strontium oxalate, barium ethoxide, barium isopropoxide, barium acetate, barium formate, acetylacetone barium, barium 2-ethylhexanoate, barium lactate, barium naphthenate, barium neodecanoate, barium oxalate, barium benzoate, barium trifluoromethane-sulfonate, and bis(acetylacetonato) beryllium.

An amount of the C element-including compound in the coating liquid for forming insulating layer is not particularly limited and may be appropriately selected depending on the intended purpose.

—Solvent—

The solvent is not particularly limited and may be appropriately selected depending on the intended purpose, so long as the solvent is capable of stably dissolving or dispersing the above various compounds. Examples of the solvent include toluene, xylene, mesitylene, cymene, pentylbenzene, dodecylbenzene, bicyclohexyl, cyclohexylbenzene, decane, undecane, dodecane, tridecane, tetradecane, pentadecane, tetralin, decalin, isopropanol, ethyl benzoate, N,N-dimethylformamide, propylene carbonate, 2-ethylhexanoic acid, mineral spirits, dimethylpropylene urea, 4-butyrolactone, 2-methoxy ethanol, propylene glycol, and water.

An amount of the solvent in the coating liquid for forming insulating layer is not particularly limited and may be appropriately selected depending on the intended purpose.

—Formation Method of Gate Insulating Layer Using Coaling Liquid for Forming Insulating Layer—

One example of a formation method of the gate insulating layer using the coating liquid for forming insulating layer will be described. The formation method of the gate insulating layer includes a coating step and a heat treatment step, and further includes other steps if necessary.

The coating step is not particularly limited and may be appropriately selected depending on the intended purpose, so long as the coating step is a step of coating the coating liquid for forming insulating layer on an object to be coated. The coating method is not particularly limited and may be appropriately selected depending on the intended purpose. Examples of the solution process include dip coating, spin coating, die coating, and nozzle printing.

The heat treatment step is not particularly limited and may be appropriately selected depending on the intended purpose, so long as the heat treatment step is a step of subjecting, to a heat treatment, the coating liquid for forming insulating layer coated on the object to be coated. When the heat treatment is performed, the coating liquid for forming insulating layer coated on the object to be coated may be dried through, for example, air-drying. Through the heat treatment, the solvent is dried and the metal oxide is produced.

In the heat treatment step, drying of the solvent (hereinafter referred to as "drying treatment") and generation of the metal oxide (hereinafter referred to as "generation treatment") are preferably performed at different temperatures. That is, after the drying of the solvent, it is preferable that the temperature be elevated to generate the metal oxide. When the metal oxide is generated, for example, at least one of the A element-including compound, the B element-including compound, and the C element-including compound is decomposed.

A temperature of the drying treatment is not particularly limited and may be appropriately selected depending on the solvent contained. For example, the temperature of the drying treatment is from 80° C. through 180° C. As for the drying, it is effective to use a vacuum oven for reducing the temperature. The time of the drying treatment is not particularly limited and may be appropriately selected depending on the intended purpose. For example, the time of the drying treatment is from 1 minute through 1 hour.

A temperature of the generation treatment is not particularly limited and may be appropriately selected depending on the intended purpose. However, the temperature of the generation treatment is preferably 100° C. or higher but lower than 550° C., more preferably from 200° C. through 500° C. The time of the generation treatment is not particularly limited and may be appropriately selected depending on the intended purpose. For example, the time of the generation treatment is from 1 hour through 5 hours.

Note that, in the heat treatment step, the drying treatment and the generation treatment may be continuously performed or may be performed in a divided manner of a plurality of steps.

A temperature of the generation treatment may affect etching rates of various etching solutions in some cases. Therefore, in order to control the etching rate, the heat treatment may be performed at a temperature higher than the temperature of the generation treatment, after patterning.

A method of the heat treatment is not particularly limited and may be appropriately selected depending on the intended purpose. Examples of the method of the heat treatment include a method of heating the object to be coated. An atmosphere in the heat treatment is not particularly limited and may be appropriately selected depending on the intended purpose. However, the atmosphere is preferably an oxygen atmosphere. When the heat treatment is performed in the oxygen atmosphere, decomposed products can be promptly discharged outside the system and generation of the metal oxide can be accelerated.

In the heat treatment, in view of acceleration of reaction of the generation treatment, it is effective to irradiate, with ultraviolet rays having a wavelength of 400 nm or shorter, the material that has undergone the drying treatment. Irradiation of the ultraviolet rays having a wavelength of 400 nm or shorter can cleave chemical bonds of the organic material contained in the material that has undergone the drying treatment, and can decompose the organic material. Therefore, the metal oxide can be efficiently formed. The ultraviolet rays having a wavelength of 400 nm or shorter are not particularly limited and may be appropriately selected depending on the intended purpose. Examples of the ultraviolet rays include ultraviolet rays having a wavelength of 222 nm emitted from an excimer lamp. It is also preferable to apply ozone instead of or in combination with irradiation of the ultraviolet rays. Applying the ozone to the material that has undergone the drying treatment accelerates generation of the metal oxide.

Regarding an average film thickness of the gate insulating layer, a film thickness of the gate insulating layer formed on the electrodes may be thick in terms of coverage, withstand pressure, and reduction in leak current, or may be thin in such a range that can maintain insulation property in terms of capacity of the gate insulating layer. The film thickness thereof can be appropriately selected depending on the intended purpose, but is preferably from 10 nm through 3 μm, more preferably from 30 nm through 1 μm.

In the case where a film thickness of the gate insulating layer is large, the gate insulating layer may have a plurality of layers, and a film of the gate insulating layer is formed by separately forming each of the plurality of layers several times. Moreover, the gate insulating layer may be appropriately adjusted so as to satisfy the aforementioned film thickness (for example, the total value of the gate insulating layer 131 and the gate insulating layer 132 in FIG. 5, which will be described hereinafter). Alternatively, the gate insulating layer 131 may have a plurality of layers, and may be appropriately adjusted so as to satisfy the aforementioned film thickness (for example, the gate insulating layer 131 is formed through coating several times in FIG. 9, which will be described hereinafter, and may be adjusted so as to satisfy the aforementioned film thickness).

<Active Layer>

A material of the active layer 14 is not particularly limited and may be appropriately selected depending on the intended purpose. Examples thereof include organic semiconductors such as polycrystal silicon (p-Si), amorphous silicon (a-Si), an oxide semiconductor, and pentacene. Among them, use of an oxide semiconductor is preferable in terms of safety of boundary between the active layer 14 and the gate insulating layer 13.

The active layer 14 is, for example, an active layer configured to form channel between the source electrode and the drain electrode when a predetermined voltage is applied to the gate electrode.

The active layer 14 can be formed by, for example, an n-type oxide semiconductor.

The n-type oxide semiconductor constituting the active layer 14 is not particularly limited and may be appropriately selected depending on the intended purpose. The n-type oxide semiconductor preferably includes: at least one selected from the group consisting of indium (In), Zn, tin (Sn), and Ti; and an alkaline earth element or a rare earth element, more preferably includes In and an alkaline earth element or a rare earth element.

Examples of the rare earth element include scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Indium oxide changes a concentration of electron carriers from about $10^{18}$ cm$^3$ to about $10^{20}$ cm$^3$ depending on the amount of oxygen vacancies. Here, indium oxide has a property that easily generates oxygen vacancies, and may generate unexpected oxygen vacancies in a post process after formation of the oxide semiconductor film in some cases. The oxide is particularly preferably formed of mainly two metals: indium; and an alkaline earth element or rare earth element that is easily bound to oxygen compared to indium. The reason for this is because unexpected oxygen vacancies can be prevented and control of the formation becomes easy to appropriately control the concentration of electron carriers.

Preferably, the n-type oxide semiconductor constituting the active layer 14 undergoes substitutional doping with at least one dopant selected from the group consisting of a divalent cation, a trivalent cation, a tetravalent cation, a pentavalent cation, a hexavalent cation, a heptavalent cation, and an octavalent cation, and a valence of the dopant is more than a valence of the metal ion constituting the n-type oxide semiconductor (provided that the dopant is excluded from the metal ion). Note that, the substitutional doping may be referred to as an n-type doping.

<Source Electrode and Drain Electrode>

In FIG. 1, the source electrode 15 and the drain electrode 16 are formed on the gate insulating layer 13.

The source electrode 15 and the drain electrode 16 are formed so that a predetermined spacing is provided therebetween.

The source electrode 15 and the drain electrode 16 are electrodes configured to take electric current out correspondingly to application of gate voltage to the gate electrode 12.

Note that, a wired line connected to the source electrode 15 and the drain electrode 16 may be formed on the same layer, together with the source electrode 15 and the drain electrode 16.

A material of the source electrode 15 and the drain electrode 16 is not particularly limited and may be appropriately selected depending on the intended purpose. However, the material thereof is preferably a material capable of etching using the etching solution A having the same type as the etching solution B. Such a material is not particularly limited and may be appropriately selected depending on the intended purpose, so long as it is selected from the group consisting of metals that can be etched using the etching solution A, alloys, mixtures of a plurality of metals, conductive oxides, composite compounds, and stacked films of metals and conductive oxides. For example, metals such as aluminum (Al) and molybdenum (Mo), alloys thereof, and mixtures of these metals can be used. Alternatively, conductive oxides such as indium oxide and zinc oxide, composite compounds thereof, and mixtures thereof may be used.

The conductive oxides, the composite compounds, the mixtures thereof can be used irrespective of being multicrystal and amorphous. The conductive oxides, the composite compounds, the mixtures are preferably amorphous in a patterning process, because an amorphous structure reduces variations of an etching rate on the same substrate and patterning with favorable precision can be achieved. It is known that these materials are subjected to a heat treatment in order to improve conductive property of the electrodes. However, the heat treatment is preferably performed after patterning in terms of precision of patterning.

As the conductive oxide including indium oxide, tin-doped indium oxide (hereinafter referred to as ITO) and $In_2O_3$—ZnO complex oxide (IZO) are widely known as the conductive oxide. However, IZO is more preferable when patterning is performed because it is amorphous and stable.

When the conductive oxides, the composite compounds, and the mixtures thereof are used for the electrodes, electric resistance may increase in some cases because the electrodes have undergone a heat treatment in the post process. Therefore, when the conductive oxides, the composite compounds, and the mixtures thereof are used for the electrodes, a metal having a high conductivity is preferably stacked considering resistance of wired lines. Examples of the metal having a high conductivity include Ag, Al, and Cu. In this case, conductive oxides, the composite compounds, and the mixtures thereof stacked using the etching solution having the same type can be preferably etched at once.

An average film thickness of the source electrode 15 and the drain electrode 16 is not particularly limited and may be appropriately selected depending on the intended purpose. The average film thickness thereof is preferably from 10 nm through 1 µm, more preferably from 50 nm through 300 nm.

As a method for forming patterns of each layer of the formed film, a method for forming patterns through photolithography and etching is generally used. The etching method can be appropriately selected from dry etching and wet etching depending on the intended purpose. However, wet etching is preferable in terms of production cost. The etching solution used in the wet etching can be selected depending on the respective layers. However, the larger the number of layers obtained using the etching solution having the same type is, the lower the production cost is, which is preferable. Generally, in the case of vacuum process, it is necessary to distinguish process chambers for each layer, in order to prevent occurrence of contamination. Therefore, when dry etching is used in some of the etching processes, chambers used are preferably distinguished as chambers for the metal and chambers for the oxide. When the gate insulating layer having a high dielectric constant is diverted into a facility to be used in a conventional Si-based process, the metal-based process may be applied as it is. In this case, the etching solution having the same type as those used for etching at least the gate insulating layer and the active layer is preferably applied to a layer using wet etching.

Examples of the etching solution A include etching solutions including nitric acid, etching solutions including hydrogen peroxide, and etching solutions including oxalic acid.

Examples of the etching solution B that is an etching solution having the same type as the etching solution A are as follows, for example. Specifically, when the etching solution A is an etching solution including nitric acid, the etching solution B is an etching solution including nitric acid. When the etching solution A is an etching solution including hydrogen peroxide, the etching solution B is an etching solution including hydrogen peroxide. When the etching solution A is an etching solution including oxalic acid, the etching solution B is an etching solution including oxalic acid.

Here, as described above, concentrations of the etching solution A and the etching solution B may be the same or different, so long as the etching solution A and the etching solution B have the same main component contributing to etching. In addition, as described above, other constituent components in the etching solution A and the etching solution B may be the same or different, so long as the etching solution A and the etching solution B have the same main component contributing to etching.

When the etching solution A is the etching solution including nitric acid, the etching solution A preferably further includes phosphoric acid and acetic acid.

When the etching solution B is the etching solution including nitric acid, the etching solution B preferably further includes phosphoric acid and acetic acid.

(Metal Oxide and Field-Effect Transistor)

The metal oxide of the present disclosure functions as the gate insulating layer of the field-effect transistor.

The metal oxide includes A element and at least one selected from the group consisting of B element and C element.

The A element is at least one selected from the group consisting of Sc, Y, Ln (lanthanoid), Sb, Bi, and Te. Details and preferable aspects of the A element are the same as the details and the preferable aspects in the description of the field-effect transistor.

The B element is at least one selected from the group consisting of Ga, Ti, Zr, and Hf. Details and preferable aspects of the B element are the same as the details and the preferable aspects in the description of the field-effect transistor.

The C element is at least one selected from the group consisting of Group 2 elements in a periodic table. Details and preferable aspects of the C element are the same as the details and the preferable aspects in the description of the field-effect transistor.

Regarding the metal oxide, an etching rate of the metal oxide in a wet etching solution including nitric acid is 0.1 nm/s or more but 20 nm/s or less, preferably 0.1 nm/s or more but 10 nm/s or less, more preferably 0.5 nm/s or more but 5 nm/s or less.

Conditions in the case where the etching rate is determined in the present invention and the present specification are generally as follows.

A temperature of the wet etching solution is generally 35° C.

The etching rate is generally an etching rate obtained when the metal oxide is immersed into the wet etching solution, followed by light stirring.

The etching depth can be determined by, for example, observing it with a transmission electron microscope. In the case of the evaluation of a single film or the evaluation of an uppermost layer during the process for producing the device, the etching depth can be easily determined by measuring a shape of steps using an atomic force microscope.

The wet etching solution is, for example, a wet etching solution including 6% by mass of nitric acid.

The wet etching solution is, for example, a wet etching solution including 6% by mass of nitric acid, 25% by mass of acetic acid, and 50% by mass of phosphoric acid.

The wet etching solution is, for example, a wet etching solution used for forming at least one selected from the group consisting of the active layer, the gate electrode, and the source electrode and the drain electrode after formation of the gate insulating layer in production of the field-effect transistor.

Here, the at least one selected from the group consisting of the active layer, the gate electrode, and the source electrode and the drain electrode is in contact with the gate insulating layer.

In the production of the field-effect transistor, use of the etching solution having the same type is effective in the formation of the gate insulating layer and the formation of at least one selected from the group consisting of the active layer, the gate electrode, and the source electrode and the drain electrode for the purpose of reducing production cost. Furthermore, an etching rate is important in terms of the TAKT time and the processing shape. Particularly, regarding the gate insulating layer, it is preferable that an etching rate in the etching solution in the formation of at least one selected from the group consisting of the active layer, the gate electrode, and the source electrode and the drain electrode be considered.

Moreover, regarding the metal oxide, an etching rate of the metal oxide in the wet etching solution including nitric acid is 0.1 nm/s or more. For example, in the case where the gate insulating layer is formed, when the etching rate is less than 0.1 nm/s, etching time is prolonged in the case of overetching the gate insulating layer that generally has a film thickness of from about 100 nm through about 300 nm in order to perform patterning without residues. As a result, the TAKT time is prolonged. In the case where the wet etching solution including nitric acid is used to form the gate electrode after the gate insulating layer is formed, when the etching rate is less than 0.1 nm/s, the TAKT time is prolonged likewise.

Regarding the metal oxide, an etching rate of the metal oxide in the wet etching solution including nitric acid is 20 nm/s or less. For example, in the case where the wet etching solution including nitric acid is used to form the gate electrode after formation of the gate insulating layer, when the etching rate is more than 20 nm/s, a portion of the gate insulating layer, the portion underlying the gate electrode, is considerably etched from a boundary between the gate electrode and the underlying gate insulating layer. As a result, line width of the gate insulating layer underlying the gate electrode easily becomes thinner than line width of the gate electrode (undercut). In the extreme case, the portion underlying the gate electrode is completely etched, which results in failure in patterning such as the exfoliated gate electrode. Hereinafter, occurrence of this state will be described with reference to specific examples.

The precondition is following. Specifically, when an etching rate of the gate insulating layer is more than 20 nm/s, the etching rate thereof is generally faster than an etching rate of the gate electrode.

For example, Mo having an etching rate of 6 nm/s is used to form the gate electrode having a film thickness of 100 nm, it takes 17 seconds to etch Mo by 100 nm. However, a time 1.5 times as long as the above calculated time for etching Mo is actually spent in consideration of etching unevenness of Mo or distribution of the film thickness [time: about 17 s×1.5=25 s (overetching is performed for about 8 s)]. Considering the overetching time: about 8 s and the etching rate of the gate insulating layer: 20 nm/s, the gate insulating layer is etched by 160 nm. Hereinafter, a simple calculation will be performed in terms of design of width of the gate electrode.

Figure 13:
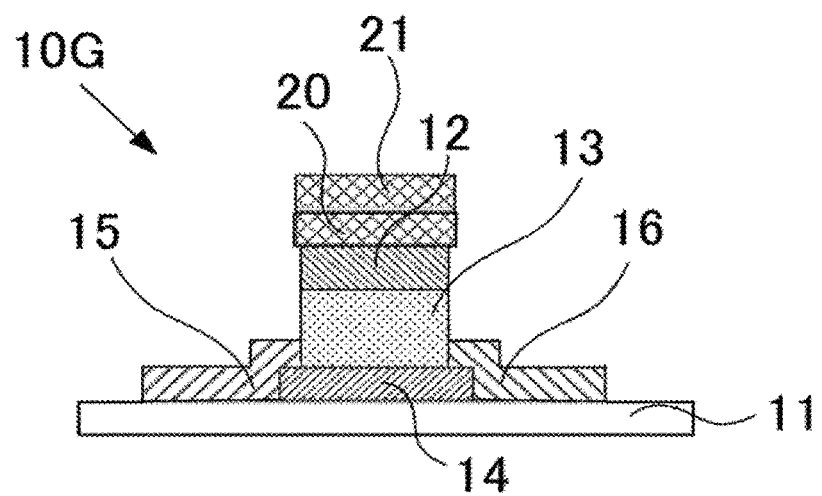
FIG. 13 is a cross-sectional view exemplifying a field-effect transistor 10G according to a variation example of an embodiment.

The wet etching is an isotropic etching. Therefore, as the etching proceeds by 160 nm in a direction of the film thickness, the portion underlying the gate electrode is also etched by 160 nm toward a direction of the in-plane direction: i.e. a direction of an inner side of the pattern of the gate electrode. When the width of the gate electrode is 10 µm, the width of the gate insulating layer that is the portion underlying the gate electrode is as follows: 10 µm−0.16 µm×2=9.68 µm (the width of the gate insulating layer is multiplied by twice because etching is performed from both sides of the wired line). When the structure of FIG. 13 is produced, it is necessary to further prolong an overetching time so that the etching residue of the gate insulating layer does not remain on the active layer. Assuming that the required etching time is etching time of the gate insulating layer×1.5 times, when etching is performed for about 4 s in addition to the above etching time, the width of the gate insulating layer is 9.52 µm (10 µm−0.24 µm×2) and becomes thinner than the width of the gate electrode by about 5%. The same calculation is applied to the case where the gate electrode is Al, the following situation will occur. Specifically, an etching rate of Al is twice as high as that of Mo. Therefore, the width of the gate insulating layer that is the base portion of the gate electrode is about 9 µm, and becomes thinner than the width of the gate electrode by 10%. When the designed value of the width of the gate electrode is thinner (high precision), such a state that the undercut proceeds is found even for the same etching time. As a result, an edge of the pattern of the gate electrode is raised, warped, or exfoliated.

The above is the reason why the upper limit of the etching rate that does not cause the failure is 20 nm/s.

In a field-effect transistor of one embodiment of the present invention, the metal oxide is used in the gate insulating layer.

EMBODIMENTS

Next, the method for producing a field-effect transistor presented in FIG. 1 will be described. FIG. 2A to FIG. 2E are views exemplifying production steps of the field-effect transistor 10A according to an embodiment.

Figure 2A:
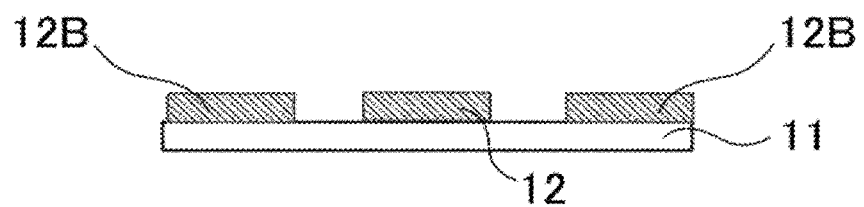
FIG. 2A is a view exemplifying a production step of the field-effect transistor 10A according to an embodiment (part 1)

First, in the step presented in FIG. 2A, a substrate 11 formed of, for example, a glass substrate is provided. Then, a conductive film formed of, for example, aluminum (Al) is formed on the substrate 11 through the sputtering method, and the formed conductive film is patterned through photolithography and etching to form a gate electrode 12 and gate electrode pads 12B having predetermined shapes. In order to clean the surface of the substrate 11 and improve adhesiveness, a pre-treatment such as oxygen plasma, UV ozone, or UV radiation washing is preferably performed before the gate electrode 12 and the gate electrode pads 12B are formed. Materials and thicknesses of the substrate 11, the gate electrode 12, and the gate electrode pads 12B can be appropriately selected.

A method for producing the gate electrode 12 and the gate electrode pads 12B is not particularly limited and may be appropriately selected depending on the intended purpose. One exemplary method is, for example, a method of forming a film through, for example, a sputtering method, a vacuum deposition method, a dip coating method, a spin coating method, or a die coating method, and then patterning the film through photolithography. Another example is, for example, a method of directly forming a film having a desired shape through a printing process such as inkjet printing, nanoimprinting, or gravure printing.

Figure 2B:
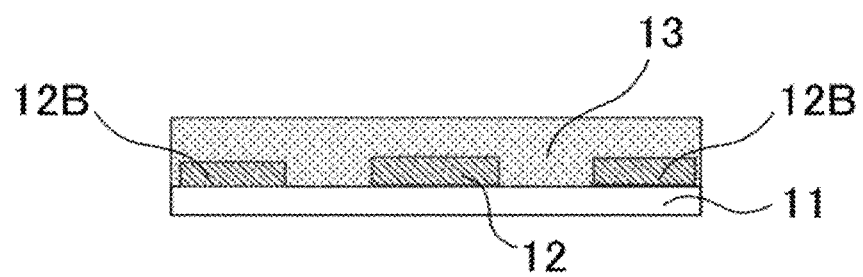
FIG. 2B is a view exemplifying a production step of the field-effect transistor 10A according to an embodiment (part 2)

Next, in the step presented in FIG. 2B, the gate insulating layer 13, which covers the gate electrode 12 and the gate electrode pads 12B, is formed on the substrate 11.

A method for forming the gate insulating layer 13 is not particularly limited and may be appropriately selected depending on the intended purpose. Examples thereof include: film formation steps through a vacuum process (e.g., a sputtering method, a pulsed laser deposition (PLD) method, a chemical vapor deposition (CVD) method, or an atomic layer deposition (ALD) method) or film formation steps through a solution process (e.g., dip coating, spin coating, or die coating). Another example thereof is, for example, a printing process such as inkjet printing, nanoimprinting, or gravure printing. A material and thickness of the gate insulating layer 13 can be appropriately selected as described above.

Figure 2C:
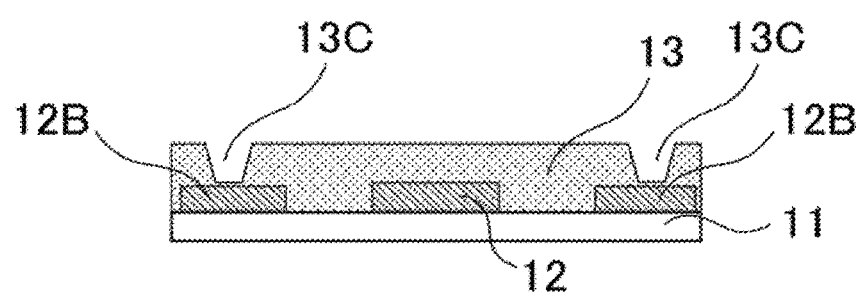
FIG. 2C is a view exemplifying a production step of the field-effect transistor 10A according to an embodiment (part 3)

In the step presented in FIG. 2C, through holes 13C are formed by etching the gate insulating layer 13 on the gate electrode pads 12B. In this case, when the PAN-based etching solution (etching solution including phosphoric acid, acetic acid, and nitric acid) is used as an etching solution having the same type as the etching solution for subjecting the gate electrode 12 to wet etching, it is possible to sufficiently obtain an etching selection ratio between the gate electrode 12 and the gate insulating layer 13, by incorporating polycrystalline ITO that is the conductive oxide into the uppermost layer of the gate electrode 12.

In the step presented in FIG. 2C, through holes 13C are formed by etching the gate insulating layer 13 on the gate electrode pads 12B. In this case, in the case where the PAN-based etching solution is used as an etching solution having the same type as the etching solution for subjecting the gate electrode 12 to wet etching, when the etching rate of the gate electrode in the PAN-based etching solution is large, it is possible to sufficiently obtain an etching selection ratio between the gate electrode pads 12B and the gate insulating layer 13, by including polycrystalline ITO that is the conductive oxide in the uppermost layer of the gate electrode pads 12B, or using Al, an Al alloy, Ti, or W in the uppermost layer of the electrode pads 12B, in order to protect the electrode pads 12B.

Figure 2D:
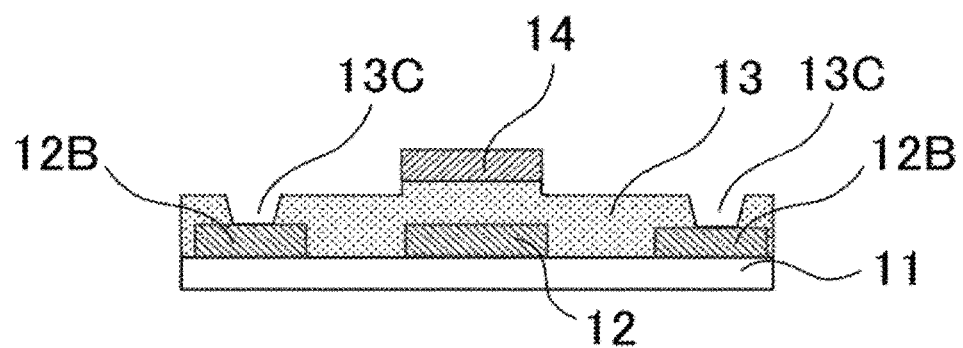
FIG. 2D is a view exemplifying a production step of the field-effect transistor 10A according to an embodiment (part 4)

Next, in the step presented in FIG. 2D, a film of the oxide semiconductor is formed so as to cover the gate electrode pads 12B, the through holes 13C, and the gate insulating layer 13. The formed oxide semiconductor is patterned through photolithography and wet etching to form an active layer 14 having a predetermined shape. A film formation method of the oxide semiconductor is not particularly limited and may be appropriately selected depending on the intended purpose. Examples thereof include film formation steps through a vacuum process (e.g., a sputtering method, a pulsed laser deposition (PLD) method, a chemical vapor deposition (CVD) method, or an atomic layer deposition (ALD) method) or film formation steps through a solution process (e.g., dip coating, spin coating, or die coating). The oxide semiconductor can be formed of, for example, an n-type oxide semiconductor. As the etching solution used for etching, the etching solution having the same type as the etching solution for subjecting the gate insulating layer 13 to etching can be used. However, the following (i) or (ii) is caused depending on the etching rate of the oxide semiconductor and the etching rate of the gate insulating layer in the etching solution of the oxide semiconductor.

(i) No step is formed on the gate insulating layer 13.

(ii) A step having the same shape as that of the active layer, a step having a taper angle smaller than the active layer 14, or a step having a shape of the reverse taper may be formed, but the gate insulating layer 13 is not completely dissolved.

Note that, FIG. 2D is an example where a step having the same shape as that of the active layer 14 is formed on the gate insulating layer 13 depending on the etching rate of the oxide semiconductor.

The active layer 14 formed may include crystalline components and amorphous components. However, in order not completely dissolve the gate insulating layer 13 upon the wet etching, it is preferable that an amount of the amorphous components be large upon forming patterns for the purpose of obtaining a selection ratio of the etching rate between the active layer 14 and the gate insulating layer 13.

Figure 2E:
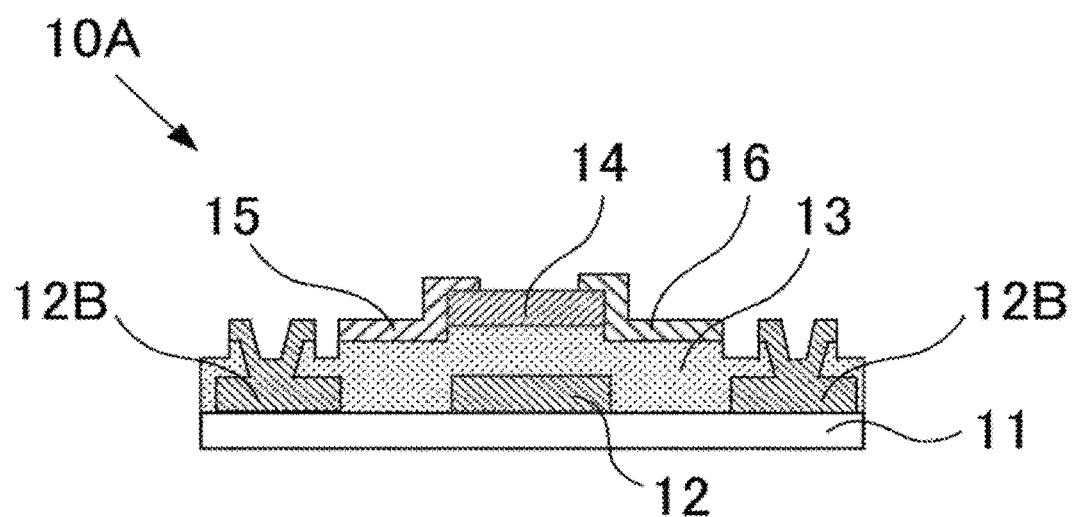
FIG. 2E is a view exemplifying a production step of the field-effect transistor 10A according to an embodiment (part 5)

In the step presented in FIG. 2E, a conductive film to become a source electrode 15 and a drain electrode 16 is formed over the whole surface on the gate electrode pads 12B, the through holes 13C, the gate insulating layer 13, and the active layer 14. Then, the formed conductive film is patterned through photolithography and wet etching to form the source electrode 15 and the drain electrode 16 each having a predetermined shape. In order to clean the surface of the gate insulating layer 13 and improve adhesiveness, a pre-treatment such as oxygen plasma, UV ozone, or UV radiation washing is preferably performed before formation of the conductive film to become the source electrode 15 and the drain electrode 16.

A formation method of the conductive film to become the source electrode 15 and the drain electrode 16 is not particularly limited and may be appropriately selected depending on the intended purpose. One exemplary method is, for example, a method of forming a film through, for example, a sputtering method, a vacuum deposition method, a dip coating method, a spin coating method, or a die coating method, and then patterning the film through photolithography. Another example thereof is, for example, a printing process such as inkjet printing, nanoimprinting, or gravure printing. Materials to become the source electrode 15 and the drain electrode 16 and thicknesses thereof can be appropriately selected as described in the above description regarding the source electrode 15 and the drain electrode 16.

As the etching solution used for subjecting, to wet etching, the conductive film to become the source electrode 15 and the drain electrode 16, an etching solution having the same type as the etching solution that has etched the gate insulating layer 13 can be used. However, steps having the same shape as those of the source electrode 15 and the drain electrode 16 may be generated on the gate insulating layer 13 depending on etching rates of the conductive film to become the source electrode 15 and the drain electrode 16, but the gate insulating layer 13 is not completely dissolved. In order not to completely dissolve the gate insulating layer 13, an etching rate of the source electrode 15 and the drain electrode 16 is preferably faster than the etching rate of the gate insulating layer 13 by about 10 folds.

Note that, the active layer 14 is also etched when the source electrode 15 and the drain electrode 16 are formed. However, it is preferable that the active layer 14 be subjected to a heat treatment beforehand, to thereby obtain a sufficient selection ratio of the etching rate between the active layer 14 and the conductive film to become the source electrode 15 and the drain electrode 16.

In the step presented in FIG. 2E, etching is further performed for the purpose of disconnecting electrical connection between the source electrode 15 and the gate electrode pad 12B at a side of the source electrode 15, and electrical connection between the drain electrode 16 and the gate electrode pad 12B at a side of the drain electrode 16.

From the above steps, a bottom gate/top contact field-effect transistor 10A can be produced.

Variation Example of Embodiment (Part 1)

A variation example of an embodiment (part 1) presents an example of a top gate/top contact field-effect transistor. In the variation example of the embodiment, the description of the same constituent parts as those that have been previously described in the embodiment may be omitted in some cases.

Figure 3:
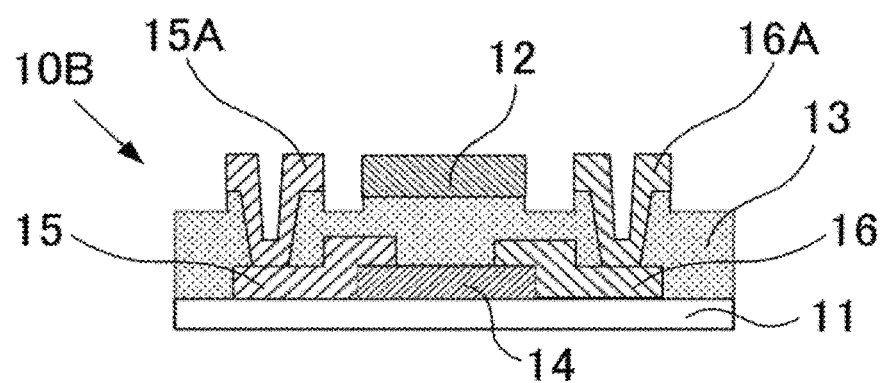
FIG. 3 is a cross-sectional view exemplifying a field-effect transistor 10B according to a variation example of an embodiment.

FIG. 3 is a cross-sectional view exemplifying a field-effect transistor according to the variation example of the embodiment.

Referring to FIG. 3, a field-effect transistor 10B is a top gate/top contact field-effect transistor. Note that, the field-effect transistor 10B is one representative example of a semiconductor device according to the present disclosure.

The field-effect transistor 10B has a layer structure different from that of the field-effect transistor 10A (see FIG. 1). Specifically, the field-effect transistor 10B includes: a substrate 11; an active layer 14 formed on the substrate 11; a source electrode 15 and a drain electrode 16 formed on the active layer 14; a gate insulating layer 13 formed on the active layer 14, and the source electrode 15 and the drain electrode 16; and a gate electrode 12 formed on the gate insulating layer 13. In this case, the etching solutions having the same type are used at least when the gate insulating layer 13 is etched and when the gate electrode 12 is formed.

Next, a method for producing a field-effect transistor presented in FIG. 3 will be described. FIG. 4A to FIG. 4E are views exemplifying production steps of the field-effect transistor 10B according to an embodiment.

Figure 4A:
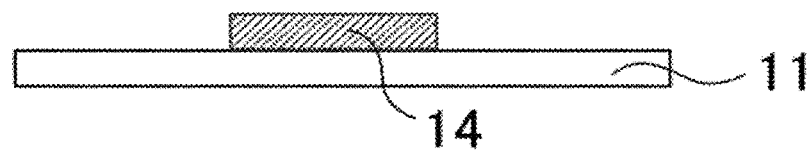
FIG. 4A is a view exemplifying a production step of the field-effect transistor 10B according to an embodiment (part 1)

First, in the step presented in FIG. 4A, a substrate 11 formed of, for example, a glass substrate is provided. Then, a film of an oxide semiconductor is formed on the substrate 11, and the formed oxide semiconductor is patterned through photolithography and wet etching to form an active layer 14 having a predetermined shape.

Figure 4B:
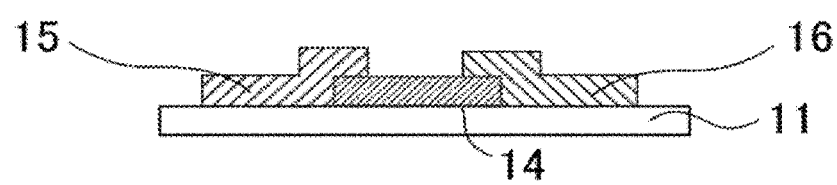
FIG. 4B is a view exemplifying a production step of the field-effect transistor 10B according to an embodiment (part 2)

Next, in the step presented in FIG. 4B, a conductive film to become a source electrode 15 and a drain electrode 16 is formed over the whole surface on the substrate 11 and the active layer 14, and the formed conductive film is patterned through photolithography and wet etching to form the source electrode 15 and the drain electrode 16 each having a predetermined shape.

Figure 4C:
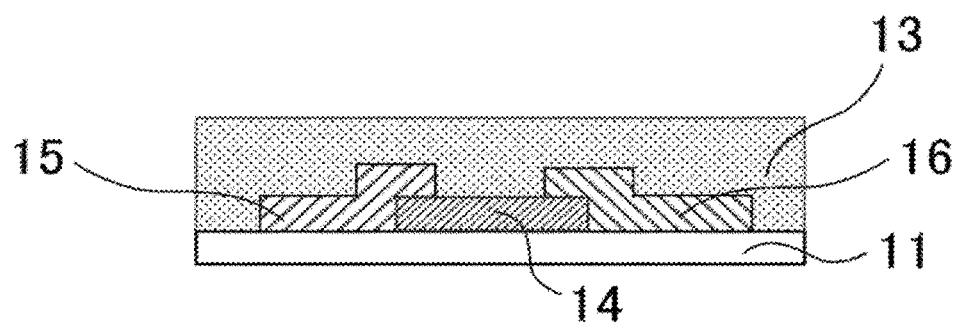
FIG. 4C is a view exemplifying a production step of the field-effect transistor 10B according to an embodiment (part 3)

Then, in the step presented in FIG. 4C, a gate insulating layer 13, which covers the substrate 11, the active layer 14, the gate electrode 15, and the drain electrode 16, is formed.

Figure 4D:
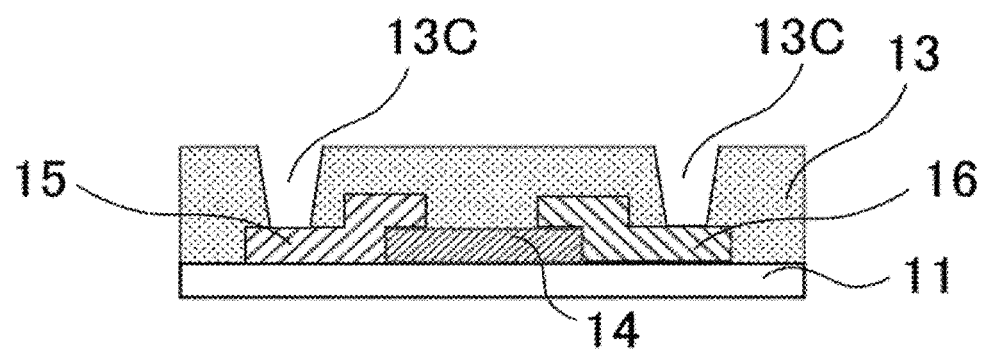
FIG. 4D is a view exemplifying a production step of the field-effect transistor 10B according to an embodiment (part 4)

Subsequently, in the step presented in FIG. 4D, the gate insulating layer 13 on the source electrode 15 and the drain electrode 16 is etched to form through holes 13C. In this case, an etching solution having the same type as the etching solution for subjecting, to wet etching, the active layer 14, or the source electrode 15 and the drain electrode 16 is used.

Subsequently, in the step presented in FIG. 4E, a conductive film to become a gate electrode 12, a source wired line 15A connecting the source electrode 15 to the outside, and a drain wired line 16A connecting the drain electrode 16 to the outside is formed over the whole surface on the exposed source electrode 15, the exposed drain electrode 16, and the gate insulating layer 13. The formed conductive film is patterned through photolithography and wet etching to form the gate electrode 12, the source wired line 15A, and the drain wired line 16A each having a predetermined shape.

Figure 4E:
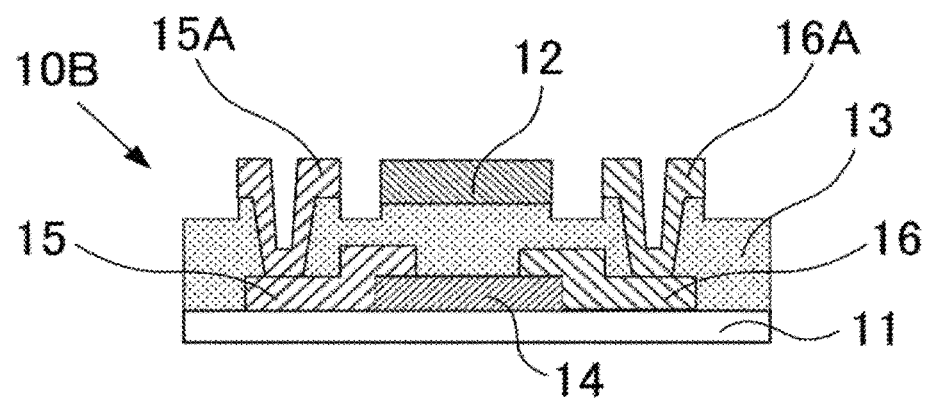
FIG. 4E is a view exemplifying a production step of the field-effect transistor 10B according to an embodiment (part 5)

In the step presented in FIG. 4E, etching is further performed for the purpose of disconnecting electrical connection between the source wired line 15A and the gate electrode 12, and electrical connection between the drain wired line 16A and the gate electrode 12.

From the above steps, a top gate/top contact field-effect transistor 10B can be produced.

Variation Example of Embodiment (Part 2)

A variation example of an embodiment (part 2) presents an example of a top gate/top contact field-effect transistor. In the variation example of the embodiment, the description of the same constituent parts as those that have been previously described in the embodiment may be omitted in some cases.

Figure 5:
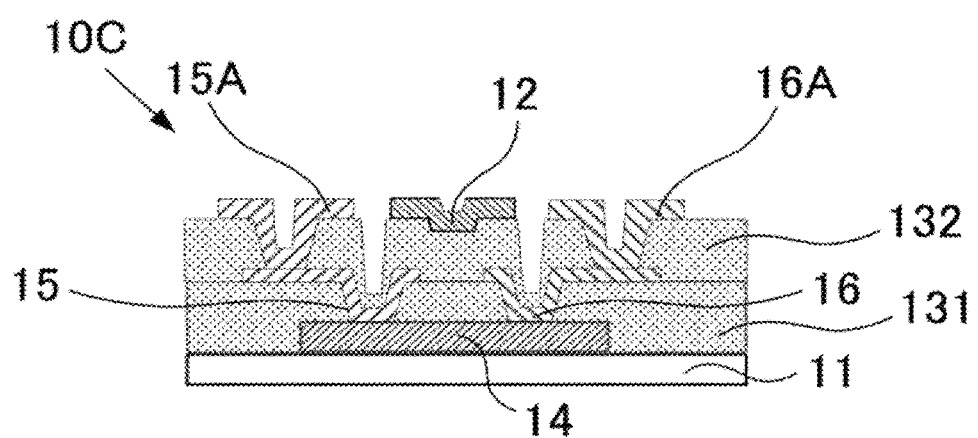
FIG. 5 is a cross-sectional view exemplifying a field-effect transistor 10C according to a variation example of an embodiment.

Referring to FIG. 5, a field-effect transistor 10C is a top gate/top contact field-effect transistor. Note that, the field-effect transistor 10C is one representative example of a semiconductor device according to the present disclosure.

The field-effect transistor 10C has a layer structure different from that of the field-effect transistor 10B (see FIG. 3). Specifically, the field-effect transistor 10C includes: a substrate 11; an active layer 14 formed on the substrate 11; a first gate insulating layer 131 formed on the active layer 14; a source electrode 15 and a drain electrode 16 that are in contact with the active layer 14 via through holes 131C formed on the first gate insulating layer 131; a second gate insulating layer 132 formed on the source electrode 15 and the drain electrode 16; and a gate electrode 12 formed on the second gate insulating layer 132. In this case, the etching solutions having the same type are used both when at least one of the first gate insulating layer 131 and the second gate insulating layer 132 is etched and when at least one of the source electrode 15 and drain electrode 16, and the gate electrode 12 is formed.

In this example, at least one of the first gate insulating layer 131 and the second gate insulating layer 132 is the metal oxide.

Next, a method for producing a field-effect transistor presented in FIG. 5 will be described. FIG. 6A to FIG. 6E are views exemplifying production steps of the field-effect transistor 10C according to an embodiment.

Figure 6A:
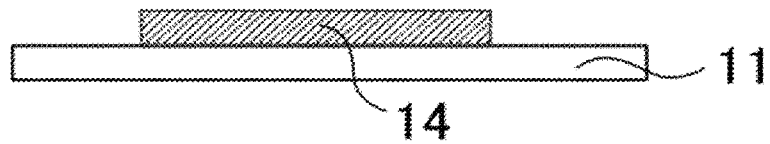
FIG. 6A is a view exemplifying a production step of the field-effect transistor 10C according to an embodiment (part 1)

First, in the step presented in FIG. 6A, a substrate 11 formed of, for example, a glass substrate is provided. Then, a film of an oxide semiconductor is formed on the substrate 11, and the formed oxide semiconductor is patterned through photolithography and wet etching to form an active layer 14 having a predetermined shape.

Figure 6B:
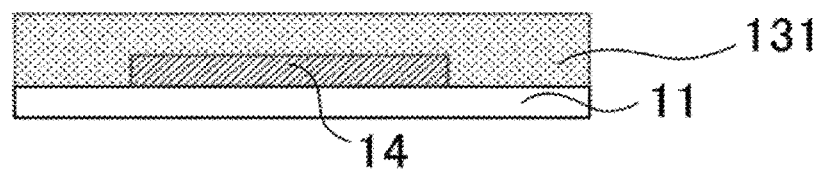
FIG. 6B is a view exemplifying a production step of the field-effect transistor 10C according to an embodiment (part 2)

Then, in the step presented in FIG. 6B, a first gate insulating layer 131, which covers the substrate 11 and the active layer 14, is formed.

Figure 6C:
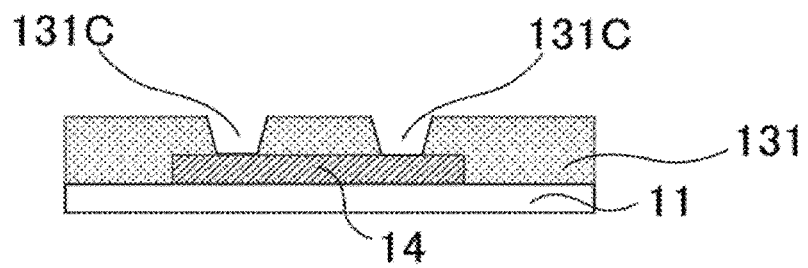
FIG. 6C is a view exemplifying a production step of the field-effect transistor 10C according to an embodiment (part 3)

Subsequently, in the step presented in FIG. 6C, the first gate insulating layer 131 is etched to form through holes 131C in order to form a source electrode 15 and a drain electrode 16. In this case, for example, an etching solution having the same type as the etching solution for subjecting, to wet etching, the active layer 14, or the source electrode 15 and the drain electrode 16 is used.

Figure 6D:
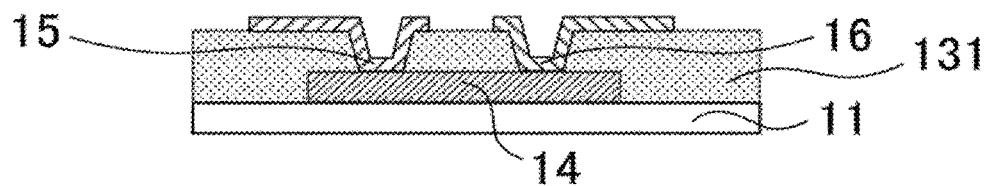
FIG. 6D is a view exemplifying a production step of the field-effect transistor 10C according to an embodiment (part 4)

Subsequently, in the step presented in FIG. 6D, a conductive film to become the source electrode 15 and the drain electrode 16 is formed on the first gate insulating layer 131 and the exposed active layer 14. The formed conductive film is patterned through photolithography and wet etching to form the source electrode 15 and the drain electrode 16 each having a predetermined shape.

Figure 6E:
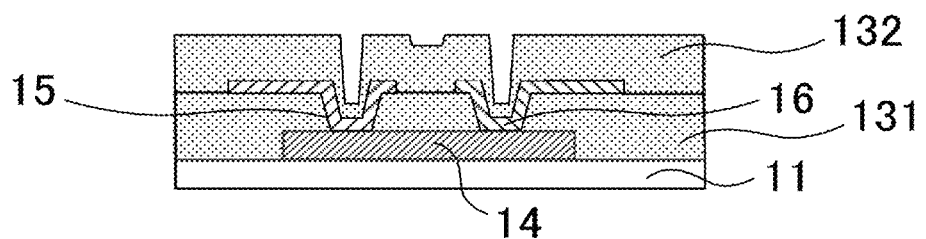
FIG. 6E is a view exemplifying a production step of the field-effect transistor 10C according to an embodiment (part 5)

In the step presented in FIG. 6E, a second gate insulating layer 132 is formed on the first gate insulating layer 131, and the source electrode 15 and the drain electrode 16.

Figure 6F:
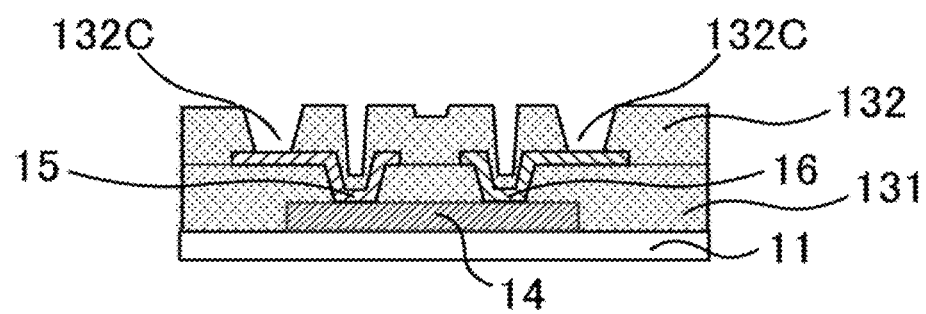
FIG. 6F is a view exemplifying a production step of the field-effect transistor 10C according to an embodiment (part 6)

Subsequently, in the step presented in FIG. 6F, the second gate insulating layer 132 is etched to form through holes 132C in order to form a source wired line 15A and a drain wired line 16A. In this case, for example, an etching solution having the same type as the etching solution for subjecting, to wet etching, the active layer 14, or the source electrode 15 and the drain electrode 16 is used.

Figure 6G:
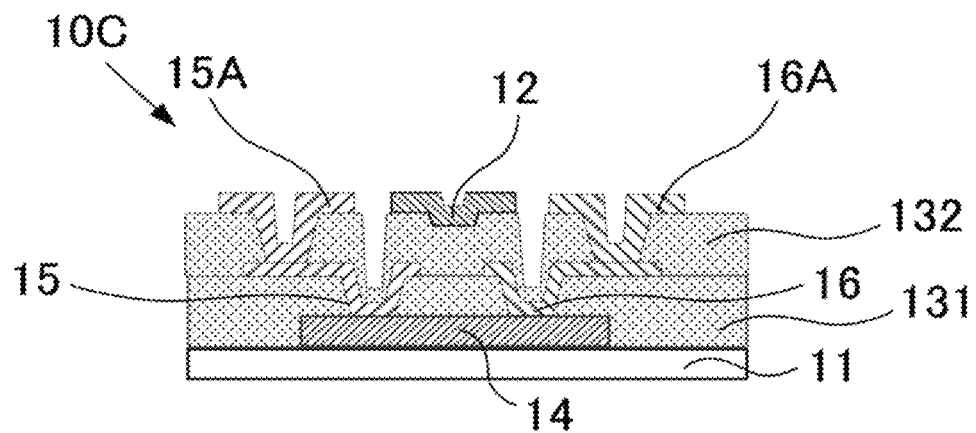
FIG. 6G is a view exemplifying a production step of a field-effect transistor 10C according to an embodiment (part 7)

In the step presented in FIG. 6G, a conductive film to become a gate electrode 12, a source wired line 15A, and a drain wired line 16A is formed over the whole surface on the exposed source electrode 15, the exposed drain electrode 16, and the second gate insulating layer 132. The formed conductive film is patterned through photolithography and wet etching to form the gate electrode 12, the source wired line 15A, and the drain wired line 16A each having a predetermined shape.

In the step presented in FIG. 6G, etching is further performed for the purpose of disconnecting electrical connection between the source wired line 15A and the gate electrode 12, and electrical connection between the drain wired line 16A and the gate electrode 12.

From the above steps, a top gate/top contact field-effect transistor 10C can be produced.

Variation Example of Embodiment (Part 3)

A variation example of an embodiment (part 3) presents an example of a top gate/top contact field-effect transistor. In the variation example of the embodiment, the description of the same constituent parts as those that have been previously described in the embodiment may be omitted in some cases.

Figure 7:
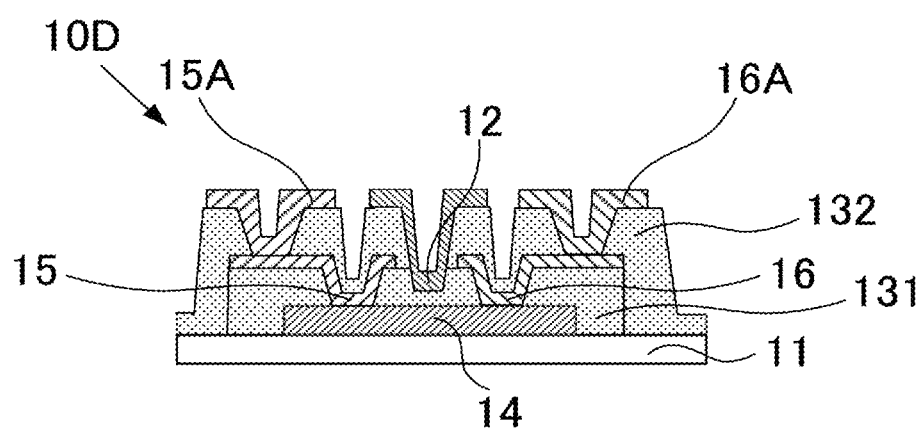
FIG. 7 is a cross-sectional view exemplifying a field-effect transistor 10D according to a variation example of an embodiment.

Referring to FIG. 7, a field-effect transistor 10D is a top gate/top contact field-effect transistor. Note that, the field-effect transistor 10D is one representative example of a semiconductor device according to the present disclosure.

The field-effect transistor 10D has a layer structure different from that of the field-effect transistor 10B (see FIG. 3). Specifically, the field-effect transistor 10D includes: a substrate 11; an active layer 14 formed on the substrate 11; a first gate insulating layer 131 formed on the active layer 14; a source electrode 15 and a drain electrode 16 that are in contact with the active layer 14 via through holes 131C formed on the first gate insulating layer 131; a second gate insulating layer 132 formed on the source electrode 15 and the drain electrode 16; and a gate electrode 12 formed on the second gate insulating layer 132. In this case, the etching solutions having the same type are used both when at least one of the first gate insulating layer 131 and the second gate insulating layer 132 is etched and when at least one of the source electrode 15 and the drain electrode 16, and the gate electrode 12 is formed.

In this example, at least one of the first gate insulating layer 131 and the second gate insulating layer 132 is preferably the metal oxide, both of them are more preferably the metal oxide.

Next, a method for producing a field-effect transistor presented in FIG. 7 will be described. FIG. 8A to FIG. 8G are views exemplifying production steps of the field-effect transistor 10C according to an embodiment.

Figure 8A:
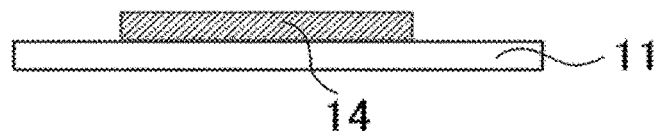
FIG. 8A is a view exemplifying a production step of the field-effect transistor 10D according to an embodiment (part 1)

First, in the step presented in FIG. 8A, a substrate 11 formed of, for example, a glass substrate is provided. Then, a film of an oxide semiconductor is formed on the substrate 11, and the formed oxide semiconductor is patterned through photolithography and wet etching to form an active layer 14 having a predetermined shape.

Figure 8B:
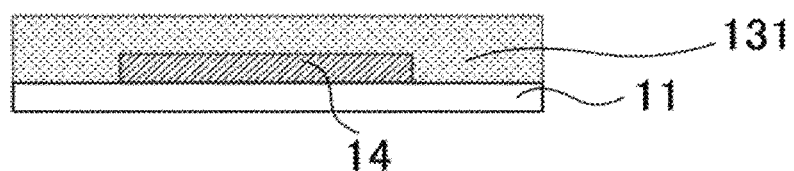
FIG. 8B is a view exemplifying a production step of the field-effect transistor 10D according to an embodiment (part 2)

Then, in the step presented in FIG. 8B, a first gate insulating layer 131, which covers the substrate 11 and the active layer 14, is formed.

Figure 8C:
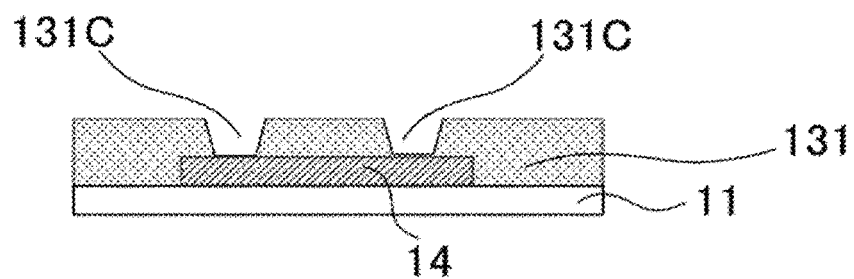
FIG. 8C is a view exemplifying a production step of the field-effect transistor 10D according to an embodiment (part 3)

Subsequently, in the step presented in FIG. 8C, the first gate insulating layer 131 is etched to form through holes 131C in order to form a source electrode 15 and a drain electrode 16. In this case, for example, an etching solution having the same type as the etching solution for subjecting, to wet etching, the active layer 14, or the source electrode 15 and the drain electrode 16 is used.

Subsequently, in the step presented in FIG. 8D, a conductive film to become the source electrode 15 and the drain electrode 16 is formed on the first gate insulating layer 131 and the exposed active layer 14. The formed conductive film is patterned through photolithography and wet etching to form the source electrode 15 and the drain electrode 16 each having a predetermined shape.

Figure 8D:
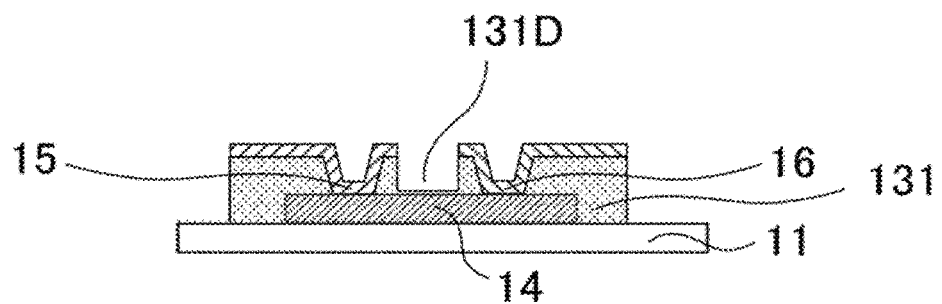
FIG. 8D is a view exemplifying a production step of the field-effect transistor 10D according to an embodiment (part 4)

In the step presented in FIG. 8D, the source electrode 15 and the drain electrode 16 are formed. In this case, the first gate insulating layer 131 on the active layer 14 and a region of the first gate insulating layer 131 outside the active layer 14 may be etched to expose the active layer 14 and the substrate 11. Alternatively, the gate insulating layer 131 may remain thinly. In this case, for example, an etching solution having the same type as the etching solution for subjecting, to wet etching, the active layer 14, or the source electrode 15 and the drain electrode 16 is used.

Figure 8E:
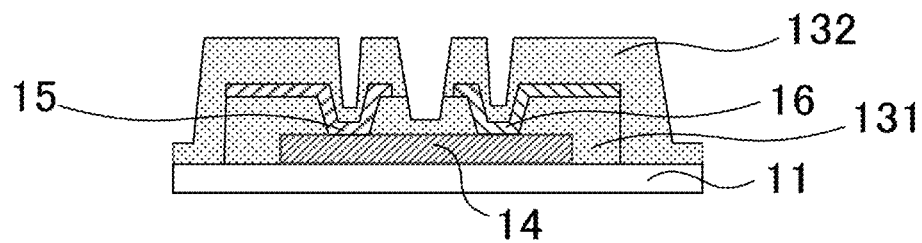
FIG. 8E is a view exemplifying a production step of the field-effect transistor 10D according to an embodiment (part 5)

Next, in the step presented in FIG. 8E, a second gate insulating layer 132 is formed on the substrate 11, the active layer 14, and the source electrode 15 and the drain electrode 16.

Figure 8F:
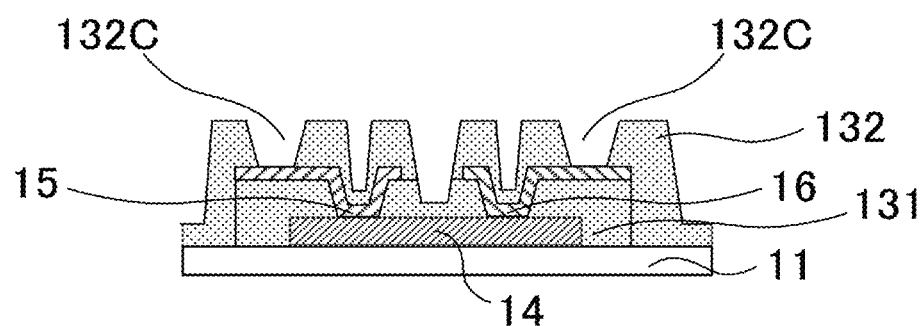
FIG. 8F is a view exemplifying a production step of the field-effect transistor 10D according to an embodiment (part 6)

In the step presented in FIG. 8F, the second gate insulating layer 132 is etched to form through holes 132C in order to form a source wired line 15A and a drain wired line 16A. In this case, for example, an etching solution having the same type as the etching solution for subjecting, to wet etching, the active layer 14, or the source electrode 15 and the drain electrode 16 is used.

Figure 8G:
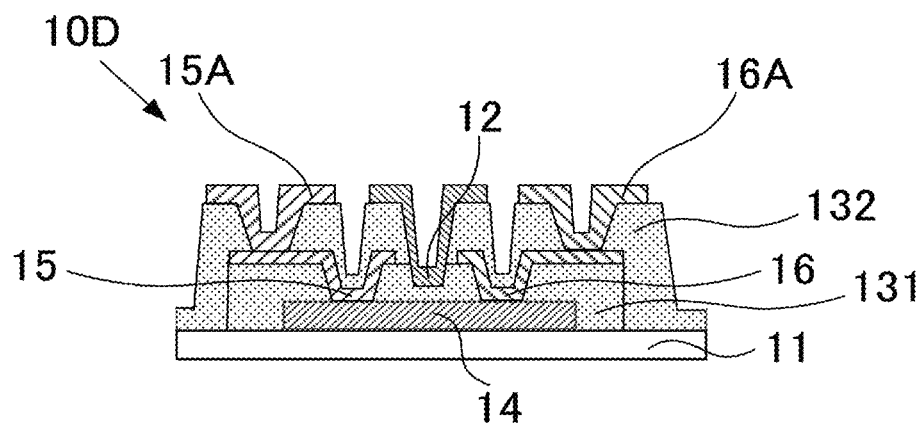
FIG. 8G is a view exemplifying a production step of the field-effect transistor 10D according to an embodiment (part 7)

In the step presented in FIG. 8G, a conductive film to become a gate electrode 12, a source wired line 15A, and a drain wired line 16A is formed over the whole surface on the exposed source electrode 15, the exposed drain electrode 16, and the second gate insulating layer 132. The formed conductive film is patterned through photolithography and wet etching to form the gate electrode 12, the source wired line 15A, and the drain wired line 16A each having a predetermined shape.

In the step presented in FIG. 8G, etching is further performed for the purpose of disconnecting electrical connection between the source wired line 15A and the gate electrode 12, and electrical connection between the drain wired line 16A and the gate electrode 12.

From the above steps, a top gate/top contact field-effect transistor 10D can be produced.

Variation Example of Embodiment (Part 4)

Figure 9:
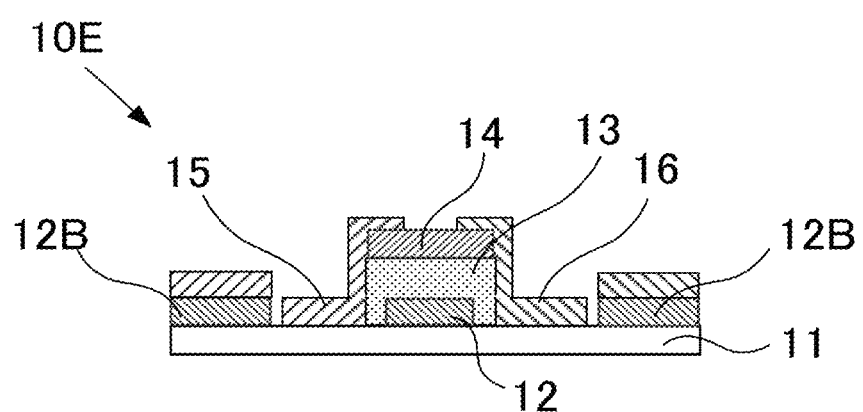
FIG. 9 is a cross-sectional view exemplifying a field-effect transistor 10E according to a variation example of an embodiment.

In a variation example of an embodiment (part 4), FIG. 9 presents an example of a bottom gate/top contact field-effect transistor 10E. In the variation example of the embodiment, the description of the same constituent parts as those that have been previously described in the embodiments is omitted.

In FIG. 9, on the two gate electrode pads 12B, there are cap layers (etching mask layers) of the gate electrode pads 12B, which have the same layers as the source electrode 15 and the drain electrode 16.

Figure 10A:
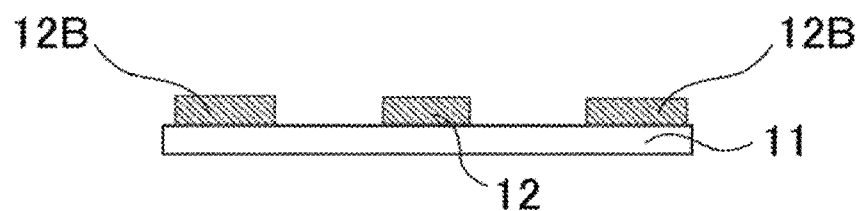
FIG. 10A is a view exemplifying a production step of the field-effect transistor 10E according to an embodiment (part 1)
Figure 10B:
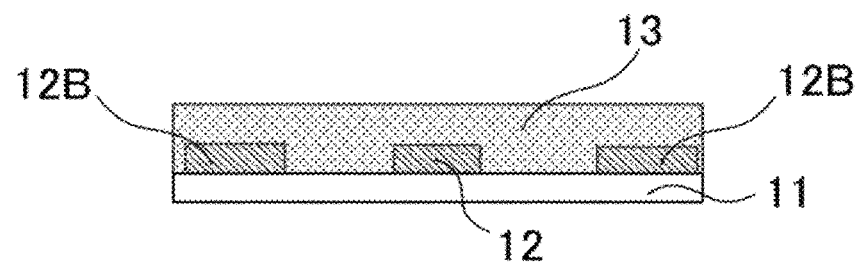
FIG. 10B is a view exemplifying a production step of the field-effect transistor 10E according to an embodiment (part 2)
Figure 10C:
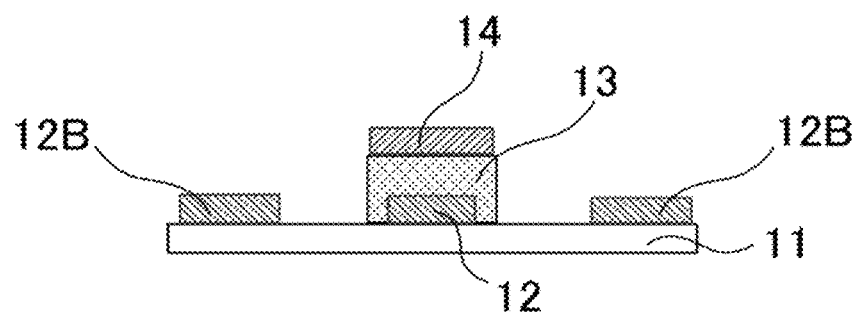
FIG. 10C is a view exemplifying a production step of the field-effect transistor 10E according to an embodiment (part 3)
Figure 10D:
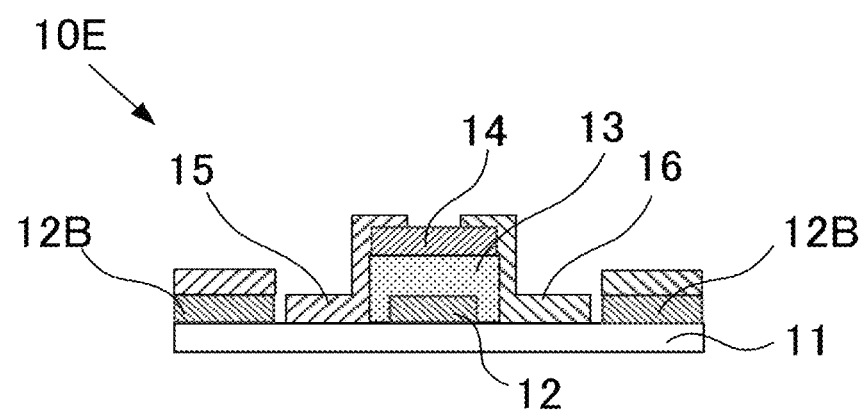
FIG. 10D is a view exemplifying a production step of the field-effect transistor 10E according to an embodiment (part 4)

The field-effect transistor 10E presented in FIG. 9 is produced through, for example, the methods presented in FIG. 10A to FIG. 10D. Note that, when the structure presented in FIG. 10C is produced, a gate insulating layer 13 is etched using an etching solution.

Variation Example of Embodiment (Part 5)

Figure 11:
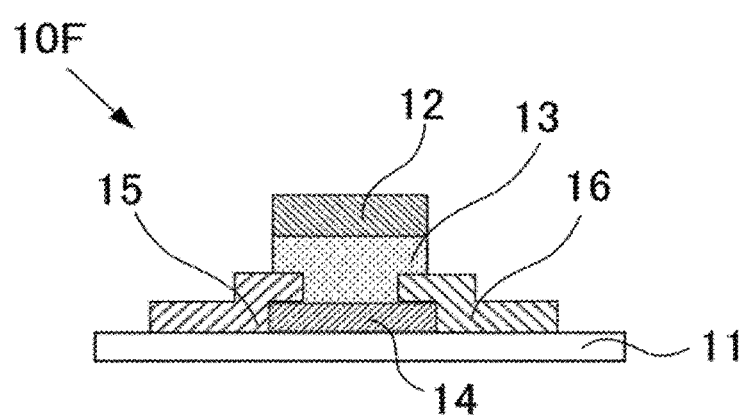
FIG. 11 is a cross-sectional view exemplifying a field-effect transistor 10F according to a variation example of an embodiment.

In a variation example of an embodiment (part 5), FIG. 11 presents an example of a top gate/top contact field-effect transistor 10F. In the variation example of the embodiment, the description of the same constituent parts as those that have been previously described in the embodiments is omitted.

Figure 12A:
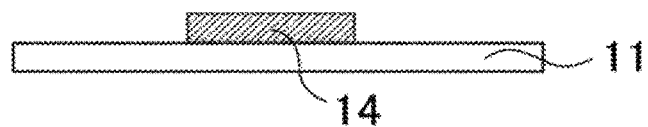
FIG. 12A is a view exemplifying a production step of the field-effect transistor 10F according to an embodiment (part 1)
Figure 12B:
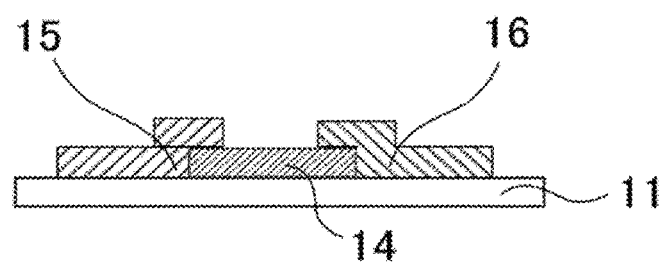
FIG. 12B is a view exemplifying a production step of the field-effect transistor 10F according to an embodiment (part 2)
Figure 12C:
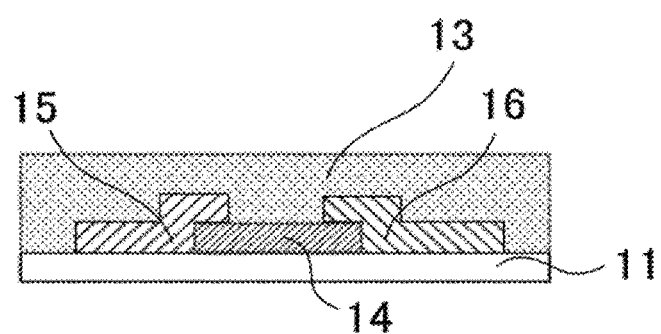
FIG. 12C is a view exemplifying a production step of the field-effect transistor 10F according to an embodiment (part 3)
Figure 12D:
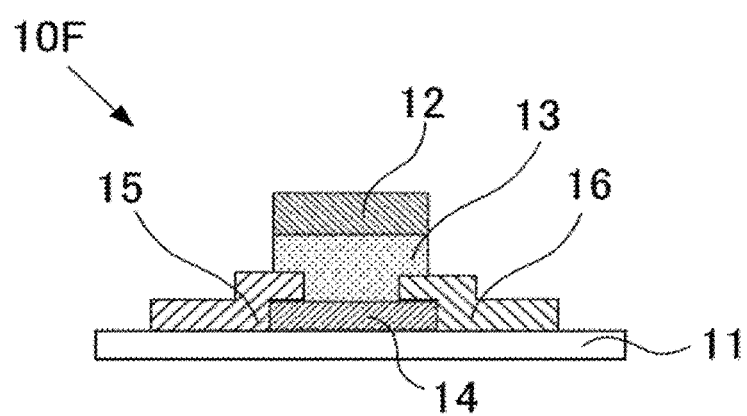
FIG. 12D is a view exemplifying a production step of the field-effect transistor 10F according to an embodiment (part 4)

The field-effect transistor 10F presented in FIG. 11 is produced through, for example, the methods presented in FIG. 12A to FIG. 12D. Note that, when the structure presented in FIG. 12D is produced, a gate insulating layer 13 is etched using an etching solution.

Variation Example of Embodiment (Part 6)

In a variation example of an embodiment (part 6), FIG. 13 presents an example of a top gate/top contact field-effect transistor 10G. In the variation example of the embodiment, the description of the same constituent parts as those that have been previously described in the embodiments is omitted.

Figure 14A:
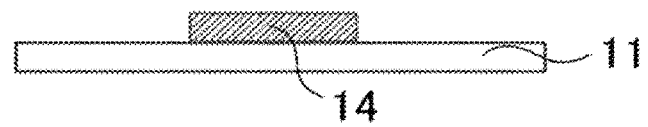
FIG. 14A is a view exemplifying a production step of the field-effect transistor 10G according to an embodiment (part 1)
Figure 14B:
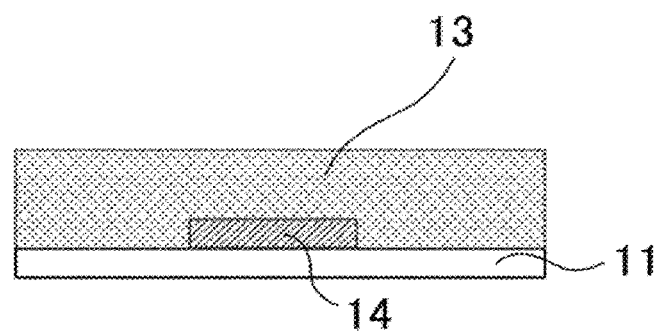
FIG. 14B is a view exemplifying a production step of the field-effect transistor 10G according to an embodiment (part 2)
Figure 14C:
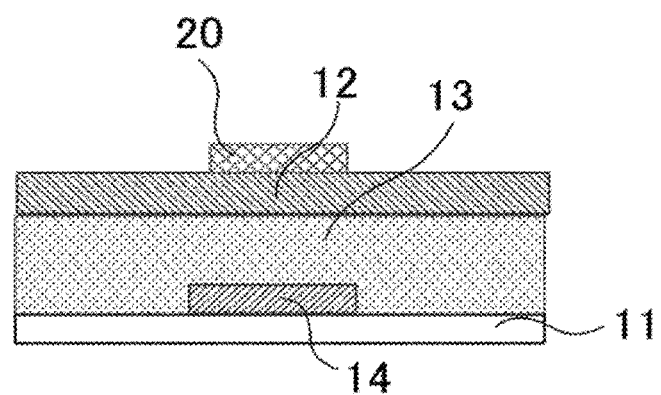
FIG. 14C is a view exemplifying a production step of the field-effect transistor 10G according to an embodiment (part 3)
Figure 14D:
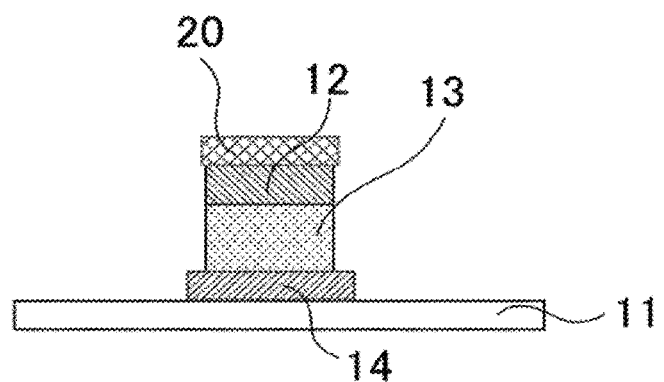
FIG. 14D is a view exemplifying a production step of the field-effect transistor 10G according to an embodiment (part 4)
Figure 14E:
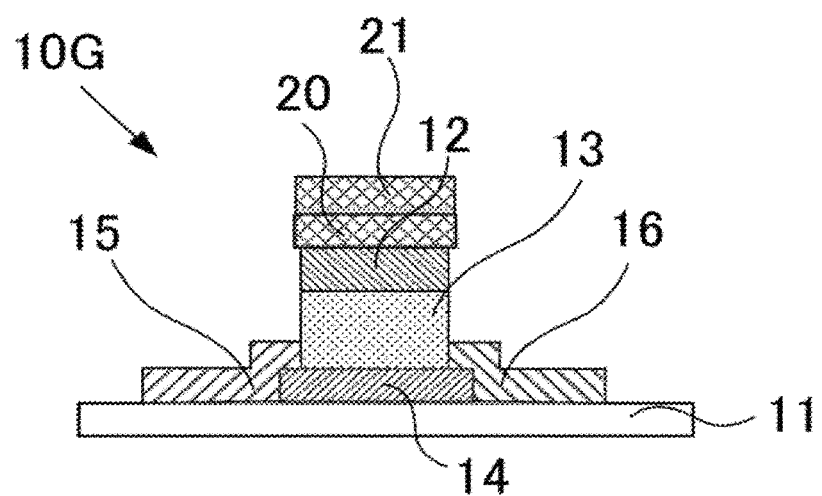
FIG. 14E is a view exemplifying a production step of the field-effect transistor 10G according to an embodiment (part 5)

The field-effect transistor 10G presented in FIG. 13 is produced through, for example, the methods presented in FIG. 14A to FIG. 14E. Note that, when the structure presented in FIG. 14E is produced, a gate insulating layer 13 is etched using an etching solution. In FIG. 13 and FIG. 14E, a reference numeral 20 denotes a first cap layer of the gate electrode 12 having a conductivity, and a reference numeral 21 denotes a second cap layer of the gate electrode 12 having the same layer as the source electrode 15 and the drain electrode 16.

Variation Example of Embodiment (Part 7)

Figure 15:
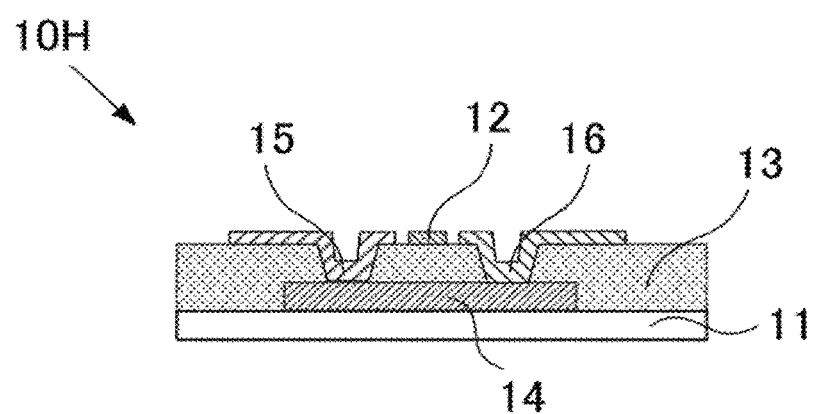
FIG. 15 is a cross-sectional view exemplifying a field-effect transistor 10H according to a variation example of an embodiment.

In a variation example of an embodiment (part 7), FIG. 15 presents an example of a top gate/top contact field-effect transistor 10H. In the variation example of the embodiment, the description of the same constituent parts as those that have been previously described in the embodiments is omitted.

Figure 16A:
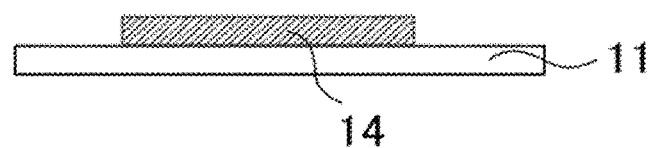
FIG. 16A is a view exemplifying a production step of the field-effect transistor 10H according to an embodiment (part 1)
Figure 16B:
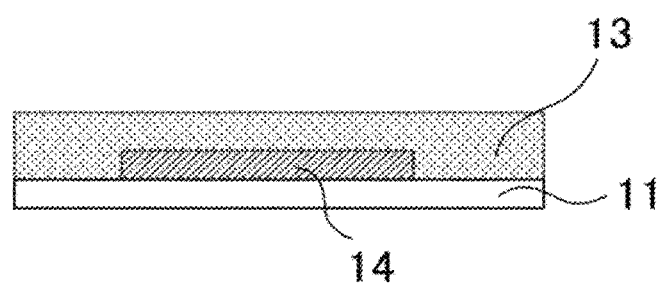
FIG. 16B is a view exemplifying a production step of the field-effect transistor 10H according to an embodiment (part 2)
Figure 16C:
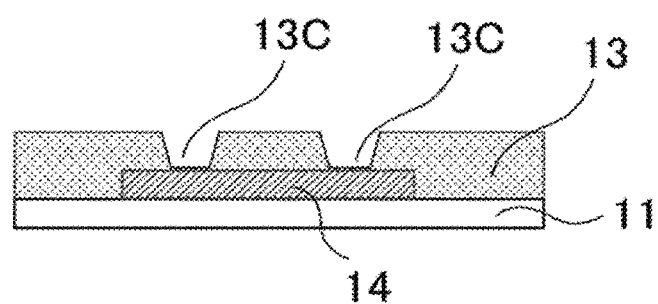
FIG. 16C is a view exemplifying a production step of the field-effect transistor 10H according to an embodiment (part 3)
Figure 16D:
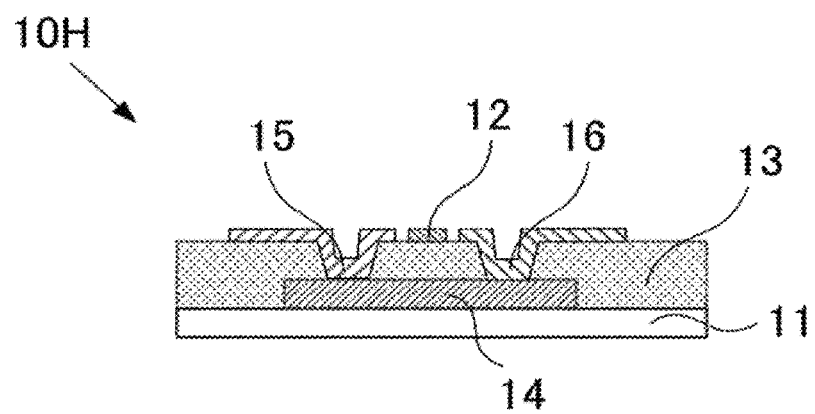
FIG. 16D is a view exemplifying a production step of the field-effect transistor 10H according to an embodiment (part 4)

The field-effect transistor 10H presented in FIG. 15 is produced through, for example, the methods presented in FIG. 16A to FIG. 16D. Note that, when the structure presented in FIG. 16D is produced, a gate insulating layer 13 is etched using an etching solution in order to form through holes 13C.

Variation Example of Embodiment (Part 8)

Figure 17:
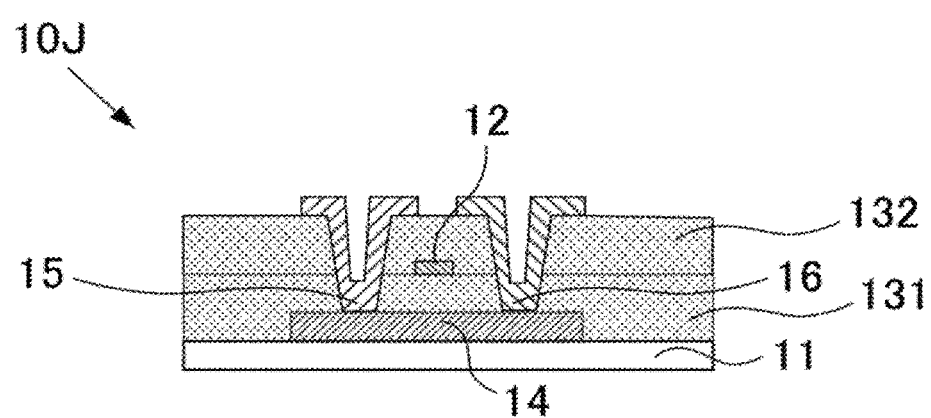
FIG. 17 is a cross-sectional view exemplifying a field-effect transistor 10J according to a variation example of an embodiment.

In a variation example of an embodiment (part 8), FIG. 17 presents an example of a top gate/top contact field-effect transistor 10J. In the variation example of the embodiment, the description of the same constituent parts as those that have been previously described in the embodiments is omitted.

Figure 18A:
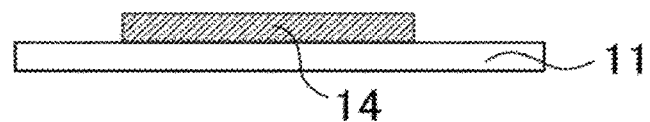
FIG. 18A is a view exemplifying a production step of the field-effect transistor 10J according to an embodiment (part 1)
Figure 18B:
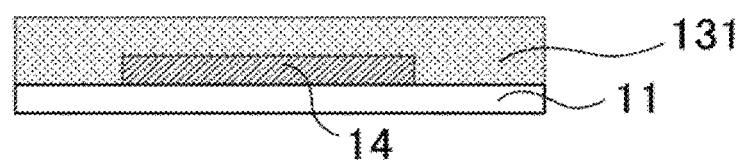
FIG. 18B is a view exemplifying a production step of the field-effect transistor 10J according to an embodiment (part 2)
Figure 18C:
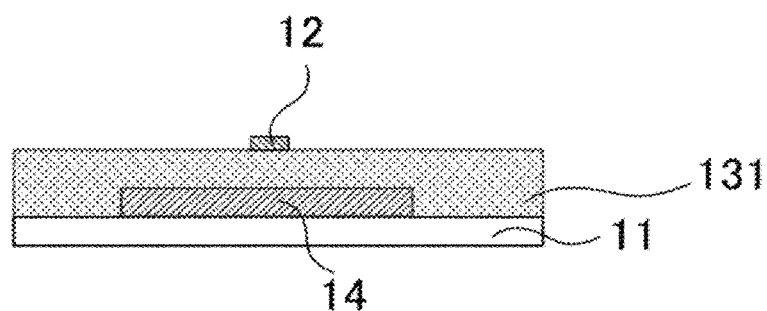
FIG. 18C is a view exemplifying a production step of the field-effect transistor 10J according to an embodiment (part 3)
Figure 18D:
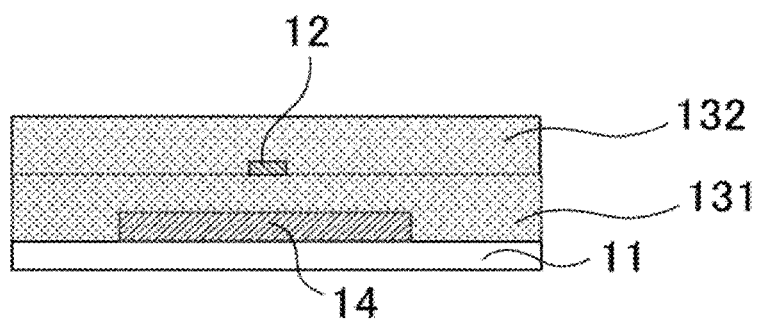
FIG. 18D is a view exemplifying a production step of the field-effect transistor 10J according to an embodiment (part 4)
Figure 18E:
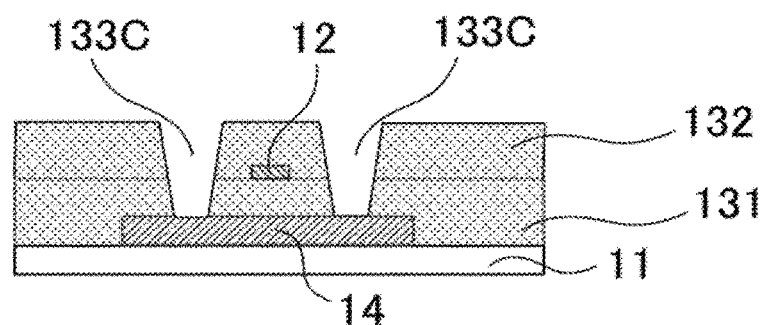
FIG. 18E is a view exemplifying a production step of the field-effect transistor 10J according to an embodiment (part 5)
Figure 18F:
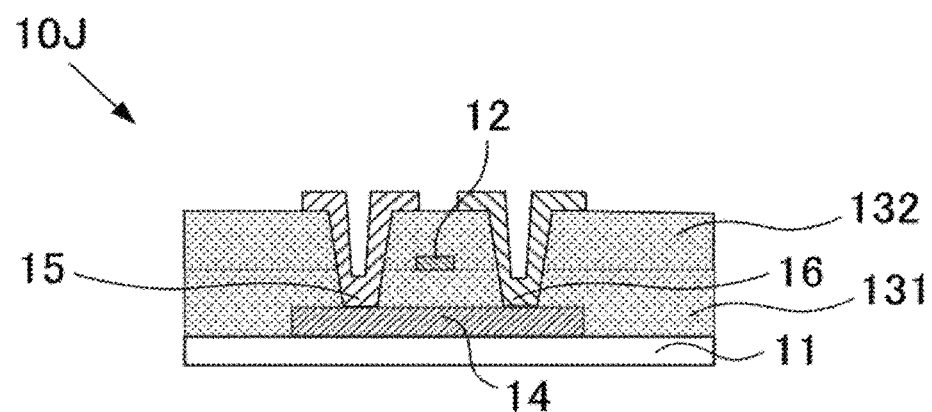
FIG. 18F is a view exemplifying a production step of the field-effect transistor 10J according to an embodiment (part 6)

The field-effect transistor 10J presented in FIG. 17 is produced through, for example, the methods presented in FIG. 18A to FIG. 18F. Note that, when the structure presented in FIG. 18E is produced, a first gate insulating layer 131 and a second gate insulating layer 132 are etched using an etching solution in order to produce through holes 133C.

Variation Example of Embodiment (Part 9)

Figure 19:
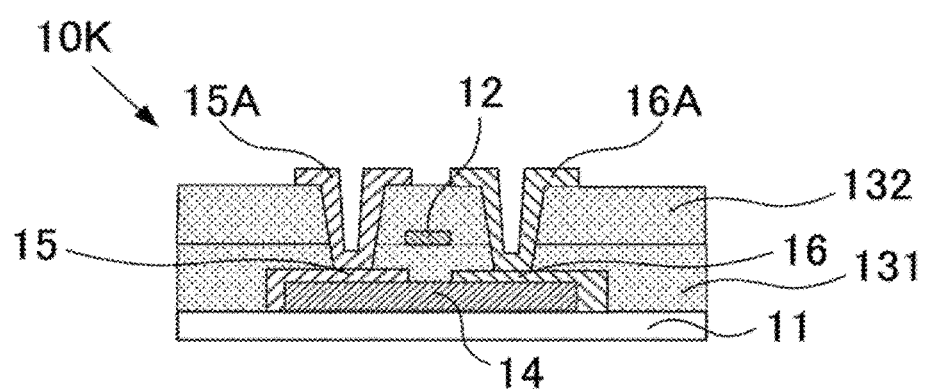
FIG. 19 is a cross-sectional view exemplifying a field-effect transistor 10K according to a variation example of an embodiment.

In a variation example of an embodiment (part 9), FIG. 19 presents an example of a top gate/top contact field-effect transistor 10K. In the variation example of the embodiment, the description of the same constituent parts as those that have been previously described in the embodiments is omitted.

Figure 20A:
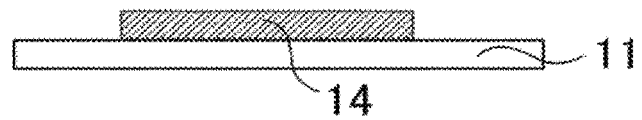
FIG. 20A is a view exemplifying a production step of the field-effect transistor 10K according to an embodiment (part 1)
Figure 20B:
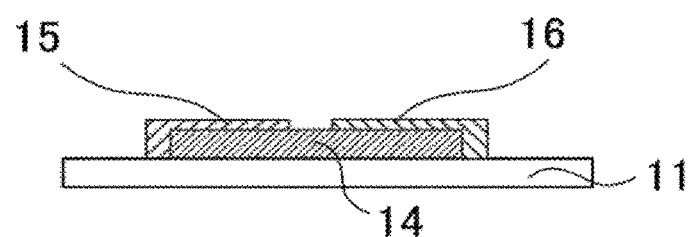
FIG. 20B is a view exemplifying a production step of the field-effect transistor 10K according to an embodiment (part 2)
Figure 20C:
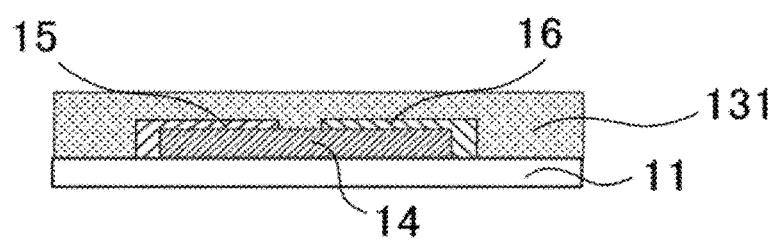
FIG. 20C is a view exemplifying a production step of the field-effect transistor 10K according to an embodiment (part 3)
Figure 20D:
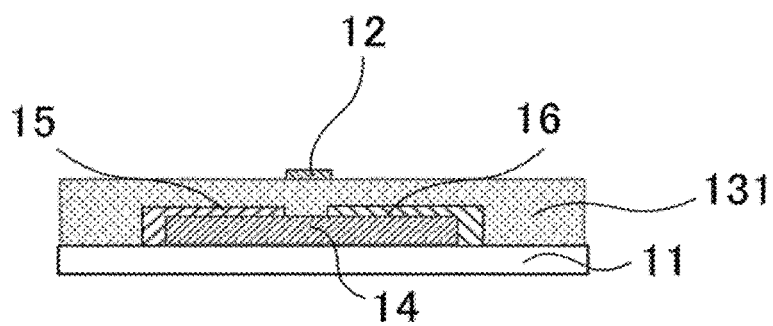
FIG. 20D is a view exemplifying a production step of the field-effect transistor 10K according to an embodiment (part 4)
Figure 20E:
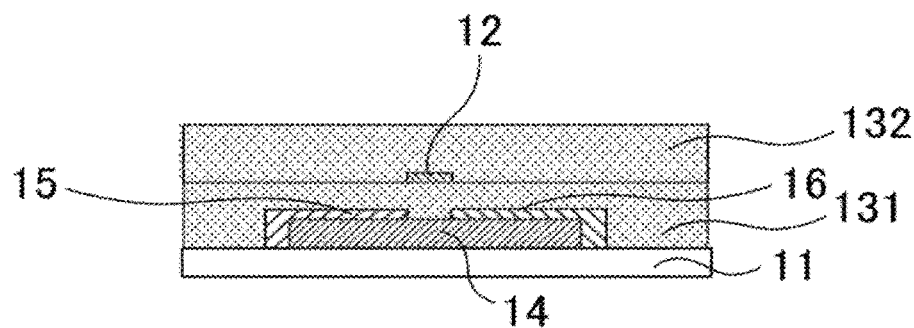
FIG. 20E is a view exemplifying a production step of the field-effect transistor 10K according to an embodiment (part 5)
Figure 20F:
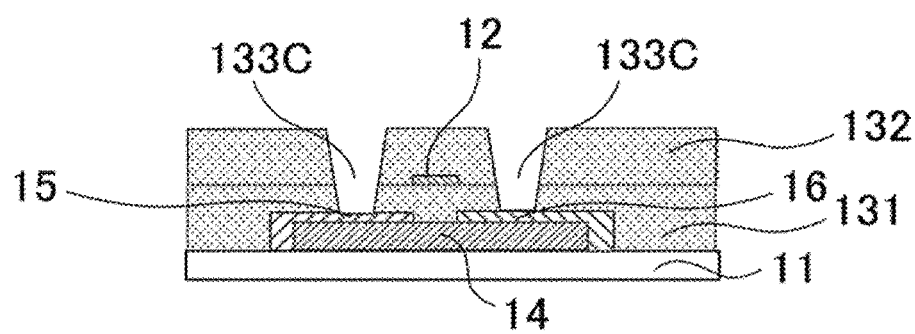
FIG. 20F is a view exemplifying a production step of the field-effect transistor 10K according to an embodiment (part 6)
Figure 20G:
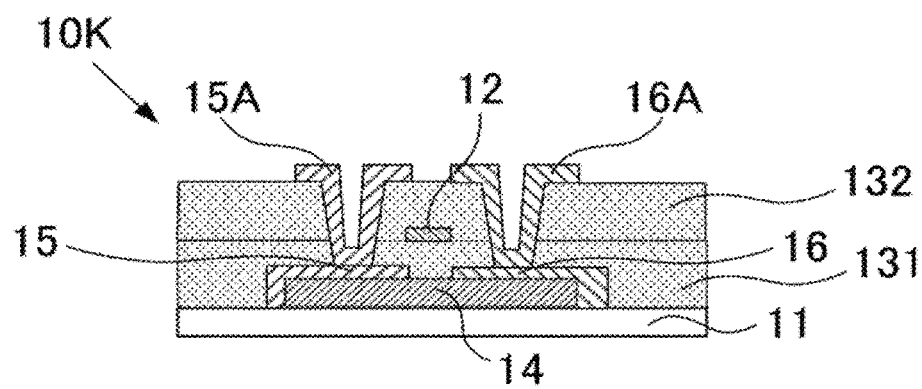
FIG. 20G is a view exemplifying a production step of the field-effect transistor 10K according to an embodiment (part 7)

The field-effect transistor 10K presented in FIG. 19 is produced through, for example, the methods presented in FIG. 20A to FIG. 20G. Note that, when the structure presented in FIG. 20F is produced, a first gate insulating layer 131 and a second gate insulating layer 132 are etched using an etching solution in order to produce through holes 133C.

The layer structure of the field-effect transistor according to the present disclosure is not particularly limited and the structures presented in FIGS. 1, 3, 5, 7, 9, 11, 13, 15, 17, and 19 can be appropriately selected depending on the intended purpose.

In another embodiment, examples of a display element, an image display device, and a system using the field-effect transistor according to the embodiment are presented. Note that, in this embodiment, the description of the same constituent parts as those that have been previously described in the embodiments may be omitted in some cases.

(Display Element)

A display element according to another embodiment includes at least a light control element and a driving circuit configured to drive the light control element, and further includes other components if necessary.

The light control element is not particularly limited and may be appropriately selected depending on the intended purpose, so long as the light control element is an element configured to control light output according to a driving signal. Examples of the light control element include electroluminescent (EL) elements, electrochromic (EC) elements, liquid crystal elements, electrophoretic elements, and electrowetting elements.

The driving circuit is not particularly limited and may be appropriately selected depending on the intended purpose, so long as the driving circuit includes the field-effect transistor according to the embodiment. The other components are not particularly limited and may be appropriately selected depending on the intended purpose.

The display element according to another embodiment includes the field-effect transistor according to the embodiment. Therefore, the gate insulating layer 13 has a favorable insulation property, making it possible to obtain favorable electrical characteristics. As a result, display with high quality can be achieved.

(Image Display Device)

An image display device according to another embodiment includes at least a plurality of display elements according to another embodiment, a plurality of wired lines, and a display control device, and further includes other components if necessary.

The plurality of display elements are not particularly limited and may be appropriately selected depending on the intended purpose, so long as the plurality of display elements are a plurality of display elements arranged in a form of matrix according to another embodiment.

The plurality of wired lines are not particularly limited and may be appropriately selected depending on the intended purpose, so long as the plurality of wired lines can individually apply gate voltage and image data signal to the field-effect transistors in the plurality of display elements.

The display control device is not particularly limited and may be appropriately selected depending on the intended purpose, so long as the display control device can individually control the gate voltage and the signal voltage of the field-effect transistors via the plurality of wired lines correspondingly to the image data.

The other components are not particularly limited and may be appropriately selected depending on the intended purpose.

The image display device according to another embodiment includes a display element including the field-effect transistor according to the embodiment, thus an image with high quality can be displayed.

(System)

A system according to another embodiment includes at least the image display device according to another embodiment and an image-data-generating device.

The image-data-generating device generates image data based on image information to be displayed and to output the image data to the image display device.

The system includes the image display device according to another embodiment, and thus image information can be displayed with high definition.

Hereinafter, the display element, the image display device, and the system according to another embodiment will be specifically described.

Figure 21:
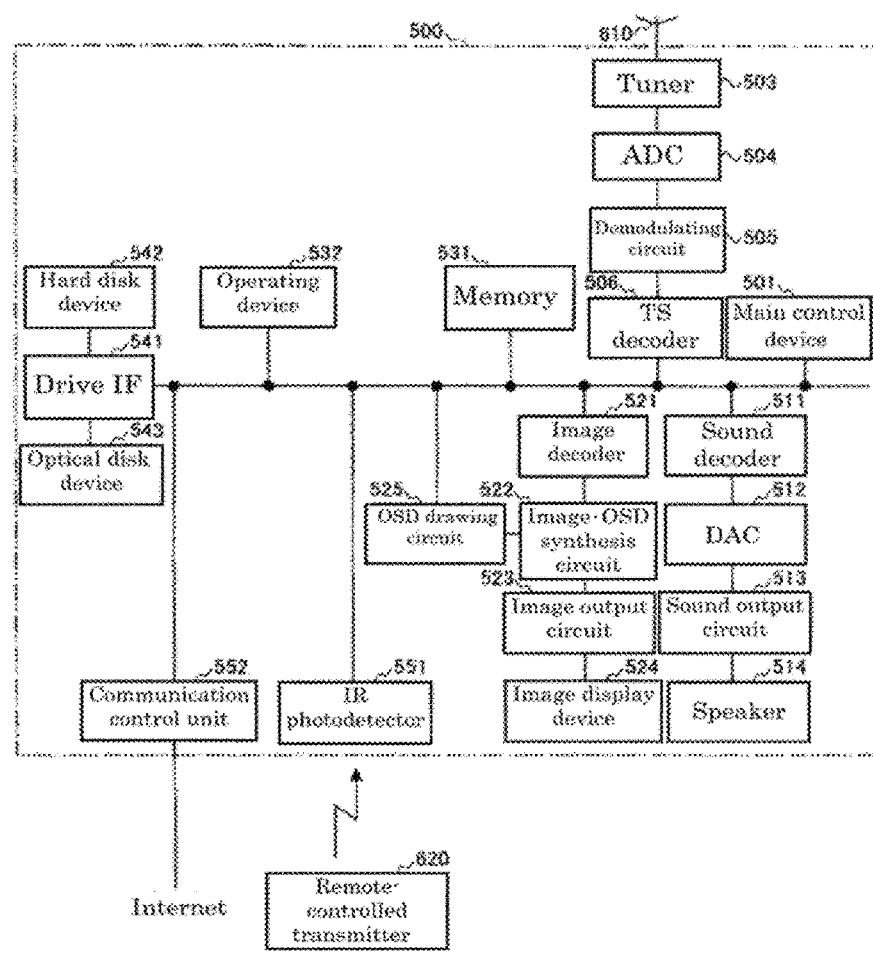
FIG. 21 is a block diagram of configuration of a television device in another embodiment.

FIG. 21 presents a schematic configuration of a television device 500 as a system according to another embodiment. Note that, connection lines in FIG. 21 present flow of representative signal or information, and do not present all the connection relationships between blocks.

A television device 500 according to another embodiment includes, for example, a main control device 501, a timer 503, an AI) converter (ADC) 504, a demodulating circuit 505, a transport stream (TS) decoder 506, a sound decoder 511, a DA converter (DAC) 512, a sound output circuit 513, a speaker 514, an image decoder 521, an image-OSD synthesis circuit 522, an image output circuit 523, an image display device 524, an OSD drawing circuit 525, a memory 531, an operating device 532, a drive interface (drive IF) 541, a hard disk device 542, an optical disk device 543, an IR photodetector 551, and a communication control unit 552.

The main control device 501 is configured to control the entirety of the television device 500 and includes, for example, a CPU, a flash ROM, and a RAM. The flash ROM stores: for example, a program written with a code that can be decoded with the CPU; and various data used in processing with the CPU. Also, the RAM is a memory for operation.

The tuner 503 is configured to select a pre-set channel from the broadcast waves received by an antenna 610. The ADC 504 is configured to convert the output signal (analog information) of the tuner 503 into digital information. The demodulating circuit 505 is configured to demodulate the digital information from the ADC 504.

The TS decoder 506 is configured to TS decode the output signal of the demodulating circuit 505 to separate the output signal into sound information and image information. The sound decoder 511 is configured to decode the sound information from the TS decoder 506. The DA converter (DAC) 512 is configured to convert the output signal of the sound decoder 511 into an analog signal.

The sound output circuit 513 is configured to output the output signal of the DA converter (DAC) 512 to the speaker 514. The image decoder 521 is configured to decode the image information from the TS decoder 506. The image-OSD synthesis circuit 522 is configured to synthesize an output signal of the image decoder 521 and an output signal of the OSD drawing circuit 525.

The image output circuit 523 is configured to output the output signal of the image-OSD synthesis circuit 522 to the image display device 524. The OSD drawing circuit 525 includes a character generator configured to display characters or graphics on a screen of the image display device 524. The OSD drawing circuit 525 is configured to generate a signal including display information according to the instructions from the operating device 532 and the IR photodetector 551.

The memory 531 is configured to temporarily store audio-visual (AV) data. The operating device 532 includes an input medium (not illustrated) such as a control panel. The operating device 532 is configured to inform various information input by a user to the main control device 501. The drive IF 541 is an interactive communication interface. One example of the drive IF 541 is according to AT attachment packet interface (ATAPI).

The hard disk device 542 includes, for example, a hard disk and a driving device configured to drive the hard disk. The driving device is configured to record data on the hard disk and reproduce the data recorded on the hard disk. The optical disk device 543 is configured to record data on an optical disk (e.g., a DVD) and reproduce the data recorded on the optical disk.

The IR photodetector 551 is configured to receive a photosignal from a remote-controlled transmitter 620 and inform the received photosignal to the main control device 501. The communication control unit 552 is configured to control communication with the Internet. Various kinds of information can be obtained via the Internet.

Figure 22:
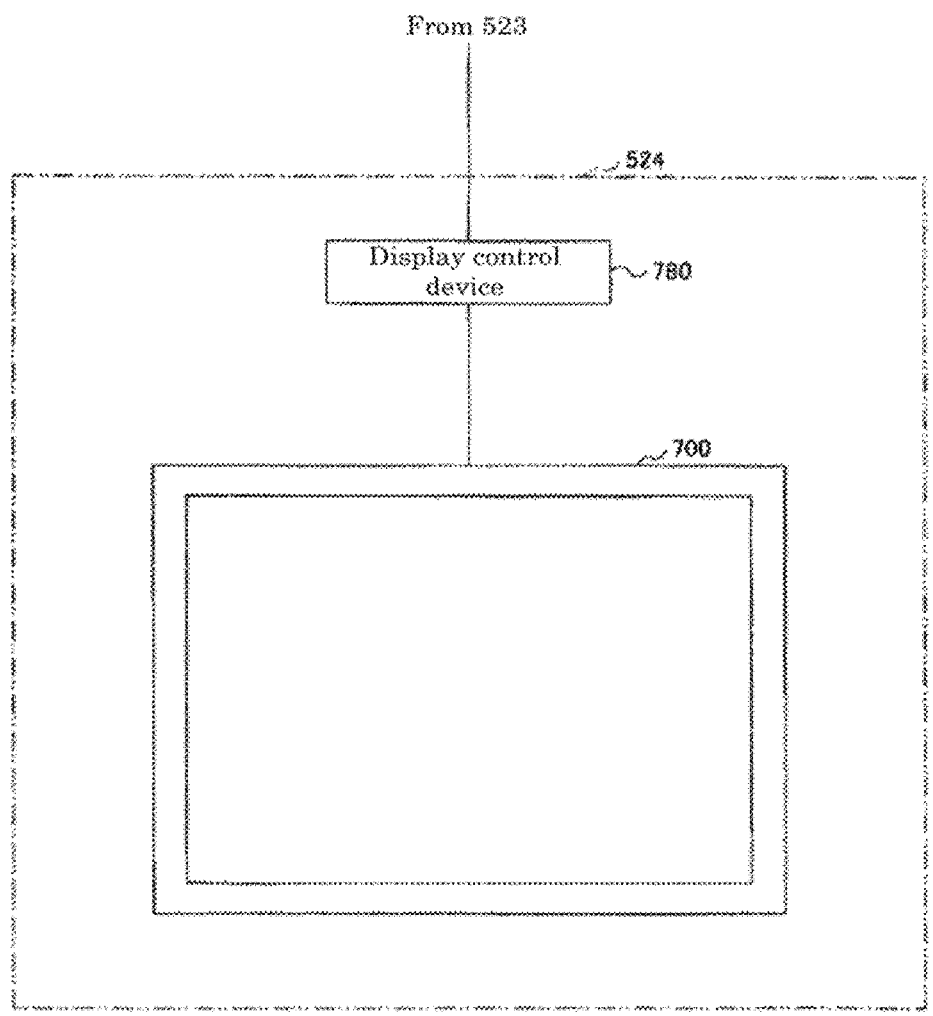
FIG. 22 is an explanatory diagram (1) of a television device in another embodiment.
Figure 23:
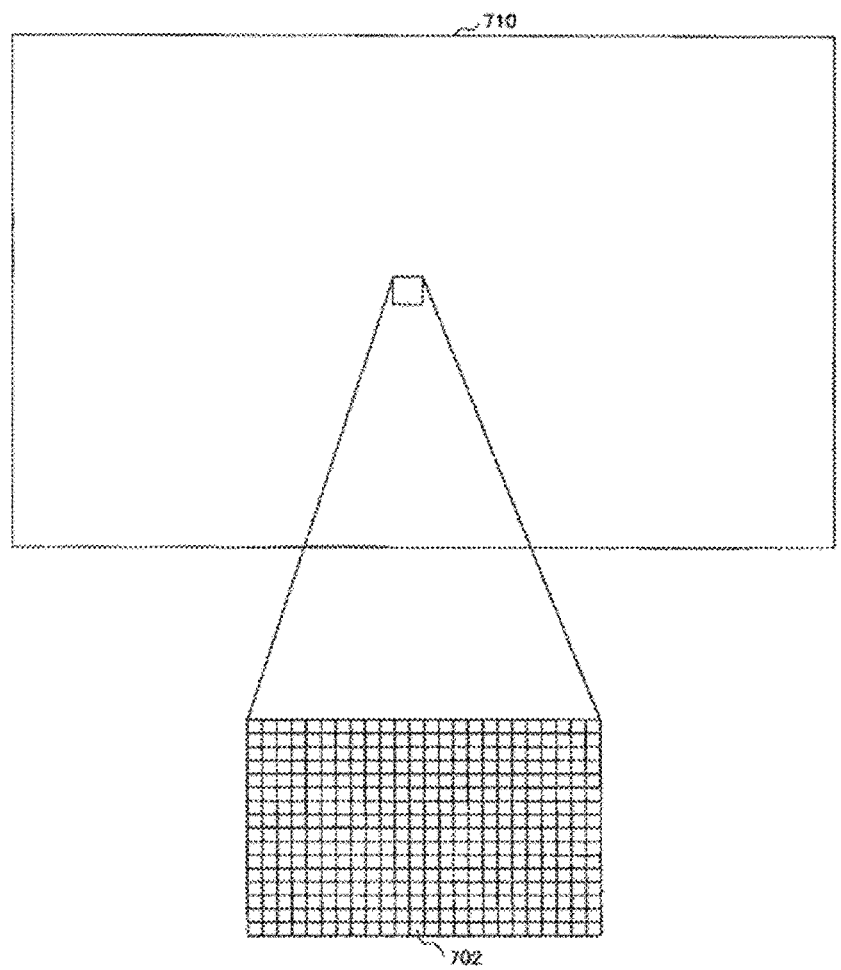
FIG. 23 is an explanatory diagram (2) of a television device in another embodiment.

As presented in FIG. 22 as one example, the image display device 524 includes a display unit 700 and a display control device 780. As presented in FIG. 23 as one example, the display unit 700 includes a display 710 in which a plurality of display elements 702 are arranged in a form of matrix (the number "n"×the number "m" herein).

Figure 24:
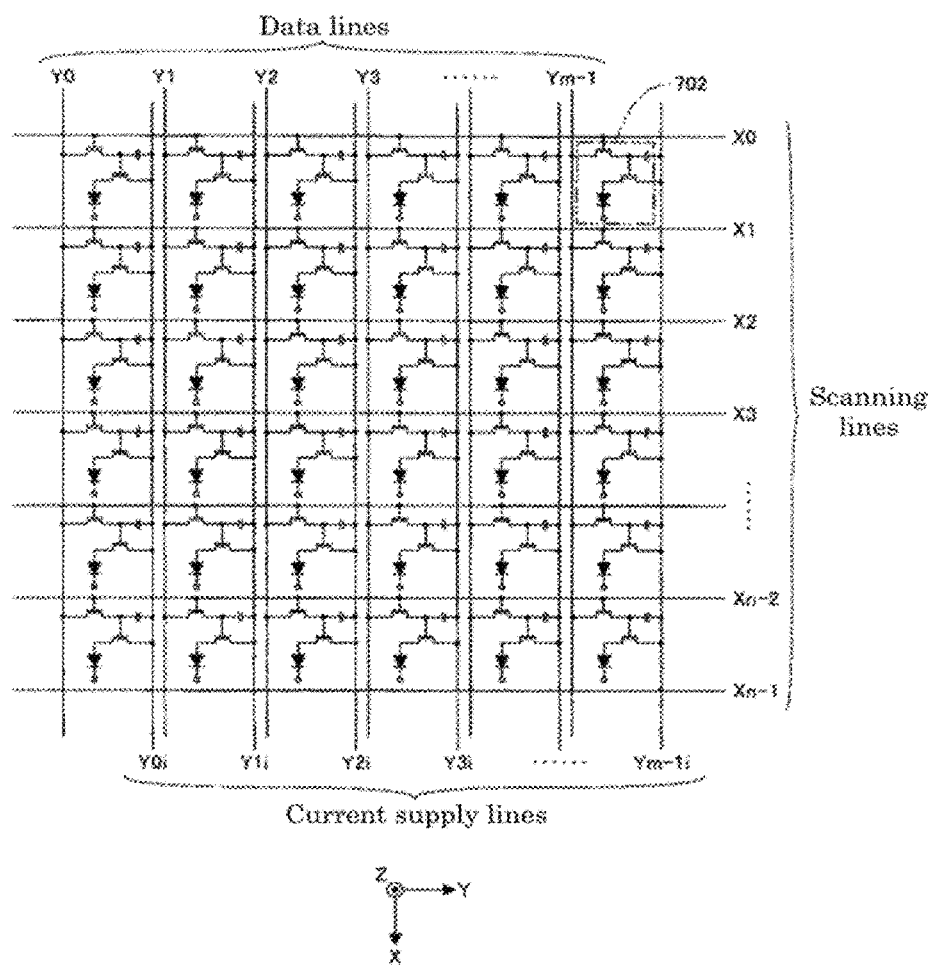
FIG. 24 is an explanatory diagram (3) of a television device in another embodiment.

As presented in FIG. 24 as one example, the display 710 includes "n" scanning lines (X0, X1, X2, X3, . . . Xn−2, Xn−1) arranged along the X axis direction at constant intervals, "m" data lines (Y0, Y1, Y2, Y3, . . . Ym−1) arranged along the Y axis direction at constant intervals, and "m" current supply lines (Y0$i$, Y1$i$, Y2$i$, Y3$i$, . . . Ym−1$i$) arranged along the Y axis direction at constant intervals.

Each of the display elements 702 can be identified by each of the scanning lines and each of the data lines.

Figure 25:
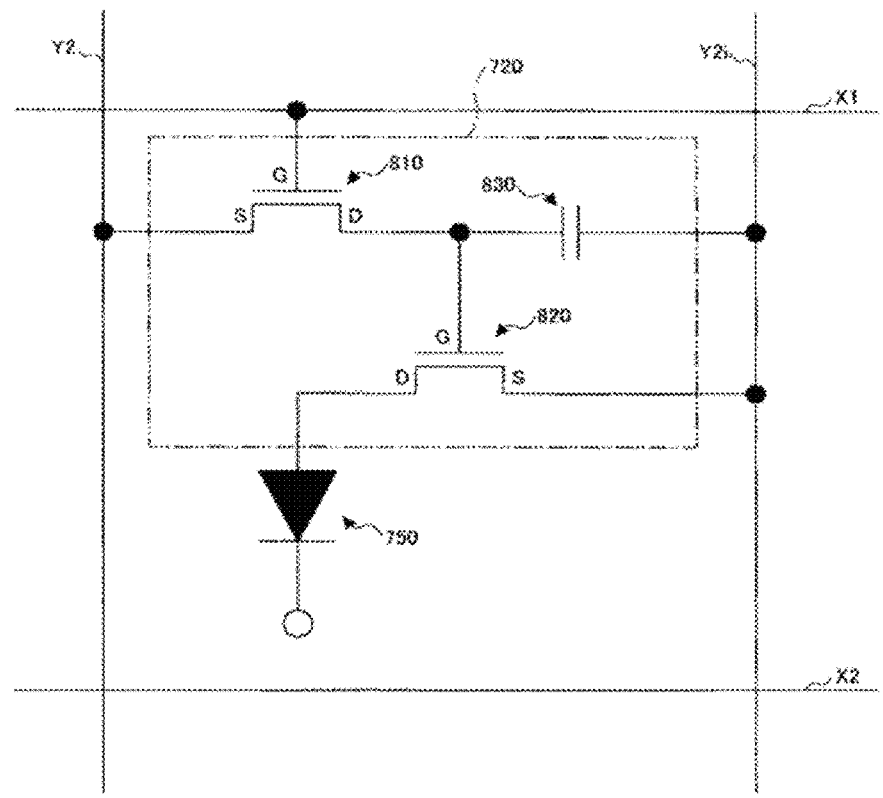
FIG. 25 is an explanatory view of a display element in another embodiment.

As presented in FIG. 25 as one example, each display element 702 includes an organic electroluminescent (EL) element 750 and a drive circuit 720 configured to allow the organic EL element 750 to emit light. Specifically, the display 710 is an organic EL display of a so-called active matrix system. The display 710 is a 32-inch color display. Note that, a size of the display is not limited to this size.

Figure 26:
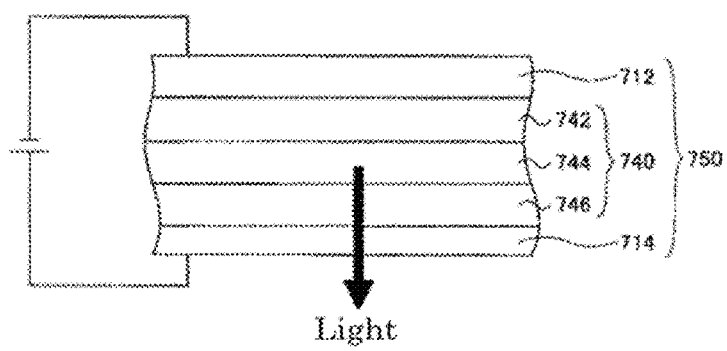
FIG. 26 is an explanatory view of an organic EL in another embodiment.

As presented in FIG. 26 as one example, the organic EL element 750 includes an organic EL thin film layer 740, a cathode 712, and an anode 714.

The organic EL element 750 can be arranged, for example, beside a field-effect transistor. In this case, the organic EL element 750 and the field-effect transistor can be formed on the same substrate. However, arrangement of the organic EL element 750 and the field-effect transistor is not limited to the above arrangement. For example, the organic EL element 750 may be disposed on the field-effect transistor. In this case, the gate electrode is required to have transparency. Therefore, a conductive transparent oxide (e.g., ITO (Indium Tin Oxide), $In_2O_3$, $SnO_2$, ZnO, Ga-doped ZnO, Al-doped ZnO, and Sb-doped $SnO_2$) is used for the gate electrode.

In the organic EL element 750, Al is used in the cathode 712. Note that, a Mg—Ag alloy, an Al—Li alloy, ITO, or the like may be used. ITO is used in the anode 714. An oxide having a conductivity such as $In_2O_3$, $SnO_2$, or ZnO and an Ag—Nd alloy may be used.

The organic EL thin film layer 740 includes an electron transporting layer 742, a light emitting layer 744, and a hole transporting layer 746. The electron transporting layer 742 is coupled to a cathode 712, and the hole transporting layer 746 is coupled to an anode 714. The light emitting layer 744 emits light when a predetermined voltage is applied between the anode 714 and the cathode 712.

As presented in FIG. 25, the drive circuit 720 includes two field-effect transistors 810 and 820 and a capacitor 830. The field-effect transistor 810 operates as a switching element. A gate electrode G is coupled to a predetermined scanning line and a source electrode S is coupled to a predetermined data line. Moreover, a drain electrode D is coupled to one terminal of the capacitor 830.

The capacitor 830 is configured to memorize the state of the field-effect transistor 810; i.e., data. The other terminal of the capacitor 830 is coupled to a predetermined current supply line.

The field-effect transistor 820 is configured to supply large electric current to the organic EL element 750. A gate electrode G is coupled to a drain electrode D of the field-effect transistor 810. A drain electrode D is coupled to an anode 714 of the organic EL element 750 and a source electrode S is coupled to a predetermined current supply line.

When the field-effect transistor 810 turns into the state of "on", the organic EL element 750 is driven by the field-effect transistor 820.

Figure 27:
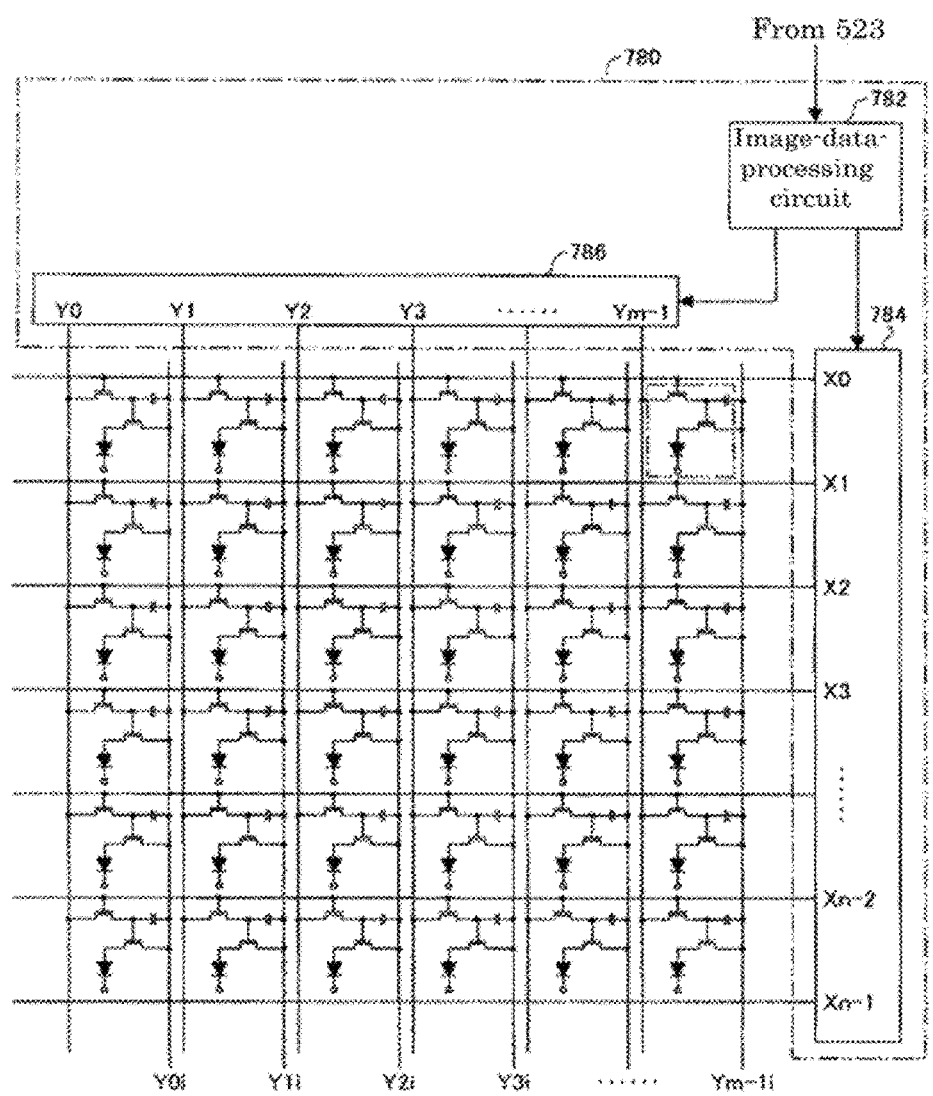
FIG. 27 is an explanatory diagram (4) of a television device in another embodiment.

As presented in FIG. 27 as one example, the display control device 780 includes an image-data-processing circuit 782, a scanning-line-driving circuit 784, and a data-line-driving circuit 786.

The image-data-processing circuit 782 determines brightness of a plurality of display elements 702 in the display 710 based on output signals of the image output circuit 523. The scanning-line-driving circuit 784 individually applies voltage to "n" scanning lines according to the instructions of the image-data-processing circuit 782. The data-line-driving circuit 786 individually applies voltage to "m" data lines according to the instructions of the image-data-processing circuit 782.

As is clear from the above description, in a television device 500 according to an embodiment of the present disclosure, an image decoder 521, an image-OSD synthesis circuit 522, an image output circuit 523, and an OSD drawing circuit 525 constitute the image-data-generating device.

In the above, the case where the light control element is an organic EL element has been described. However, the light control element is not limited thereto, and may be a liquid crystal element, an electrochromic element, an electrophoretic element, and an electrowetting element.

Figure 28:
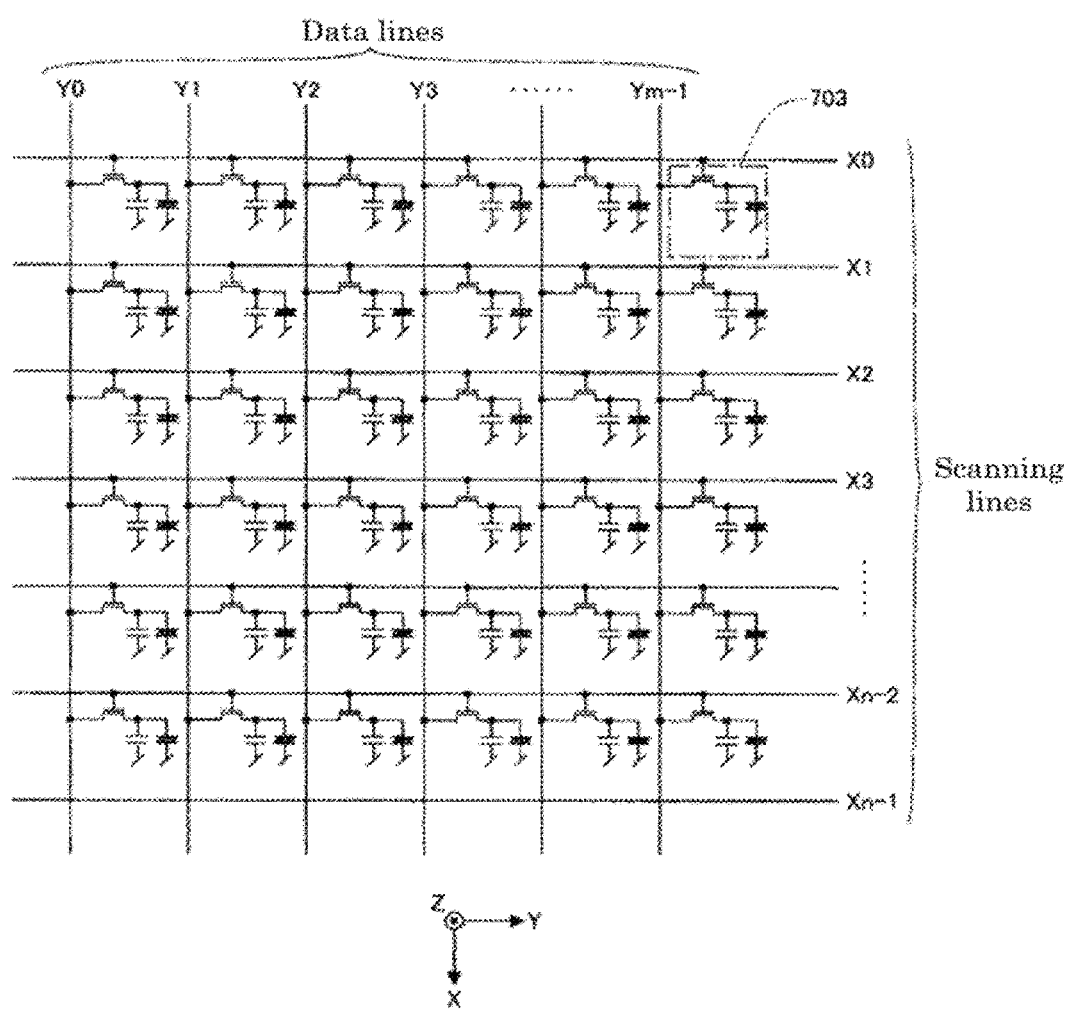
FIG. 28 is an explanatory diagram (1) of another display element in another embodiment.

For example, when the light control element is a liquid crystal element, a liquid crystal display is used as the display 710. In this case, as presented in FIG. 28, it is not necessary to provide a current supply line for the display element 703.

Figure 29:
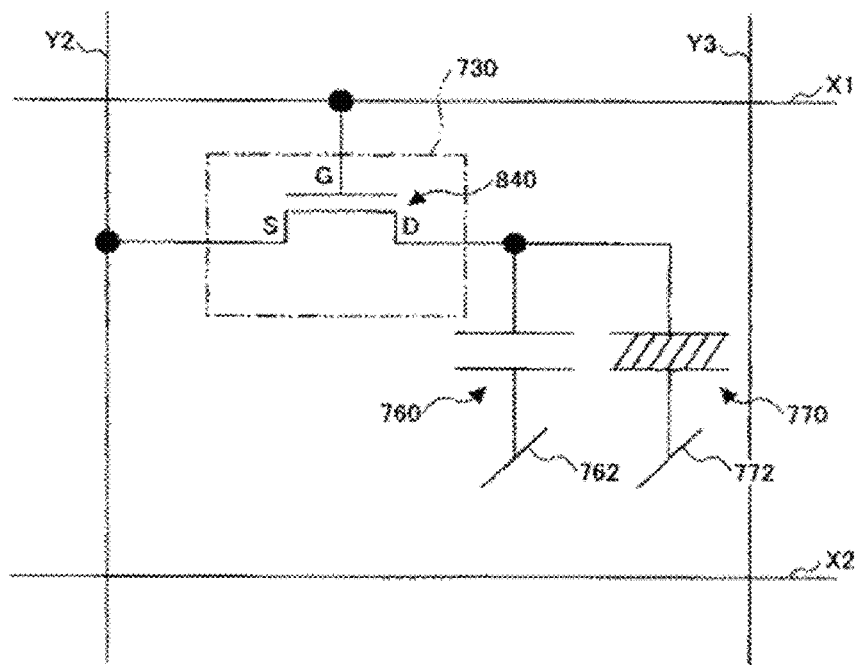
FIG. 29 is an explanatory diagram (2) of another display element in another embodiment.

In this case, as presented in FIG. 29 as one example, the drive circuit 730 can be constituted with one field-effect transistor 840, which is similar to each of the field-effect transistors (810 and 820) presented in FIG. 25. In the field-effect transistor 840, a gate electrode G is coupled to a predetermined scanning line and a source electrode S is coupled to a predetermined data line. Moreover, a drain electrode D is coupled to a pixel electrode of a liquid crystal element 770 and a capacitor 760. In FIG. 29, the reference numeral 762 denotes a counter electrode (common electrode) of the capacitor 760 and the reference numeral 772 denotes a counter electrode (common electrode) of the liquid crystal element 770.

In the above embodiment, the case where the system is a television device has been described. However, the system is not limited thereto. That is, the system is not particularly limited so long as it includes the image display device 524 as a device configured to display images and information. For example, the system may be a computer system in which a computer (including a personal computer) is coupled to the image display device 524.

The image display device 524 can be used as a display unit in mobile information devices (e.g., mobile phones, portable music players, portable video players, electronic books, and personal digital assistants (PDAs)) and camera devices (e.g., still cameras and video cameras). Moreover, the image display device 524 can be used as a display unit for various pieces of information in transportation systems (e.g., cars, aircraft, trains, and ships). Furthermore, the image display device 524 can be used as a display unit for various pieces of information in measuring devices, analysis devices, medical equipment, and advertising media.

As described above, preferable embodiments and the like have been described in detail. However, the present disclosure is not limited to the aforementioned embodiments, and various modifications and substitutions can be added to the aforementioned embodiments without departing from the scope described in the claims.

EXAMPLES

Examples of the present disclosure will be described hereinafter. However, the present disclosure should not be construed as being limited to these Examples.

Example 1

In Example 1, a bottom gate/top contact field-effect transistor presented in FIG. 1 was produced.

<Formation of Gate Electrode>

A Ti film was formed on a substrate 11 so as to have a thickness of 100 nm through the sputtering method. On the formed Ti film, resist patterns were formed through photolithography and etching was performed through dry etching to form a gate electrode 12 and gate electrode pads 12B each having a predetermined shape (FIG. 2A).

<Formation of Gate Insulating Layer>

—Preparation of Coating Liquid for Forming Gate Insulating Layer—

Bismuth 2-ethylhexanoate 2-ethylhexanoic acid solution (Bi: 25% by mass) and hafnium 2-ethylhexanoate 2-ethylhexanoic acid solution (Hf: 24% by mass) were provided and weighed so that amounts of the respective metal elements were 60 mmol and 40 mmol. Then, they were mixed in a flask. Furthermore, 2-ethylhexanoic acid (octylic acid) was added to the resultant so that the total amount of the solvent was 1,000 mL in total, and was dissolved through mixing at room temperature to prepare a coating liquid for forming gate insulating layer 1-1.

The coating liquid for forming gate insulating layer 1-1 (0.6 mL) was added dropwise onto the gate electrode 12 and was subjected to spin coating under predetermined conditions (The coating liquid was rotated at 500 rpm for 5 seconds and was rotated at 3,000 rpm for 20 seconds. Then, the rotation was stopped so that the rotation speed reached 0 rpm in 5 seconds.).

Subsequently, the substrate was dried for 10 minutes on a hot plate that had been heated to 120° C. and was baked at 400° C. for 1 hour in the air atmosphere to obtain a gate insulating layer 13 (FIG. 2B). An average thickness of the gate insulating layer 13 obtained was about 150 nm.

Subsequently, resist patterns were formed on the formed gate insulating layer 13 through photolithography, and etching was performed using a PAN-based etching solution to form through holes 13C of the gate insulating layer 13 each having a predetermined shape on the gate electrode pads 12B (FIG. 2C).

Then, annealing was further performed at 500° C. for 1 hour in the air atmosphere <Formation of Active Layer>

Next, a film of IGZO (20 nm) was formed on the gate insulating layer 13 through the DC magnetron sputtering method, and resist patterns were formed through photolithography so that a predetermined shape was formed using the PAN-based etching solution. Then, the substrate was annealed at 500° C. for 1 hour in the air atmosphere to obtain an active layer 14.

<Formation of Source Electrode and Drain Electrode>

A Ti film was formed so as to have a thickness of 100 nm through the sputtering method. On the formed Ti film, resist patterns were formed through photolithography and etching was performed through dry etching to form a source electrode 15 and a drain electrode 16 each having a predetermined shape. Then, the resultant was annealed at 300° C. for 1 hour in the air atmosphere.

As described above, a field-effect transistor was produced.

Examples 2 to 4

In Examples 2 to 4, the bottom gate/top contact field-effect transistor 10A presented in FIG. 1 was produced.

Production methods, materials of the respective layers, and methods for forming patterns as described in Table 1-1-1, Table 1-1-2, Table 1-2-1, Table 1-2-2, and Table 2 were used.

Examples 5 to 6

In Examples 5 to 6, a bottom gate/top contact field-effect transistor 10B presented in FIG. 3 was produced.

Production methods, materials of the respective layers, and methods for forming patterns as described in Table 1-1-1, Table 1-1-2, Table 1-2-1, Table 1-2-2, and Table 2 were used.

Examples 7 to 10

In Examples 7 to 10, a bottom gate/top contact field-effect transistor 10C presented in FIG. 5 was produced.

Production methods, materials of the respective layers, and methods for forming patterns as described in Table 1-1-1, Table 1-1-2, Table 1-2-1, Table 1-2-2, and Table 2 were used.

Examples 11 and 12

In Examples 11 and 12, a bottom gate/top contact field-effect transistor 10D presented in FIG. 7 was produced.

Production methods, materials of the respective layers, and methods for forming patterns as described in Table 1-1-1, Table 1-1-2, Table 1-2-1, Table 1-2-2, and Table 2 were used.

Example 13

In Example 13, a bottom gate/top contact field-effect transistor 10E presented in FIG. 9 was produced.

Production methods, materials of the respective layers, and methods for forming patterns as described in Table 1-1-1, Table 1-1-2, Table 1-2-1, Table 1-2-2, and Table 2 were used.

Example 14

In Example 14, a bottom gate/top contact field-effect transistor 10F presented in FIG. 11 was produced.

Production methods, materials of the respective layers, and methods for forming patterns as described in Table 1-1-1, Table 1-1-2, Table 1-2-1, Table 1-2-2, and Table 2 were used.

Examples 15 and 16

In Examples 15 and 16, a bottom gate/top contact field-effect transistor 10G presented in FIG. 13 was produced.

Production methods, materials of the respective layers, and methods for forming patterns as described in Table 1-1-1, Table 1-1-2, Table 1-2-1, Table 1-2-2, and Table 2 were used.

Example 17

In Example 17, a bottom gate/top contact field-effect transistor 10H presented in FIG. 15 was produced.

Production methods, materials of the respective layers, and methods for forming patterns as described in Table 1-1-1, Table 1-1-2, Table 1-2-1, Table 1-2-2, and Table 2 were used.

Examples 18 and 19

In Examples 18 and 19, a bottom gate/top contact field-effect transistor 10J presented in FIG. 17 was produced.

Production methods, materials of the respective layers, and methods for forming patterns as described in Table 1-1-1, Table 1-1-2, Table 1-2-1, Table 1-2-2, Table 1-3, and Table 2 were used.

Note that, the inter layer dielectric 132 was obtained by the coating liquid for forming the gate insulating layer similar to that of the gate insulating layer 13 under the baking condition similar to that of the gate insulating layer 13. The through holes 133C formed in the gate insulating layer 13 and the inter layer dielectric 132 were formed by etching the gate insulating layer 13 and the inter layer dielectric 132 at one time.

Examples 20 and 21

In Examples 20 and 21, a bottom gate/top contact field-effect transistor 10K presented in FIG. 19 was produced.

Production methods, materials of the respective layers, and methods for forming patterns as described in Table 1-1-1, Table 1-1-2, Table 1-2-1, Table 1-2-2, Table 1-3, and Table 2 were used.

Note that, contact electrodes 15A and 16A were formed under the same formation condition as that of the source electrode 15 and the drain electrode 16.

Moreover, the inter layer dielectric 132 was obtained by the coating liquid for forming the gate insulating layer similar to that of the gate insulating layer 13 under the baking condition similar to that of the gate insulating layer 13. The through holes 133C formed in the gate insulating layer 13 and the inter layer dielectric 132 were formed by etching the gate insulating layer 13 and the inter layer dielectric 132 at one time.

TABLE 1-1-1

| | Field-effect transistor | | | | Etching method | Etching | | Etching method | Etching |
|---|---|---|---|---|---|---|---|---|---|
| Example | Type | Structure | Production method | Gate electrode | Etching solution | solution temperature | Gate insulating layer | Etching solution | solution temperature |
| 1 | BT | FIG. 1 | FIG. 2A-FIG. 2E | Ti | Dry etching | | Coating liquid 1-1 | Wet etching PAN-based 1 | 35° C. |
| 2 | BT | FIG. 1 | FIG. 2A-FIG. 2E | Ti | Dry etching | | Coating liquid 1-1 | Wet etching PAN-based 1 | 35° C. |
| 3 | BT | FIG. 1 | FIG. 2A-FIG. 2E | Mo/ITO | Wet etching PAN-based 1 | 35° C. | Coating liquid 1-2 | Wet etching PAN-based 1 | 35° C. |
| 4 | BT | FIG. 1 | FIG. 2A-FIG. 2E | Mo/ITO | Wet etching PAN-based 1 | 35° C. | Coating liquid 1-3 | Wet etching PAN-based 1 | 35° C. |
| 5 | TT | FIG. 3 | FIG. 4A-FIG. 4E | Mo | Wet etching PAN-based 1 | RT | Coating liquid 1-4 | Wet etching Hydrogen-peroxide-based | RT |
| 6 | TT | FIG. 3 | FIG. 4A-FIG. 4E | Mo | Wet etching PAN-based 1 | RT | Coating liquid 1-5 | Wet etching PAN-based 1 | 35° C. |
| 7 | TT | FIG. 5 | FIG. 6A-FIG. 6G | W | Wet etching Hydrogen-peroxide-based | 35° C. | 1st: Coating liquid 1-1 2nd: Coating liquid 1-1 | Wet etching PAN-based 1 | 35° C. |
| 8 | TT | FIG. 5 | FIG. 6A-FIG. 6C | Mo | Wet etching PAN-based 1 | RT | 1st: Coating liquid 1-3 2nd: Coating liquid 1-3 | Wet etching PAN-based 1 | 35° C. |
| 9 | TT | FIG. 5 | FIG. 6A-FIG. 6G | W | Wet etching hdrogen-peroxide-based | 35° C. | 1st: Coating liquid 1-1 2nd: Coating liquid 1-3 | Wet etching PAN-based 1 | 35° C. |
| 10 | TT | FIG. 5 | FIG. 6A-FIG. 6G | Mo | Wet etching PAN-based 1 | RT | 1st: Coating liquid 1-6 2nd: Coating liquid 1-7 | Wet etching PAN-based 1 | 35° C. |
| 11 | TT | FIG. 7 | FIC. 8A-FIG. 8G | Ti | Dry etching | | 1st: Coating liquid 1-7 2nd: Coating liquid 1-8 | Wet etching PAN-based 1 | 35° C. |
| 12 | TT | FIG. 7 | FIG. 8A-FIG. 8G | Mo | Wet etching PAN-based 1 | RT | 1st: Coating liquid 1-7 2nd: Coating liquid 1-7 | Wet etching PAN-based 1 | 35° C. |

TABLE 1-1-2

| | Field-effect transistor | | | | Etching solution | Etching | | Etching method | Etching |
|---|---|---|---|---|---|---|---|---|---|
| Example | Type | Structure | Production method | Gate electrode | Etching method | solution temperature | Gate insulating layer | Etching solution | solution temperature |
| 13 | BT | FIG. 9 | FIG. 10A-FIG. 10D | Ti | Dry etching | | Coating liquid 1-2 | Wet etching Oxalic-acid-based | 35° C. |
| 14 | TT | FIG. 11 | FIG. 12A-FIG. 12D | Al | Wet etching PAN-based 1 | 35° C. | Coating liquid 1-4 | Wet etching PAN-based 1 | 35° C. |
| 15 | TT | FIG. 13 | FIG. 14A-FIG. 14E | Mo/Cu/Ti | Wet etching PAN-based 2/ Only Ti is hydrofluoric-acid-based | RT | Coating liquid 1-8 | Wet etching PAN-based 2 | 35° C. |
| 16 | TT | FIG. 13 | FIG. 14A-FIG. 14E | Mo/Cu/Ti | Wet etching Hydrogen-peroxide-based/Only Ti is hydro-fluoric-acid-based | 35° C. | Coating liquid 1-4 | Wet etching Hydrogen-peroxide-based | 35° C. |

TABLE 1-1-2-continued

| | Field-effect transistor | | | | Etching solution | | | Etching method | Etching |
|---|---|---|---|---|---|---|---|---|---|
| Example | Type | Structure | Production method | Gate electrode | Etching method | Etching solution temperature | Gate insulating layer | Etching solution | Etching solution temperature |
| 17 | TT | FIG. 15 | FIG. 16A-FIG. 16D | Mo | Wet etching PAN-based 1 | RT | Coating liquid 1-3 | Wet etching PAN-based 1 | 35° C. |
| 18 | TT | FIG. 17 | FIG. 18A-FIG. 18F | Mo | Wet etching Hydrogen-peroxide-based | 35° C. | 1st: Coating liquid 1-5 2nd: Coating liquid 1-5 | Wet etching PAN-based 1 | 35° C. |
| 19 | TT | FIG. 17 | FIG. 18A-FIG. 18F | Mo/Al | Wet etching PAN-based 1 | 35° C. | 1st: Coating liquid 1-1 2nd: Coating liquid 1-3 | Wet etching PAN-based 1 | 35° C. |
| 20 | TT | FIG. 19 | FIG. 20A-FIG. 20G | Ti | Dry etching | | 1st: Coating liquid 1-2 2nd: Coating liquid 1-6 | Wet etching PAN-based 1 | 35° C. |
| 21 | TT | FIG. 19 | FIG. 20A-FIG. 20G | Mo/Cu | Wet etching Hydrogen-peroxide-based | 35° C. | 1st: Coating liquid 1-7 2nd: Coating liquid 1-6 | Wet etching PAN-based 1 | 35° C. |

TABLE 1-2-1

| | Field-effect transistor | | | | Etching method | | Source electrode- | Etching method | Etching |
|---|---|---|---|---|---|---|---|---|---|
| Example | Type | Structure | Production method | Active layer | Etching solution | Etching solution temperature | drain electrode | Etching solution | Etching solution temperature |
| 1 | BT | FIG. 1 | FIG. 2A-FIG. 2E | IMAO | Wet etching Oxalic-acid-based | RT | Mo | Wet etching PAN-based 1 | RT |
| 2 | BT | FIG. 1 | FIG. 2A-FIG. 2E | IGZO | Wet etching PAN-based 1 | 35° C. | Mo | Wet etching PAN-based 1 | RT |
| 3 | BT | FIG. 1 | FIG. 2A-FIG. 2E | IMAO | Wet etching Oxalic-acid-based | RT | Ti | Dry etching | |
| 4 | BT | FIG. 1 | FIG. 2A-FIG. 2E | IGZO | Wet etching PAN-based 1 | 35° C. | Mo/Al | Wet etching PAN-based 1 | 35° C. |
| 5 | TT | FIG. 3 | FIG. 4A-FIG. 4E | IMAO | Wet etching Oxalic-acid-based | RT | W | Wet etching hydrogen-peroxide-based | 35° C. |
| 6 | TT | FIG. 3 | FIG. 4A-FIG. 4E | IGZO | Wet etching PAN-based 1 | 35° C. | Mo/Al | Wet etching PAN-based 1 | 35° C. |
| 7 | TT | FIG. 5 | FIG. 6A-FIG. 6G | IMAO | Wet etching PAN-based 1 | RT | Mo/Al | Wet etching PAN-based 1 | 35° C. |
| 8 | TT | FIG. 5 | FIG. 6A-FIG. 6G | IMAO | Wet etching PAN-based 1 | RT | Mo/Al | Wet etching PAN-based 1 | 35° C. |
| 9 | TT | FIG. 5 | FIG. 6A-FIG. 6G | IGZO | Wet etching PAN-based 1 | 35° C. | Mo/Al | Wet etching PAN-based 1 | 35° C. |
| 10 | TT | FIG. 5 | FIG. 6A-FIG. 6G | IGZO | Wet etching PAN-based 1 | 35° C. | W | Wet etching hydrogen-peroxide-based | 35° C. |
| 11 | TT | FIG. 7 | FIG. 8A-FIG. 8G | IMAO | Wet etching PAN-based 1 | RT | Mo/Al | Wet etching PAN-based 1 | 35° C. |
| 12 | TT | FIG. 7 | FIG. 8A-FIG. 8G | IGZO | Wet etching PAN-based 1 | 35° C. | Mo/Al | Wet etching PAN-based 1 | 35° C. |

TABLE 1-2-2

| | Field-effect transistor | | | | Etching method | | Source elctrode- | Etching method | Etching |
|---|---|---|---|---|---|---|---|---|---|
| Example | Type | Structure | Production method | Active layer | Etching solution | Etching solution temperature | drain electrode | Etching solution | Etching solution temperature |
| 13 | BT | FIG. 9 | FIG. 10A-FIG. 10D | IMAO | Wet etching Oxalic-acid-based | 35° C. | ITO | Wet etching Oxalic-acid-based | 35° C. |
| 14 | TT | FIG. 11 | FIG. 12A-FIG. 12D | IGZO | Wet etching PAN-based 1 | 35° C. | W | Wet etching Hydrogen-peroxide-based | 35° C. |
| 15 | TT | FIG. 13 | FIG. 14A-FIG. 14E | IMAO | Wet etching PAN-based 1 | 35° C. | Mo/Al | Wet etching PAN-based 1 | 35° C. |
| 16 | TT | FIG. 13 | FIG. 14A-FIG. 14E | IGZO | Wet etching PAN-based 1 Wet etching | 35° C. | W | Wet etching Hydrogen-peroxide-based | 35° C. |

TABLE 1-2-2-continued

| | Field-effect transistor | | | | Etching method | Etching | Source electrode | Etching method | Etching |
|---|---|---|---|---|---|---|---|---|---|
| Example | Type | Structure | Production method | Active layer | Etching solution | solution temperature | drain electrode | Etching solution | solution temperature |
| 17 | TT | FIG. 15 | FIG. 16A-FIG. 16D | IMAO | PAN-based 1 | 35° C. | Mo | Wet etching PAN-based 1 | RT |
| 18 | TT | FIG. 17 | FIG. 18A-FIG. 18F | IMAO | Wet etching PAN-based 1 | 35° C. | Mo/Cu | Wet etching Hydrogen-peroxide-based | 35° C. |
| 19 | TT | FIG. 17 | FIG. 18A-FIG. 18F | IGZO | Wet etching PAN-based 1 | 35° C. | Mo/Al | Wet etching PAN-based 1 | 35° C. |
| 20 | TT | FIG. 19 | FIG. 20A-FIG. 20G | IMAO | Wet etching PAN-based 1 | 35° C. | W | Wet etching Hydrogen-peroxide-based | 35° C. |
| 21 | TT | FIG. 19 | FIG. 20A-FIG. 20G | IMAO | Wet etching PAN-based 1 | 35° C. | Mo/Cu | Wet etching PAN-based 2 | RT |

TABLE 1-3

| | Field-effect transistor | | | | Etching method | Etching solution |
|---|---|---|---|---|---|---|
| Example | Type | Structure | Production method | Inter layer dielectric | Etching solution | temperature |
| 1 | BT | FIG. 1 | FIG. 2A-FIG. 2E | | | |
| 2 | BT | FIG. 1 | FIG. 2A-FIG. 2E | | | |
| 3 | BT | FIG. 1 | FIG. 2A-FIG. 2E | | | |
| 4 | BT | FIG. 1 | FIG. 2A-FIG. 2E | | | |
| 5 | TT | FIG. 3 | FIG. 4A-FIG. 4E | | | |
| 6 | TT | FIG. 3 | FIG. 4A-FIG. 4E | | | |
| 7 | TT | FIG. 5 | FIG. 6A-FIG. 6G | | | |
| 8 | TT | FIG. 5 | FIG. 6A-FIG. 6G | | | |
| 9 | TT | FIG. 5 | FIG. 6A-FIG. 6G | | | |
| 10 | TT | FIG. 5 | FIG. 6A-FIG. 6G | | | |
| 11 | TT | FIG. 7 | FIG. 8A-FIG. 8G | | | |
| 12 | TT | FIG. 7 | FIG. 8A-FIG. 8G | | | |
| 13 | BT | FIG. 9 | FIG. 10A-FIG. 10D | | | |
| 14 | TT | FIG. 11 | FIG. 12A-FIG. 12D | | | |
| 15 | TT | FIG. 13 | FIG. 14A-FIG. 14E | | | |
| 16 | TT | FIG. 13 | FIG. 14A-FIG. 14E | | | |

TABLE 1-3-continued

| | Field-effect transistor | | | | Etching method | Etching solution |
|---|---|---|---|---|---|---|
| Example | Type | Structure | Production method | Inter layer dielectric | Etching solution | temperature |
| 17 | TT | FIG. 15 | FIG. 16A-FIG. 16D | | | |
| 18 | TT | FIG. 17 | FIG. 18A-FIG. 18F | Coating liquid 1-5 | Wet etching PAN-based 1 | 35° C. |
| 19 | TT | FIG. 17 | FIG. 18A-FIG. 18F | Coating liquid 1-3 | Wet etching PAN-based 1 | 35° C. |
| 20 | TT | FIG. 19 | FIG. 20A-FIG. 20G | Coating liquid 1-6 | Wet etching PAN-based 1 | 35° C. |
| 21 | TT | FIG. 19 | FIG. 20A-FIG. 20G | Coating liquid 1-6 | Wet etching PAN-based 1 | 35° C. |

In Table 1-1-1, Table 1-1-2, Table 1-2-1, Table 1-2-2, and Table 1-3, the "BT" denotes a bottom gate/top contact field-effect transistor. The "TT" denotes a top gate/top contact field-effect transistor. The "RT" denotes room temperature. The "PAN-based 1" denotes an etching solution 1 including nitric acid, phosphoric acid, and acetic acid. The "PAN-based 2" denotes an etching solution 2 including nitric acid, phosphoric acid, and acetic acid (having a formulation ratio different from that of the etching solution 1).

In Table 1-1-1, Table 1-1-2, Table 1-2-1, and Table 1-2-2, the "IGZO" denotes InGaZnO$_4$, and the "MAO" denotes In$_2$Mg$_{0.99}$Al$_{0.01}$O$_4$.

In the items of the gate insulating layer in Table 1-1-1 and Table 1-1-2, the "1st" denotes the first gate insulating layer and the "2nd" denotes the second gate insulating layer.

The following Table 2 presents formulation of each coating liquid for forming gate insulating layer.

TABLE 2

| Coating liquid | Material A (including A element) | | Material B (including B element) | | Material C (including C element) | | Solvent D (Class II petroleums) | | Solvent E (Class III petroleums) | | Solvent F | |
|---|---|---|---|---|---|---|---|---|---|---|---|---|
| No | Compound | mmol | Compound | mmol | Compound | mmol | Compound | mL | Compound | mL | Compound | mL |
| 1-1 | Bi(C$_8$H$_{15}$O$_2$)$_3$ | 60 | Hf(C$_8$H$_{15}$O$_2$)$_4$ | 40 | | | | | Octylic acid | 1000 | | |
| 1-2 | Y(NO$_3$)$_3$•6H$_2$O Sc(NO$_3$)$_3$•5H$_2$O | 70 20 | | | Mg(NO$_3$)$_2$•6H$_2$O | 10 | PGME | 500 | PG | 500 | H$_2$O | 90 |
| 1-3 | Sb(C$_6$H$_5$)$_3$ | 50 | Zr(acac)$_4$ | 45 | Ba(C$_{10}$H$_{19}$O$_2$)$_2$ | 5 | Mesitylene | 700 | CHB | 300 | | |
| 1-4 | La(C$_8$H$_{15}$O$_2$)$_3$ | 80 | Ti(OC$_4$H$_9$)$_4$ | 10 | Sr(C$_{10}$H$_{19}$O$_2$)$_2$ | 10 | Xylene | 700 | CHB | 300 | | |
| 1-5 | Ce(C$_8$H$_{15}$O$_2$)$_3$ | 70 | Zr(acac)$_4$ | 25 | Ba(C$_8$H$_{15}$O$_2$)$_2$ | 5 | Mesitylene | 300 | Octylic acid | 700 | | |

TABLE 2-continued

| Coating liquid No | Material A (including A element) Compound | mmol | Material B (including B element) Compound | mmol | Material C (including C element) Compound | mmol | Solvent D (Class II petroleums) Compound | mL | Solvent E (Class III petroleums) Compound | mL | Solvent F Compound | mL |
|---|---|---|---|---|---|---|---|---|---|---|---|---|
| 1-6 | TeCl$_4$ | 60 | GaCl$_3$ | 25 | CaCl$_2$•2H$_2$O | 15 | DMF | 420 | EG | 420 | 0.2M—HCl | 150 |
| 1-7 | Bi(NO$_3$)$_3$•5H$_2$O | 65 | ZrO(NO$_2$)•2H$_2$O | 30 | Mg(NO$_3$)$_2$•6H$_2$O | 5 | 1-Pentanol | 300 | PG | 500 | 0.1M—HNO$_3$ | 200 |
| 1-8 | Lu(NO$_3$)$_3$•H$_2$O | 80 | ZrO(NO$_2$)•2H$_2$O | 12 | Mg(NO$_3$)$_2$•6H$_2$O | 8 | DMF | 200 | DMI | 700 |  | 100 |

In Table 2, names of various materials and solvents are as follows.

<Material A>
Bi(C$_8$H$_{15}$O$_2$)$_3$: Bismuth tris(2-ethylhexanoate)
Y(NO$_3$)$_3$.6H$_2$O: Yttrium nitrate hexahydrate
Sc(NO$_3$)$_3$.5H$_2$O: Scandium nitrate pentahydrate
Sb(C$_6$H$_5$)$_3$: Triphenylantimony
La(C$_8$H$_{15}$O$_2$)$_3$: Lanthanum tris(2-ethylhexanoate)
Ce(C$_8$H$_{15}$O$_2$)$_3$: Cerium tris(2-ethylhexanoate)
TeCl$_4$: Tellurium chloride
Bi(NO$_3$)$_3$.5H$_2$O: Bismuth nitrate pentahydrate
Lu(NO$_3$)$_3$.H$_2$O: Lutetium nitrate monohydrate <Material B>
Hf(C$_8$H$_{15}$O$_2$)$_4$: Hafnium tetra(2-ethylhexanoate)
Zr(acac)$_4$: Zirconium acetylacetonate
Ti(OC$_4$H$_9$)$_4$: Titanium tetrabutoxide
GaCl$_3$: Gallium chloride
ZrO(NO$_3$)$_2$.2H$_2$O: Zirconium nitrate oxide dihydrate <Material C>
Mg(NO$_3$)$_2$.6H$_2$O: Magnesium nitrate hexahydrate
Ba(C$_{10}$H$_{19}$O$_2$)$_2$: Barium bis(neodecanoate)
Sr(C$_{10}$H$_{19}$O$_2$)$_2$: Strontium bis(neodecanoate)
CaCl$_2$.2H$_2$O: Calcium chloride dihydrate <Solvent D>
PGME: Propyleneglycol monomethyl ether
DMF: N,N-dimethylformamide <Solvent E>
PG: Propylene glycol
CHB: Cyclohexylbenzene
EG: Ethylene glycol
DMI: 1,3-Dimethyl-2-imidazolidinone <Solvent F>
H$_2$O: Water
0.2 M-HCl: 0.2 M hydrochloric acid
0.1 M-HNO$_3$: 0.1 M nitric acid aqueous solution Etching rates of the gate insulating layers formed of the coating liquid 1-1 to the coating liquid 1-8 and other materials in the respective etching solutions are presented in Table 3-1 and Table 3-2.

The etching rate is generally an etching rate obtained when an object to be etched is immersed into the wet etching solution, followed by light stirring.

The etching depth can be determined by observing it with a transmission electron microscope.

TABLE 3-1

| Material | Etching solution | Temperature (° C.) | Etching rate (nm/s) |
|---|---|---|---|
| Al | PAN-based 1 | 35 | 3 |
| Mo | PAN-based 1 | RT | 3 |
|  | PAN-based 1 | 35 | 6 |
|  | PAN-based 2 | RT | 6 |
|  | Hydrogen peroxide-based | 35 | 5 |
| W | Hydrogen peroxide-based | RT | 0.1 |
|  | Hydrogen peroxide-based | 35 | 1.5 |
| Cu | Hydrogen peroxide-based | 35 | 5 |
|  | PAN-based 2 | RT | 6 |
| a-ITO | PAN-based 1 | 35 | 0.1 |
|  | Hydrogen peroxide-based | 35 | <0.1 |
|  | Oxalic acid-based | 35 | 0.9 |
| p-ITO | PAN-based 1 | 35 | <0.1 |
|  | Hydrogen peroxide-based | 35 | <0.1 |
|  | Oxalic acid-based | 35 | <0.1 |
| a-IMAO | PAN-based 1 | RT | 1.2 |
|  | Hydrogen peroxide-based | 35 | <0.1 |
|  | Oxalic acid-based | RT | 1.5 |
| p-TMAO | PAN-based 1 | 35 | <0.1 |
|  | Hydrogen peroxide-based | 35 | <0.1 |
|  | Oxalic acid-based | 35 | <0.1 |
| a-IGZO | PAN-based 1 | 35 | 1 |
|  | Hydrogen peroxide-based | 35 | <0.1 |
|  | Oxalic acid-based | 35 | 2 |
| p-IGZO | PAN-based 1 | 35 | <0.1 |
|  | Hydrogen peroxide-based | 35 | <0.1 |
|  | Oxalic acid-based | 35 | <0.1 |

TABLE 3-2

| Material | Etching solution | Temperature (° C.) | Etching rate (nm/s) |
|---|---|---|---|
| Coating liquid No. 1-1 | PAN-based 1 | 35 | 0.6 |
|  | Hydrogen peroxide-based | RT | <0.1 |
|  | Oxalic acid-based | 35 | <0.1 |
| Coating liquid No. 1-2 | PAN-based 1 | 35 | 20 |
|  | Hydrogen peroxide-based | RT | 3.1 |
|  | Oxalic acid-based | 35 | 2.3 |
| Coating liquid No. 1-3 | PAN-based 1 | 35 | 0.3 |
|  | Hydrogen peroxide-based | 35 | <0.1 |
|  | Oxalic acid-based | 35 | <0.1 |
| Coating liquid No. 1-4 | PAN-based 1 | 35 | 8 |
|  | Hydrogen peroxide-based | RT | 4 |
|  | Oxalic acid-based | 35 | 0.8 |
| Coating liquid No. 1-5 | PAN-based 1 | 35 | 2 |
|  | Hydrogen peroxide-based | 35 | 0.4 |
|  | Oxalic acid-based | 35 | 0.5 |
| Coating liquid No.1-6 | PAN-based 1 | 35 | 0.5 |
|  | Hydrogen peroxide-based | 35 | <0.1 |
|  | Oxalic acid-based | 35 | <0.1 |
| Coating liquid No. 1-7 | PAN-based 1 | 35 | 1.5 |
|  | Hydrogen peroxide-based | 35 | 0.2 |
|  | Oxalic acid-based | 35 | 0.2 |
| Coating liquid No. 1-8 | PAN-based 1 | 35 | 6 |
|  | Hydrogen peroxide-based | RT | 3 |
|  | Oxalic acid-based | 35 | 0.7 |

Here, each etching solution has the following formulation.

PAN-based 1: An aqueous solution including H$_3$PO$_4$ (50% by mass), CH$_3$COOH (25% by mass), and HNO$_3$ (6% by mass)

PAN-based 2: An aqueous solution including $H_3PO_4$ (5% by mass), $CH_3COOH$ (30% by mass), and $HNO_3$ (25% by mass)

Hydrogen peroxide-based: An aqueous solution including hydrogen peroxide (6% by mass) and $CH_3COOH$ (25% by mass)

Oxalic acid-based: An aqueous solution including oxalic acid (5% my mass)

<Evaluation>

—Carrier Mobility and On/Off Ratio—

Figure 30:
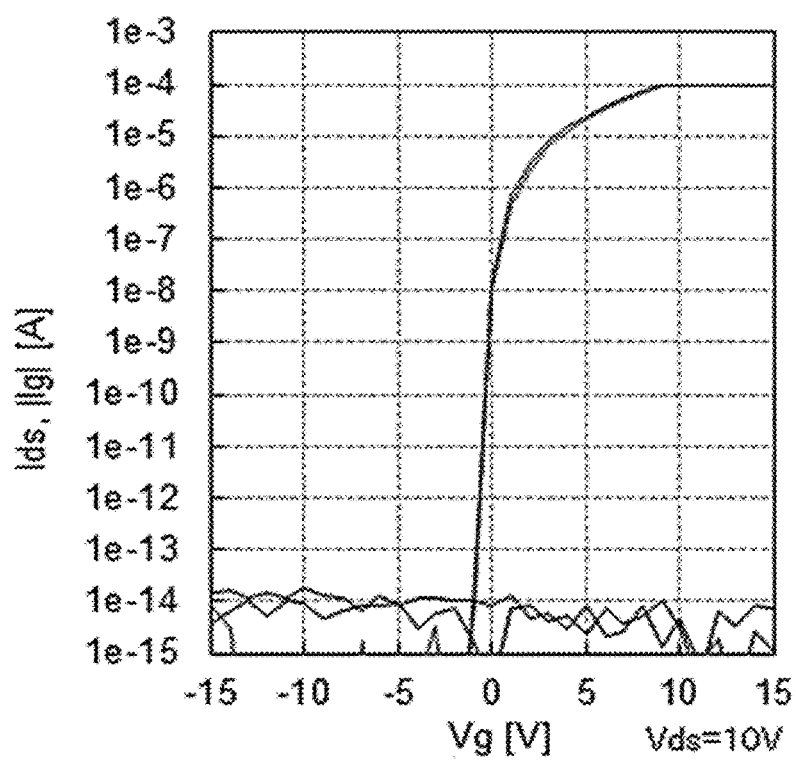
FIG. 30 is a representative graph of results of Example 1-21.

Using a semiconductor parameter analyzer device (available from Agilent Technologies Japan, Ltd., semiconductor parameter analyzer B1500A), the field-effect transistor obtained was determined for relationship between gate voltage (Vgs) and electric current (Ids) between the source and the drain when voltage (Vds) between the source and the drain is 10 V. A representative graph of results of Example 1-21 is presented in FIG. 30. From the figure, it was found to have favorable transistor characteristics without exhibiting hysteresis. Note that, in FIG. 30, the "e" denotes the exponent of 10. For example, the "1e-10" denotes $1 \times 10^{-10}$.

As described above, preferable embodiments and the like have been described in detail. However, the present disclosure is not limited to the aforementioned embodiments, and various modifications and substitutions can be added to the aforementioned embodiments without departing from the scope described in the claims.

Aspects of the present disclosure are as follows, for example.

<1> A method for producing a field-effect transistor including a source electrode and a drain electrode, a gate electrode, an active layer, and a gate insulating layer, the method including
etching the gate insulating layer,
wherein the gate insulating layer is a metal oxide including A element and at least one selected from the group consisting of B element and C element,
the A element is at least one selected from the group consisting of Sc, Y, Ln (lanthanoid), Sb, Bi, and Te,
the B element is at least one selected from the group consisting of Ga, Ti, Zr, and Hf,
the C element is at least one selected from the group consisting of Group 2 elements in a periodic table,
etching solution A is used when at least one selected from the group consisting of the source electrode and the drain electrode, the gate electrode, and the active layer is formed, and
etching solution B that is an etching solution having same type as the etching solution A is used when the gate insulating layer is etched.
<2> The method for producing a field-effect transistor according to <1>, wherein at least the gate electrode is formed using the etching solution A.
<3> The method for producing a field-effect transistor according to <1> or <2>,
wherein at least the source electrode and the drain electrode are formed using the etching solution A.
<4> The method for producing a field-effect transistor according to any one of <1> to <3>,
wherein at least the active layer is formed using the etching solution A.
<5> The method for producing a field-effect transistor according to any one of <1> to <4>,
wherein the etching solution A is an etching solution including nitric acid, and the etching solution B is an etching solution including nitric acid.
<6> The method for producing a field-effect transistor according to any one of <1> to <5>,
wherein the active layer is an oxide semiconductor.
<7> The method for producing a field-effect transistor according to any one of <1> to <6>,
wherein the metal oxide includes the B element.
<8> The method for producing a field-effect transistor according to any one of <1> to <7>,
wherein the metal oxide includes the C element.
<9> The method for producing a field-effect transistor according to any one of <1> to <8>,
wherein at least one through hole is formed through the etching of the gate insulating layer.
<10> A field-effect transistor including:
a source electrode and a drain electrode;
a gate electrode;
an active layer configured to form channel between the source electrode and the drain electrode when a predetermined voltage is applied to the gate electrode; and
a gate insulating layer provided between the gate electrode and the active layer,
wherein the gate insulating layer is etched,
the gate insulating layer is a metal oxide including A element and at least one selected from the group consisting of B element and C element,
the A element is at least one selected from the group consisting of Sc, Y, Ln (lanthanoid), Sb, Bi, and Te,
the B element is at least one selected from the group consisting of Ga, Ti, Zr, and Hf,
the C element is at least one selected from the group consisting of Group 2 elements in a periodic table,
at least one selected from the group consisting of the source electrode and the drain electrode, the gate electrode, and the active layer is formed using etching solution A, and
the gate insulating layer is etched using etching solution B that is an etching solution having same type as the etching solution A.
<11> A metal oxide that functions as a gate insulating layer of a field-effect transistor, the metal oxide including:
A element; and
at least one selected from the group consisting of B element and C element,
wherein the A element is at least one selected from the group consisting of Sc, Y, Ln (lanthanoid), Sb, Bi, and Te,
the B element is at least one selected from the group consisting of Ga, Ti, Zr, and Hf,
the C element is at least one selected from the group consisting of Group 2 elements in a periodic table, and
an etching rate of the metal oxide in a wet etching solution including nitric acid is 0.1 nm/s or more but 20 nm/s or less.
<12> The metal oxide according to <11>,
wherein the wet etching solution is a wet etching solution including 6% by mass of nitric acid.
<13> The metal oxide according to <11> or <12>,
wherein the wet etching solution is a wet etching solution including 50% by mass of phosphoric acid.
<14> The metal oxide according to <13>,
wherein the wet etching solution is a wet etching solution including 6% by mass of nitric acid, 25% by mass of acetic acid, and 50% by mass of phosphoric acid.
<15> The metal oxide according to any one of <11> to <14>,
wherein the wet etching solution is a wet etching solution used for forming at least one selected from the group consisting of: an active layer; a gate electrode; and a source electrode and a drain electrode after formation of the gate insulating layer in production of the field-effect transistor.

<16> The metal oxide according to <15>, wherein at least one selected from the group consisting of the active layer, the gate electrode, and the source electrode and the drain electrode is in contact with the gate insulating layer.

<17> A field-effect transistor including a gate insulating layer including the metal oxide according to any one of <11> to <16>.

What is claimed is:

1. A method for producing a field-effect transistor including a source electrode and a drain electrode, a gate electrode, an active layer, and a gate insulating layer, the method comprising
etching the gate insulating layer,
wherein the gate insulating layer is a metal oxide including A element and at least one selected from the group consisting of B element and C element,
the A element is at least one selected from the group consisting of Sc, Y, Ln (lanthanoid), Sb, Bi, and Te,
the B element is at least one selected from the group consisting of Ga, Ti, Zr, and Hf,
the C element is at least one selected from the group consisting of Group 2 elements in a periodic table,
etching solution A is used when at least one selected from the group consisting of the source electrode and the drain electrode, the gate electrode, and the active layer is formed, and
etching solution B that is an etching solution having same type as the etching solution A is used when the gate insulating layer is etched.

2. The method for producing a field-effect transistor according to claim 1, wherein at least the gate electrode is formed using the etching solution A.

3. The method for producing a field-effect transistor according to claim 1, wherein at least the source electrode and the drain electrode are formed using the etching solution A.

4. The method for producing a field-effect transistor according to claim 1, wherein at least the active layer is formed using the etching solution A.

5. The method for producing a field-effect transistor according to claim 1, wherein the etching solution A is an etching solution including nitric acid, and the etching solution B is an etching solution including nitric acid.

6. The method for producing a field-effect transistor according to claim 1, wherein the active layer is an oxide semiconductor.

7. The method for producing a field-effect transistor according to claim 1, wherein the metal oxide includes the B element.

8. The method for producing a field-effect transistor according to claim 1, wherein the metal oxide includes the C element.

9. The method for producing a field-effect transistor according to claim 1, wherein at least one through hole is formed through the etching of the gate insulating layer.

10. A field-effect transistor comprising:
a source electrode and a drain electrode;
a gate electrode;
an active layer; and
a gate insulating layer,
wherein the gate insulating layer is etched,
the gate insulating layer is a metal oxide including A element and at least one selected from the group consisting of B element and C element,
the A element is at least one selected from the group consisting of Sc, Y, Ln (lanthanoid), Sb, Bi, and Te,
the B element is at least one selected from the group consisting of Ga, Ti, Zr, and Hf,
the C element is at least one selected from the group consisting of Group 2 elements in a periodic table,
at least one selected from the group consisting of the source electrode and the drain electrode, the gate electrode, and the active layer is formed using etching solution A, and
the gate insulating layer is etched using etching solution B that is an etching solution having same type as the etching solution A.

11. A metal oxide that functions as a gate insulating layer of a field-effect transistor, the metal oxide comprising:
A element; and
at least one selected from the group consisting of B element and C element, wherein the A element is at least one selected from the group consisting of Sc, Y, Ln (lanthanoid), Sb, Bi, and Te,
the B element is at least one selected from the group consisting of Ga, Ti, Zr, and Hf,
the C element is at least one selected from the group consisting of Group 2 elements in a periodic table, and
an etching rate of the metal oxide in a wet etching solution including nitric acid is 0.1 nm/s or more but 20 nm/s or less.

12. The metal oxide according to claim 11, wherein the wet etching solution is a wet etching solution including 6% by mass of nitric acid.

13. The metal oxide according to claim 11, wherein the wet etching solution is a wet etching solution including 50% by mass of phosphoric acid.

14. The metal oxide according to claim 13, wherein the wet etching solution is a wet etching solution including 6% by mass of nitric acid, 25% by mass of acetic acid, and 50% by mass of phosphoric acid.

15. The metal oxide according to claim 11, wherein the wet etching solution is a wet etching solution used for forming at least one selected from the group consisting of: an active layer; a gate electrode; and a source electrode and a drain electrode after formation of the gate insulating layer in production of the field-effect transistor.

16. The metal oxide according to claim 15, wherein at least one selected from the group consisting of the active layer, the gate electrode, and the source electrode and the drain electrode is in contact with the gate insulating layer.

17. A field-effect transistor comprising a gate insulating layer including the metal oxide according to claim 11.

* * * * *